US007848835B2

(12) United States Patent  
Conway et al.

(10) Patent No.: US 7,848,835 B2
(45) Date of Patent: Dec. 7, 2010

(54) HIGH POWER LASER FLAT PANEL WORKPIECE TREATMENT SYSTEM CONTROLLER

(75) Inventors: Joseph Conway, El Cajon, CA (US); Yogesh Sharma, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 781 days.

(21) Appl. No.: 11/805,199

(22) Filed: May 21, 2007

(65) Prior Publication Data

US 2008/0071403 A1 Mar. 20, 2008

Related U.S. Application Data

(60) Provisional application No. 60/810,527, filed on Jun. 2, 2006.

(51) Int. Cl.
*G06F 19/00* (2006.01)
(52) U.S. Cl. .......................................... 700/97; 700/120
(58) Field of Classification Search ................... 700/97, 700/119–120; 219/121.73; 156/345.31
See application file for complete search history.

(56) References Cited

U.S. PATENT DOCUMENTS

| 6,115,107 | A | * | 9/2000 | Nishi | ........................... 355/68 |
|---|---|---|---|---|---|
| 6,323,589 | B1 | | 11/2001 | Inoue et al. | .................. 313/402 |
| 6,841,033 | B2 | * | 1/2005 | Condrashoff et al. | .. 156/345.31 |
| 6,894,826 | B2 | * | 5/2005 | Doi | ............................ 359/326 |
| 7,009,140 | B2 | * | 3/2006 | Partio et al. | ............ 219/121.65 |
| 7,039,086 | B2 | * | 5/2006 | Fallon et al. | ................... 372/55 |
| 7,061,959 | B2 | | 6/2006 | Partlo et al. | ..................... 372/55 |
| 7,167,499 | B2 | | 1/2007 | Das et al. | ....................... 372/55 |
| 7,193,295 | B2 | * | 3/2007 | Dolechek et al. | ............ 257/619 |
| 7,277,188 | B2 | | 10/2007 | Das et al. | ..................... 356/621 |
| 2005/0226301 | A1 | | 10/2005 | Partlo et al. | .................... 372/59 |

* cited by examiner

*Primary Examiner*—Kidest Bahta
(74) *Attorney, Agent, or Firm*—Gard & Kaslow LLP

(57) ABSTRACT

A pulsed DUV workpiece treatment apparatus and method for delivering light to irradiate the workpiece, for crystallization of a material on the workpiece, carried on a work stage, which may comprise a pulsed laser DUV light source and an optical train producing a very narrow width very elongated beam of light pulses with a set of parameters required to be maintained within a respective selected narrow range of values on a pulse to pulse basis is disclosed, which may comprise: a laser controller; a work stage controller; a system controller receiving process recipe control demands from a customer recipe control command generator and providing control signals to the laser controller and the workstage controller, which may comprise: a database driven process controller which may comprise: a database containing generic process command steps selectable by a user through an external process user interface.

127 Claims, 53 Drawing Sheets

Messages used for Communication among Components

| From/To | MSC Server | Job Manager | Job Processor | Status Manager | Status Loop | Device Comm | UI Comm |
|---|---|---|---|---|---|---|---|
| MSC Server | | RunProject ServerStarted | | StatusMessage StartStatusLoop LogMessage | | | |
| Job Manager | StartupServer ShutdownServer ResumeExecution ProjectCompleted RefreshCache Terminate | ServiceJobQueue | StartExecution HaltExecution AbortExecution ResumeExecution RefreshCache | StatusMessage | HaltExecution AbortExecution ResumeExecution RefreshCache | | ServerStarted JobQueueStarted JobQueueStopped JobQueueResumed JobQueueHalted JobStarted JobCompleted |
| Job Processor | | ExecutionHalted ExecutionResumed ExecutionAborted ExecutionCompleted | | StartStatusLoop StopStatusLoop StatusMessage StatusParameter | | TellDevice | |
| Status Manager | | FatalError | | | | | |
| Status Loop | | | | StatusMessage StatusParameter | Start Stop | TellDevice | StatusMessage StatusParameter |
| Device Comm | | | DeviceResponse | StatusMessage | DeviceResponse | | |
| UI Comm | | StartupServer ShutdownServer StartJobQueue StopJobQueue RefreshCache | DeviceResponse | | | | |

FIG. 10

Messages used for Communication among Components (Continued)

| From/To | Job Scheduler | Scheduler Timer | UI Comm |
|---|---|---|---|
| Job Scheduler | | StartTimer | |
| Scheduler Timer | TimerFinished | | |
| UI Comm | RefreshSchedule | | |

FIG. 11

Device Abstraction-NLF-to-DF

In Python, LaserClass:

```
self.LaserInternalEnergyAvg=107 def Diag (self,Value):
    return int(self.Device('GET_DIAGNOSTIC_DATA',Value))
```

In Python, Task Script:

```
IntEng=[]
while time.time() < endCaptureTime:
    IntEng.append(laser.Diag(laser.LaserInternalEnergyAvg))
```

FIG.20A

Device Abstraction-NLF-to-DF

In PostgreSQL:

```
create table oem_device_command
            device_id           int not null,
            nlf_command_name    text not null,
            df_command_name     text not null,
            nlf_data_conversion text,
            df_data_conversion  text copy oem_device_command from stdin;
1       GET_DIAGNOSTIC_DATA DI%? INTC HEX4
```

HIGH POWER LASER FLAT PANEL WORKPIECE TREATMENT SYSTEM CONTROLLER

CROSS-REFERENCE TO RELATED APPLICATIONS

The present application claims priority to U.S. Patent Application Ser. No. 60/810,527, filed on Jun. 2, 2006. The present application is related to co-pending U.S. patent application Ser. No. 11/138,175, filed on May 26, 2005, entitled SYSTEMS AND METHODS FOR IMPLEMENTING AN INTERACTION BETWEEN A LASER SHAPED AS A LINE BEAM AND A FILM DEPOSITED ON A SUBSTRATE. Ser. No. 10/781,251, entitled VERY HIGH ENERGY, HIGH STABILITY GAS DISCHARGE LASER SURFACE TREATMENT SYSTEM, filed on Feb. 18, 2004; Ser. No. 10/884,547, entitled LASER LTPS SYSTEM, filed on Jul. 1, 2004; and Ser. No. 10/884,101, entitled LASER LTPS SYSTEM OPTICS, filed on Jul. 1, 2004, the disclosures of which are hereby incorporated by reference.

FIELD OF THE INVENTION

The disclosed subject matter related to controls of timing and energy for a high pulse repetition rate laser system, e.g., an excimer or molecular fluorine gas discharge laser system, useful for surface treatment of a material on a panel having a substrate covered with one or more layers, including an upper layer of amorphous silicon, to be melted and recrystallized into an elongated poly-crystalline form of silicon, e.g., for the subsequent formation of thin film transistors for making products such as flat panel displays. such systems may be utilized, e.g., for low temperature polysilicon processes ("LTPS") or thin beam sequential lateral solidification ("tb-SLS") systems.

BACKGROUND OF THE INVENTION

There is in the field of high pulse repetition rate laser system, e.g., an excimer or molecular fluorine gas discharge laser system, useful for surface treatment of a material on a panel having a substrate covered with one or more layers, including an upper layer of amorphous silicon, to be melted and recrystallized into an elongated poly-crystalline form of silicon, e.g., for the subsequent formation of thin film transistors for making products such as flat panel displays a need for better system control, which applicants address. Such systems may be utilized, e.g., for low temperature polysilicon processes ("LTPS") or thin beam sequential lateral solidification ("tbSLS") systems.

SUMMARY OF THE INVENTION

A pulsed DUV workpiece treatment apparatus and method for delivering light to irradiate the workpiece, for crystallization of a material on the workpiece, carried on a work stage, which may comprise a pulsed laser DUV light source and an optical train producing a very narrow width very elongated beam of light pulses with a set of parameters required to be maintained within a respective selected narrow range of values on a pulse to pulse basis is disclosed, which may comprise: a laser controller; a work stage controller; a system controller receiving process recipe control demands from a customer recipe control command generator and providing control signals to the laser controller and the workstage controller, which may comprise: a database driven process controller which may comprise: a database containing generic process command steps selectable by a user through an external process user interface. The apparatus and method may comprise process control customization from user to user, and may also comprise an interpreter converting process command steps selected through the external process user interface to a respective generic script or scripts. The apparatus and method may comprise a work flow engine identifying to the user process command steps that are selectable by the user from the OEM database, which may be based on tasks stored in the OEM database. The apparatus and method may comprise a process server executing a command to a controller of a device from a group comprising the laser controller and the work stage controller; a GUI client inputting recipe definitions from the user and sending user commands to the process server. The GUI client may comprise a display displaying the status of at least one device from a group comprising the laser and work stage and/or the status of the crystallization process on the workpiece and may communicate with a manufacturing execution system interface via an interface. The apparatus and method may further comprise an OEM read only database which may contain read-only task definitions supplied by the OEM; a master system controller read-write database containing user provided recipe definitions. The OEM database may contain generic task definitions in the form of macros or scripts useable by the process server during process control; a command interpreter combining a user input parameter stored in the MSC database with a generic command from the OEM database. The input parameter may have been previously stored in the MSC database and the generic command may be contained in a script in the OEM database. The apparatus and method may further comprise a plurality of process control subsystems in communication with the process server, each subsystem comprising a message queue and message loop; a message pump associated with each message queue and message loop serializing access to the respective subsystem, and may further comprise a device interface in communication with at least one device from a group comprising the laser and the work stage, utilizing a language converter converting the communication from a neutral language format utilized within the command interpreter to a device specific device language format. A pulsed DUV workpiece treatment apparatus which may deliver light to irradiate the workpiece, for crystallization of a material on the workpiece, carried on a work stage, which may comprise a pulsed laser DUV light source and an optical train producing a very narrow width very elongated beam of light pulses with a set of parameters required to be maintained within a respective selected narrow range of values on a pulse to pulse basis is disclosed which may comprise: a laser controller; a work stage controller; a system controller running a respective task in a separate respective process in order to code a task as a single thread or as multiple non-reentrant threads. The respective task may comprise core tasks each run in a respective thread inside a single process as a single thread. Each thread may have a respective message pump making access to a respective task sequential and non-blocking. The message pump may comprise a message queue and a message loop, and may further comprise the system processor processing errors. The system processor message may be processed using the message pump. A pulsed DUV workpiece treatment apparatus which may deliver light to irradiate the workpiece, for crystallization of a material on the workpiece, carried on a work stage, which may comprise a pulsed laser DUV light source and an optical train producing a very narrow width very elongated beam of light pulses with a set of parameters required to be maintained within a respective selected narrow range of values on a pulse to pulse basis is disclosed, which may comprise: a laser controller; a work stage controller; a plurality of process devices controlled by a system device manager utilizing at least two separately functioning threads one of which comprises a device interface to each of the plurality of process devices. The two separately functioning threads may comprise a control thread associated with all of the respective devices and a diagnostic thread associated with all of the respective devices. Each separately functioning thread may comprise a separate communication channel. The system controller may utilize generic device commands independently of the device types. The device commands may correspond to high level actions. The apparatus and method may comprise the GUI client storing recipe definitions as parameters in the MSC database prior to sending user commands to the process server and may further comprise a message queue and a message loop. The apparatus and method may comprise the at least two separately functioning threads comprising one or more separately functioning threads each as a separate device interface to a respective one of the plurality of process devices. The at least two separately functioning threads may comprise a respective control thread associated with the respective device and a respective diagnostic thread associated with the respective device. Each separately functioning thread may comprising a separate communication channel. The system controller may utilize generic device commands independently of the device types. The device commands may correspond to high level actions.

BRIEF DESCRIPTION OF THE DRAWINGS

FIG. 10 shows by way of example a table of messages, according to aspects of an embodiment of the disclosed subject matter;

FIG. 11 shows by way of example a table of messages, according to aspects of an embodiment of the disclosed subject matter;

FIGS. 20A-B show by way of example database and script code that may be used to implement neutral language format to device language format translations according to aspects of an embodiment of the disclosed subject matter;

Figure 31:
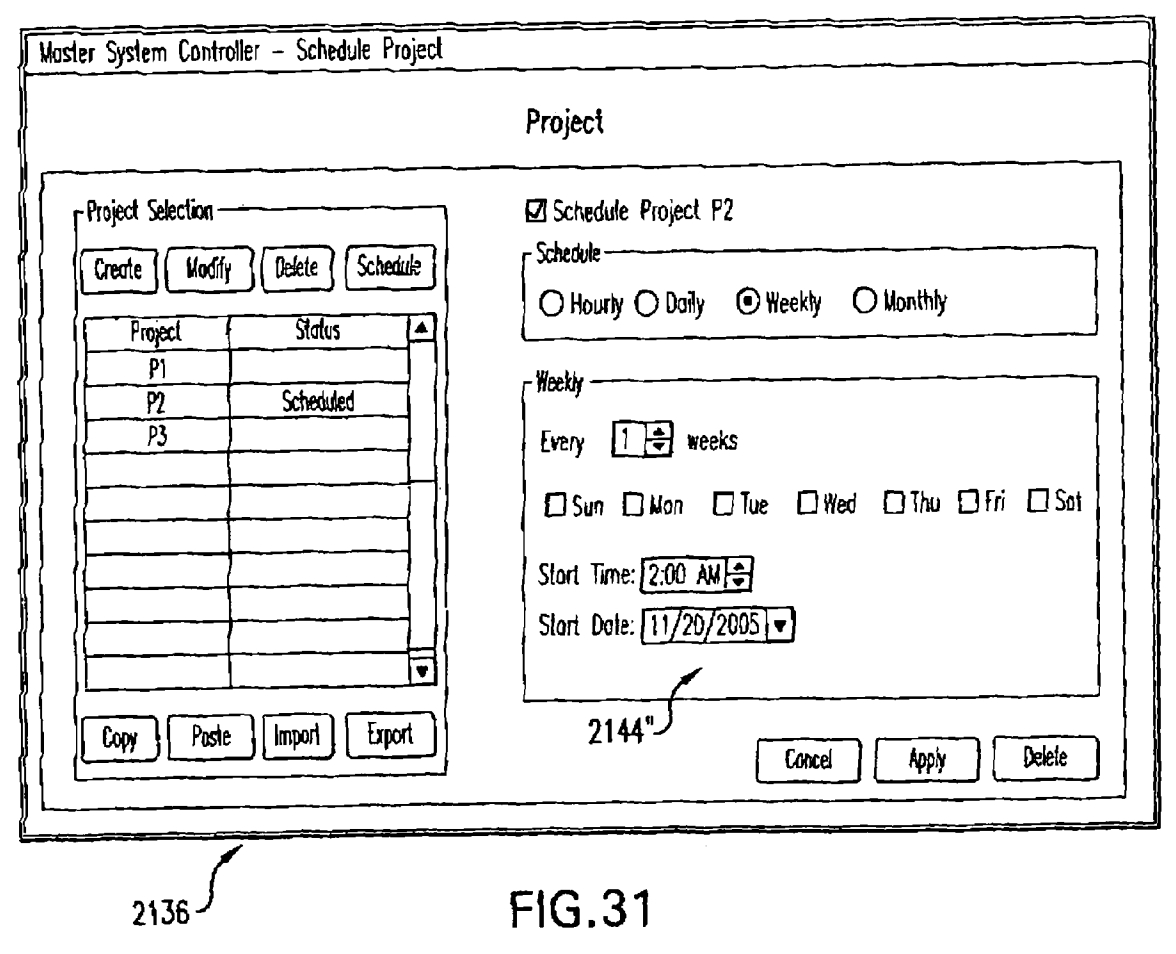

FIG. 31 shows by way of example an illustrative graphical user interface screen which may be utilized according to aspects of an embodiment of the disclosed subject matter;

Figure 32:
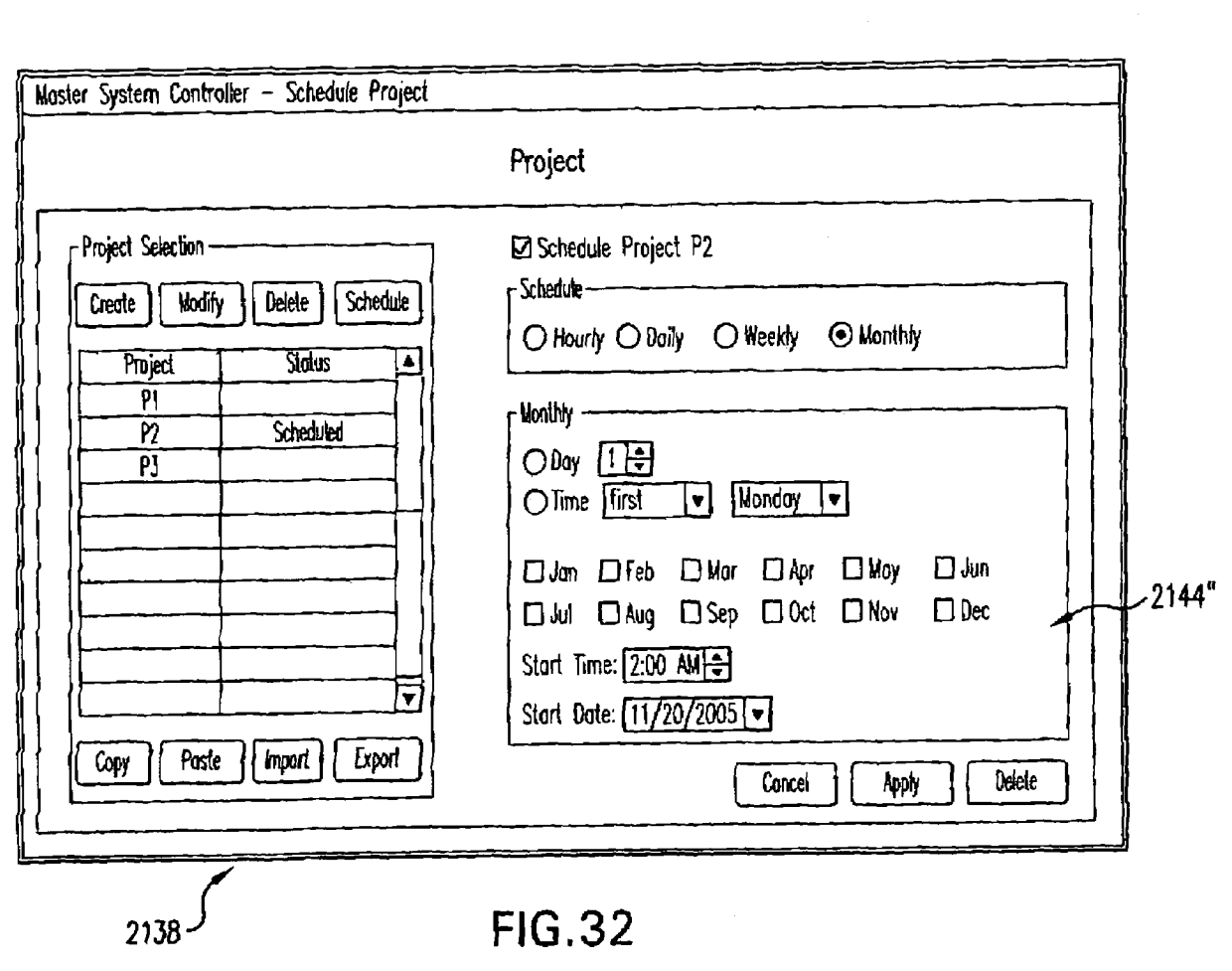

FIG. 32 shows by way of example an illustrative graphical user interface screen which may be utilized according to aspects of an embodiment of the disclosed subject matter;

FIG. 41 shows by way of example an illustrative graphical user interface screen which may be utilized according to aspects of an embodiment of the disclosed subject matter;

DETAILED DESCRIPTION OF PREFERRED EMBODIMENTS

Figure 1:
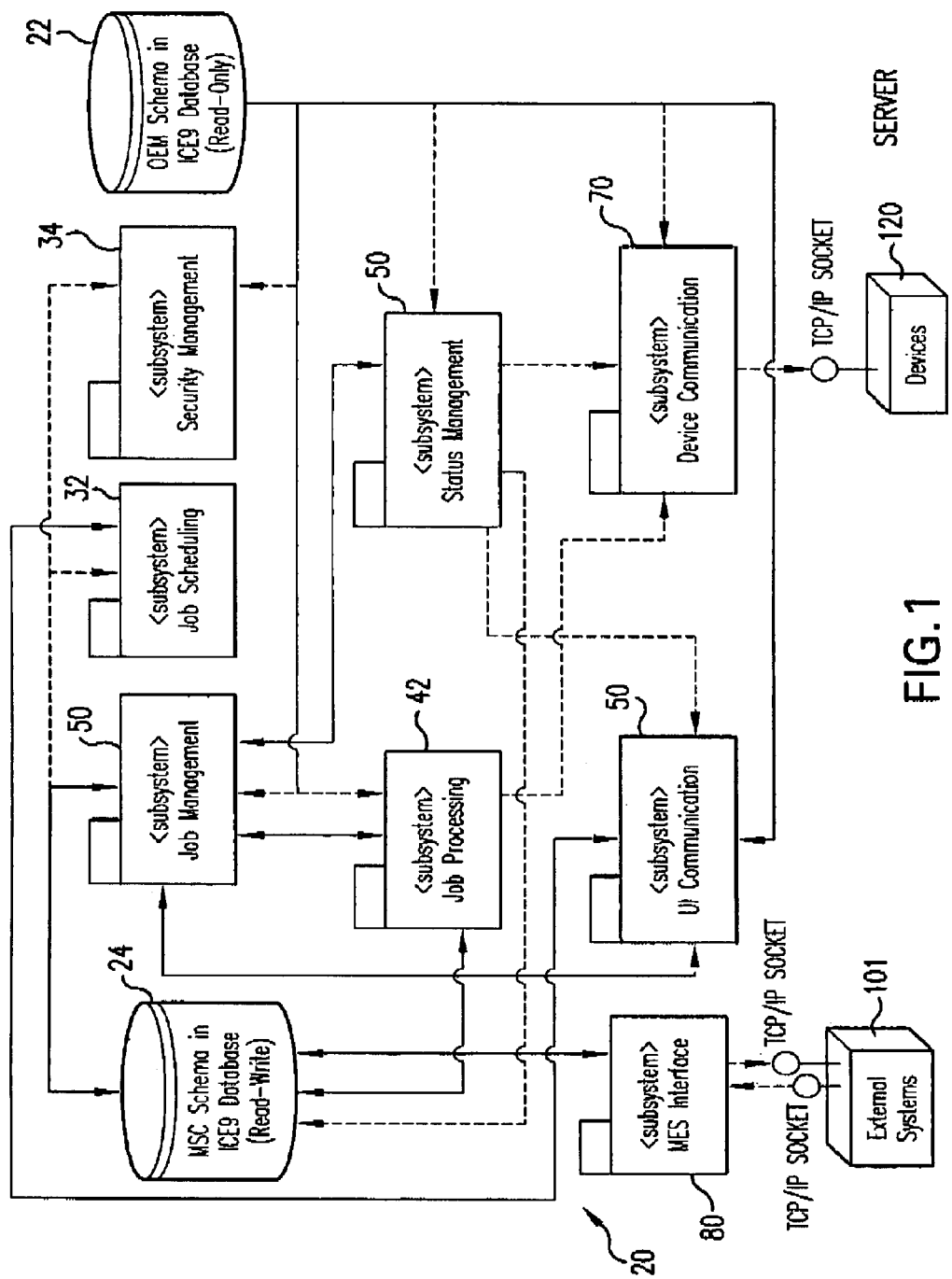
FIG. 1 shows schematically and in block diagram form a master system controller ("MSC"), by way of example, according to aspects of an embodiment of the disclosed subject matter.

According to aspects of an embodiment of the disclosed subject matter a Master System Controller ("MSC") architecture, comprising a software implemented controller may be provided for a high power elongated thin beam surface treatment system, e.g., an LTPS laser annealing system as noted above. The MSC 10, illustrated for example schematically in block diagram form in FIG. 1 has controller software that can function as a master system controller to control the hardware components of the laser surface treatment system, as an example what applicants refer to as an TCZ 900X pulsed elongated thin beam laser annealing system for annealing amorphous silicon in a layer on the substrate of a workpiece, a panel to be treated by the laser annealing system in an TCZ 900X laser annealing apparatus. The MSC can control various aspects of the process, e.g., aspects of laser operation, the placement of the workpiece relative to the elongated thin beam of high power DUV irradiation and the movement of the workpiece relative to the elongated thin beam of DUV radiation, as well as other aspects of the operation of the TCZ 900X machine. Using the MSC 10 software, process engineers can define recipes and projects, execute jobs to process silicon substrates and monitor machine performance. The architecture of the MSC 10 can function in cooperation with the TCZ 900X apparatus. Tool components may be, according to aspects of an embodiment of the disclosed subject matter, optimized for certain aspects of operation of the TCZ 900X tool for adequately high throughput, in order to make the operation of the TCZ 900X tool most cost effective and at the same time provide flexibility of operation to easily adapt the operation of the tool to varying customer needs, both from customer to customer and over time and from use to use within a customer organization.

The following is a Glossary to aid in the understanding of the operation of the MSC 10.

| TERM | DEFINITION |
|---|---|
| Job | Job is a "Recipe" or a "Project" that can be queued in a Job queue |
| Lot | Lot is one or more cassette (s), each typically consisting of up to 25 workpieces/substrates. |
| Recipe | A recipe is a container of all the parameters for processing a substrate. In other words, it is a collection of images. |
| Image | A substrate might be subject to different process conditions. An image is one set of those process conditions, e.g., pulse energy or focus position. |
| Project | A project (job) is a sequence of tasks required to perform a particular maintenance or monitoring activity. |
| Task | A task is a collection of actions with sequencing, branching and looping logic. |
| Action | An action is a collection of low-level system or device commands, or possibly a call to another task. |
| Substrate | Silicone substrate is the specimen (workpiece) for the crystallization process |
| Lot-To-Lot Maintenance | The maintenance actions required between one Lot and the next. |
| Image-To-Image Maintenance | Many images can exist in a substrate. These can be maintenance actions that can be performed in the time the system takes to prepare for the next image. |
| Image Start Position | This is the start position relative to the start corner of the substrate |
| Image End Position | This is the end position relative to the end corner of the substrate |
| Image Step Size | This is the centerline distance between 2 pulses on the beam longitudinal axis. |
| Image Beam Width | The width, e.g., full width half max across a short axis of the radiating beam. |
| Substrate Rotation | For example a 0° or 90° orientation. |
| Substrate Size | All substrates are rectangular. Size is defined by length and width and thereby categorized as generations 2, 3 or 4, corresponding to industry standard substrate sizes. |
| Auto Focus | For example, sensors, e.g., in the work stage may measure the actual substrate location and the system may compensate for small variations due to substrate thickness or other causes. |
| Stage Height | For example, the vertical position of the stage. |
| Recipe | Recipe defines the process parameters used to crystallize a substrate. |
| Project Schedule | Some projects (especially monitoring projects) might be run on a periodic basis. The project schedule specifies when to run the project: daily, weekly or monthly. To ensure that the machine is operational when a scheduled project is run, scheduled projects can be run before the first substrate of the day is processed. |
| Project Manager | Project Manager is the MSC module that helps Process Engineers create, modify and delete projects. |
| Recipe Manager | Recipe manager is the MSC module that helps Process Engineers to create/modify/delete recipes which may include images. |
| Process Manager/Job Manager | Process manager is the MSC module that helps Process Engineers to add/remove/reorder projects and recipes in the job queue. It also allows Process Engineers to start and stop the job queue. |
| Device Ready State | This is the state of a device when all initial conditions necessary to perform a task (of interest) are met. This varies by device and task. |
| LTPS | Low Temperature Poly Silicone |
| tbSLS | Thin beam sequential lateral solidification. |
| MSC | Master System Controller. This is a Linux PC-based solution with custom architecture and software to control the laser surface treatment tool. |

-continued

| TERM | DEFINITION |
| --- | --- |
| Process Engineer | An Process Engineer is an individual who performs the day-to-day production operations, e.g., processing substrates. Process Engineers have restricted access to the system. |
| Field Service Engineer | A Field Service Engineer is an individual who performs daily process optimization and performance monitoring operations. These can be system vendor trained engineers who have some additional access to the system. |
| Administrator | An Administrator is an individual who performs occasional troubleshooting and performance operations. They have full access to the system. |
| Process Optimization | This is the iterative process of deciding details of process parameters prior to a production substrate process. |
| MES | Manufacturing Execution Systems |
| SEMI | Semiconductor Equipment and Materials Suppliers Forum |
| SECS | SEMI Equipment Communication Standard |
| GEMS | Generic Equipment Model |

According to aspects of an embodiment of the disclosed subject matter an MSC 10 may consist of two or more major software components, a means 20 for issuing device commands and checking device conditions, such as a status, with, e.g., daemon process, and a graphical user interface ("GUI") 40 that allows users to define recipes and execute jobs. According to aspects of an embodiment of the disclosed subject matter the MSC 10 may use a database(s) to store its data persistently. The database(s) may use two schemas, a read-only generic (OEM) schema, that can contain system specific information, and a read-write user specific (MSC) schema that contains user specific information.

The MSC controller 10 may communicate with the majority of the devices using a specific communication protocol, e.g., over TCP/IP sockets, and may do so also with the GUI user interface.

The MSC 10 can be described at the architecture and design levels respectively, including the server, communication, user interface and database aspects of the system.

The following terms and acronyms may be utilized in describing the operation and design of the MSC controller 10.

| | |
| --- | --- |
| Daemon Process: | a computer process running on a server machine that continuously checks device status and issues device commands on user request; |
| OEM Schema: | a read-only schema that contains manufacturer provided relatively static information; |
| MSC Schema: | a read-write schema that contains user provided recipe definitions; |
| ICE9 Database: | a relational database, containing the MSC Schema and the OEM schema; |
| MES: | Manufacturing Execution Systems; |
| SEMI: | Semiconductor Equipment and Materials International Standards; |
| SECS/ GEM: | SEMI Equipment Communication Standard and Generic Equipment Model Interfaces. |

According to aspects of an embodiment of the disclosed subject matter high-level features contributing to the structure and operation of the architecture can include Project Scheduling, Security and Access Control, Module Concept (Lifetime Counters), Workflow, MES Interface using SEMI SECS/GEM Standards, Reporting and Performance.

According to aspects of an embodiment of the disclosed subject matter these can provide project scheduling, both event and schedule based, security and access control, flexible and generic introduction of modules, monitoring of modules, rather than just devices, screens for module replacement, flexible and generic mechanism(s) for lifetime counters, display of maintenance counters in status tabs as value and text, custom project screens for diagnosis, download and control, integration with customer MES 80 using SEMI SECS/GEM Interfaces, project reporting, scheduling and folder/file structure, and performance metrics.

Such features may be implemented using the following high-level components:

| | |
| --- | --- |
| Project Scheduling: | Server - Project Scheduling; |
| Security and Acess Control: | GUI - Security Management; Server - Security Management; |
| Module Concept (Lifetime Counters): | GUI - System Configuration Management; GUI - Report Mangement; GUI - Job Management; |
| Workflow: | GUI - Project Management; GUI - Workflow Engine; GUI - Report Management |
| MES Interface: | Server - MES Interface; |
| Reporting: | GUI - Report Management; |
| Performance: | Server - Job Processing. |

The MSC 10 may use a hybrid approach to the architectural question of whether to use threads or processes, e.g., to divide the work done. In this approach the core tasks run in threads inside a single process, but the coding of the tasks can actually be single threaded. This may be made possible by each thread having its own message pump (with a message queue and message loop). The message pump can essentially make the access to the task sequential, but non-blocking. According to aspects of an embodiment of the disclosed subject matters in the control application of the MSC 10 such a hybrid approach can give the best of both worlds (threads vs. processes).

According to aspects of an embodiment of the disclosed subject matter multiple threads may be used for interfaces on a one thread per device interface approach. This approach can make the device interface more responsive for communication needs instead of relying on a single thread to control all devices. As explained above, synchronization is not an issue because each device interface can have its own message pump that can provide non-blocking sequential access. The presence of a message pump can also desirably make the code of the device interface single threaded.

According to aspects of an embodiment of the disclosed subject matter the MSC 10 may incorporate a method to notify the user that an error has occurred. For example the design may handle errors using the message pump, like any other messages. However, an error messages can be assigned special priority. As a result, an error message can be processed immediately from the message queue even though it is not at the front of the queue. Using other approaches such as using signals to interrupt threads might leave the resources and objects in MSC 10 in an unknown state. To ensure that the MSC 10 may be responsive to error messages and user interrupts blocking calls may be eliminated from the MSC 10 and the message loop can be serviced within some acceptable time limit.

According to aspects of an embodiment of the disclosed subject matter design engineers may use a scripting language to define tasks and store them in the OEM database. Also the MSC 10 may only poll the devices, i.e., no interrupts from the devices can be used for read-only access. A device also might have only a single communication channel for both control and diagnostics. Therefore no scripting may be needed for the status loop logic, multiple scripting interpreters in a single process and parallel threads may be avoided.

Assuming that all devices attached to the MSC 10 have separate communication channels for control and diagnostics, then there may be also no need to create one thread per device interface. Only two threads can be needed independent of the number of devices, one for control and the other for diagnostics, however, applicants have elected t use one per device for certain performance reasons. According to aspects of an embodiment of the disclosed subject matter certain constraints were recognized and accounted for by applicants. For example, the controller system can use a generic mechanism to issue device commands corresponding to the high level actions independently of the device types. Device commands can be stored in a database or file rather than hard-wired in the code. Image parameters may be added to the image without coding modifications, e.g., to the user interface screens.

The number and type of the task parameters may be varied from task to task, and adding additional tasks or changing number/type of task parameters does not involve coding modifications to the user interface screens. TCP-IP can be the main type of communication to the devices. The system can also be responsive and not block when waiting to get response from devices. The system can use a generic and flexible mechanism to represent modules and update their maintenance counters, and can perform parallel processing, if necessary, during the working of the apparatus being controlled during an TCZ 900X crystallization process, e.g., to maximize the throughput. The system also provides a generic workflow engine to allow users to define, execute, and report projects. The system uses SEMI SECS/GEM interfaces to communicate with MES 80.

According to aspects of an embodiment of the disclosed subject matter the MSC 10 software controller may be utilized with the following hardware, an AMD Opteron x86-64 Bit Dual Processor CPU, a RAM, a RAID1 SCSI, a RAID 1 Sata, a Video Card, an NIC, and a Touch Screen Monitor. The system may also employ an operating system, such as Linux Fedora, a relational database such as a Postgres Relational DBMS and a Scripting Engine such as Python.

According to aspects of an embodiment of the disclosed subject matter the MSC 10 may be object-oriented and UML based. Such an architecture and design can be illustrated and understood by way of example utilizing the package diagrams, class diagrams, sequence diagrams, component diagrams and deployment diagrams discussed in the present application. According to aspects of an embodiment of the disclosed subject matter, among other issues, error handling and recovery, and the impact of such and other aspects of the MSC 10 on throughput, can be perhaps the two dominant driving forces behind applicants chosen architecture and operation of the MSC 10.

According to aspects of an embodiment of the disclosed subject matter an overview of the architecture may start with the fact that the functionality of MSC software may be provided by at least two top-level components a Server Daemon Process and a GUI Client. The Server Daemon Process, e.g., server 20 in FIG. 1 can be responsible for executing the device commands and monitoring the status of the devices, while the GUI Client, e.g. GUI 40 in FIG. 1 can be responsible for taking user specific information recipe definitions from the user and sending user commands to the Server Daemon Process 40. The GUI Client 10 can also display the status of the devices and the progress of the crystallization process to the user. An example of a top level design for an MSC system can be seen in FIGS. 1 and 2, indicating an illustrative set of major components of the system 10 and their relationships.

Figure 2:
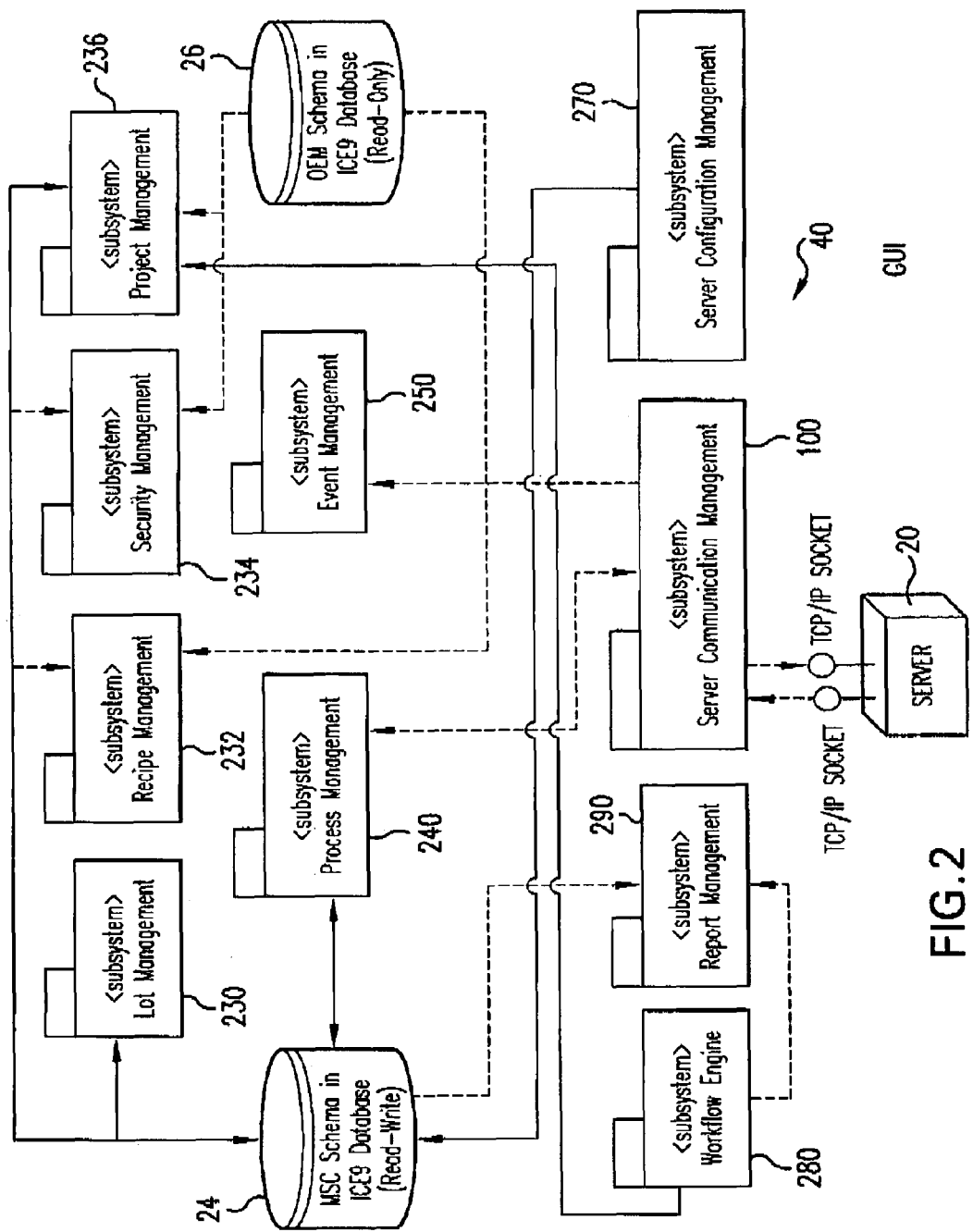
FIG. 2 shows by way of example in schematic and block diagram form aspects of a portion of an MSC, according to aspects of an embodiment of the disclosed subject matter.

According to aspects of an embodiment of the disclosed subject matter, as the block diagrams of FIGS. 1 and 2 show, an OEM schema database 22 may be separated from an MSC schema database 24. This may be because the OEM schema database 22 may contain read-only information, e.g., data task definitions data. The tool users can be not expected to modify it. By keeping the OEM schema data separate from the MSC schema data, it may be easy to upgrade the system with new task definitions from the work system supplier, e.g., the MSC system manufacturer (the OEM) and also easier, e.g., for the overall system to be customized to a particular user's needs, e.g., the best way to optimize for throughput for the user's particular manufacturing system being controlled and other needs.

As shown in FIG. 2 the MSC Schema read-only database 24 may be linked to a plurality of subsystems, e.g., a Lot Management subsystem 230, a Recipe Management subsystem 232, a Security Management subsystem 234, a Project Management subsystem 236, a System configuration Management subsystem 270 and a Job Processing subsystem 42. The OEM Schema read-only database 26 may also be connected to the Recipe Management subsystem 232, the Security Management subsystem 234 and the Project Management subsystem 236. An external server 20, which may be a HOST, may be connected to the MSC Schema database 24 through a TCP?IP socket and a Server Communication Management subsystem 100 through the Process Management subsystem 240 and also be connected to an Event Management subsystem 250 through the server Communication Management subsystem 100. The MSC database 24 may also be in communication with a Report Management subsystem 290 that can be connected to the Project Management subsystem 236 through a Workflow Engine subsystem 280.

According to aspects of an embodiment of the disclosed subject matter architecture task definitions can be stored as macros or scripts in a database. According to the architecture, a command interpreter may be utilized to parse those task definitions and execute the device commands. By storing, e.g., task definitions as macros or scripts (collectively referred to herein as scripts) in a database, the logic of the master controller can be moved from compiled code into data in a database. This can provide a flexible approach to change the functionality and intelligence of the master system controller 10 on the fly without recompiling the code of MSC software.

As can be discussed below in the process view of the architecture, each subsystem can have its own message pump with a message queue and message loop. The use of such a message pump essentially serializes access to the subsystems thereby making them single threaded. Only a few service subsystems have no message pump in them and they can be multi-threaded. Single threaded systems have no synchronization issues. They can be also easy to code and maintain. The device interfaces may run in their own threads. The job processor makes non-blocking calls to the devices interfaces. To provide a one second response from the job processor, the non-blocking calls can be necessary. A high level design of the MSC 10 may be illustratively described using the following views, Logical View, Process View, Data View, Development View and Deployment View, respectively shown in FIGS. 3-7.

According to aspects of an embodiment of the disclosed subject matter, a logical view 300 can illustrate how the system addresses the functional requirements of the MSC 10. It may be an object model of the design. On the server 20 side, illustrated in FIGS. 1 and 3, the following components may be part of the logical view of an MSC system 10. A job manager 30, 310 may comprise a gatekeeper for the MSC server 20. It may respond to control messages from the GUI 40 and control job execution. A job processor 42, 312, may comprise the workhorse of the MSC system server 20. It may execute jobs using a command interpreter 314, e.g., a Python with command callbacks from a command library manager 316. The command callbacks may be categorized into groups, e.g., device commands for communication with devices, data commands for data transfer with the MSC 10 and system commands to communicate with the MSC 10. A data object manager 320 may facilitate the implementation of data commands.

One or more device interfaces, such as laser interface 330, stage interface 332, master distribution ("MD") box interface 334, beam stabilization controller ("BSC") interface 336, Attenuator 338 interface 338, subsystem n-1 interface 340 and subsystem n interface 342 may be used to communicate with such physical or logical devices in an TCZ 900X apparatus, as denoted. The device interfaces may also provide a high level abstraction for communication between devices and the MSC server 10. All communication to devices processed within the MSC system server 20 may be done using Neutral Language Format (NLF), the NLF commands (otherwise referred to herein as "generic commands") may then be converted into Device Format (DF) specific commands ("device specific commands") for each specific device and sent to such device over the respective device interface 330-342. A status manager 50, 350 may monitor the status of devices through device interfaces 330-342. The status manager 350 may also log status messages in MSC server 20. A UI communications manager 60, 370 may facilitate communication between server 20 and GUI 40. Depending on the purpose of the communication whether it is for control or for reporting status, more than one instance of this component may be used in MSC server 20—a UIControlCommManager 60, 370 for control messages and a UIStatusCommManager 60, 370' for status messages. Control messages may go in and out of the MSC server 20, i.e., they can be bi-directional. Status messages, however, may only go out of server 20, i.e., they can be unidirectional. In both cases, the sever 20 may wait for GUI 40 to initiate a communication connection request. A project/job scheduler 32, 380 may be used to schedule activity maintenance, servicing, monitoring and/or performance reporting projects for periodic or other selected time of execution on a daily, weekly or monthly basis or based on some other data, e.g., number of pulses produced by the laser, number of panels processed or the like. A security service 34, 390 may provide security and access control by authenticating/authorizing users and controlling access to system features in the server layer, e.g, controlling log in and the ability to perform certain operations using the MSC 10, based on, e.g., the user ID and authentication, machine availability and the like, the scope of the operation of which is not the subject of this application. An MES 80 interface 400 may provide communication to and from external systems, e.g., using SEMI SECS/GEM interface standards.

According to aspects of an embodiment of the disclosed subject matter, a number of services may be provided within the server 20, including a naming service 410 to provide an object discovery facility in the MSC server 20, a data access service 420 to provide a high level abstraction for data access in the MSC server 20, a thread service 430 to provide high level threading and synchronization facilities in the MSC server 20, and a message service 440 to facilitate communication among major components in the MSC server 20. As noted above, there can be two databases in the MSC controller system, the read-only OEM database 22, which may contain system defined tasks and parameters and the read-write MSC database 24, which may contain user-modified data, e.g., for recipes, lots, projects, and jobs. In addition to the abstraction provided the data access service, further separation between application logic and data access may be achieved by using Data Access Object (DAO) helper classes, which can contain code to retrieve and update data in the database, without any application logic.

Figure 3A:
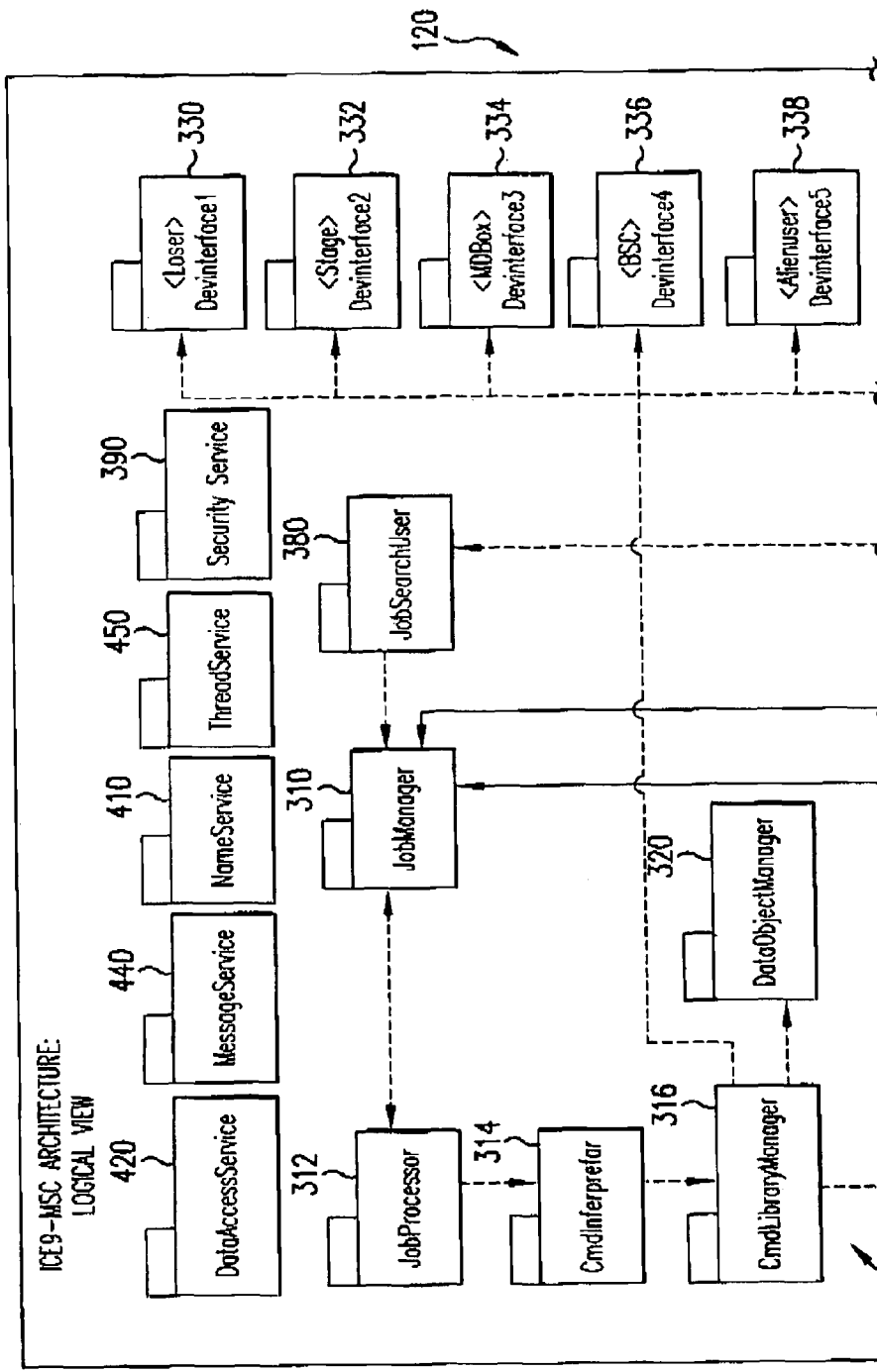
FIG. 3 shows by way of example in schematic and block diagram form an architecture logical view of a portion of an MSC, according to aspects of an embodiment of the disclosed subject matter.
Figure 3B:
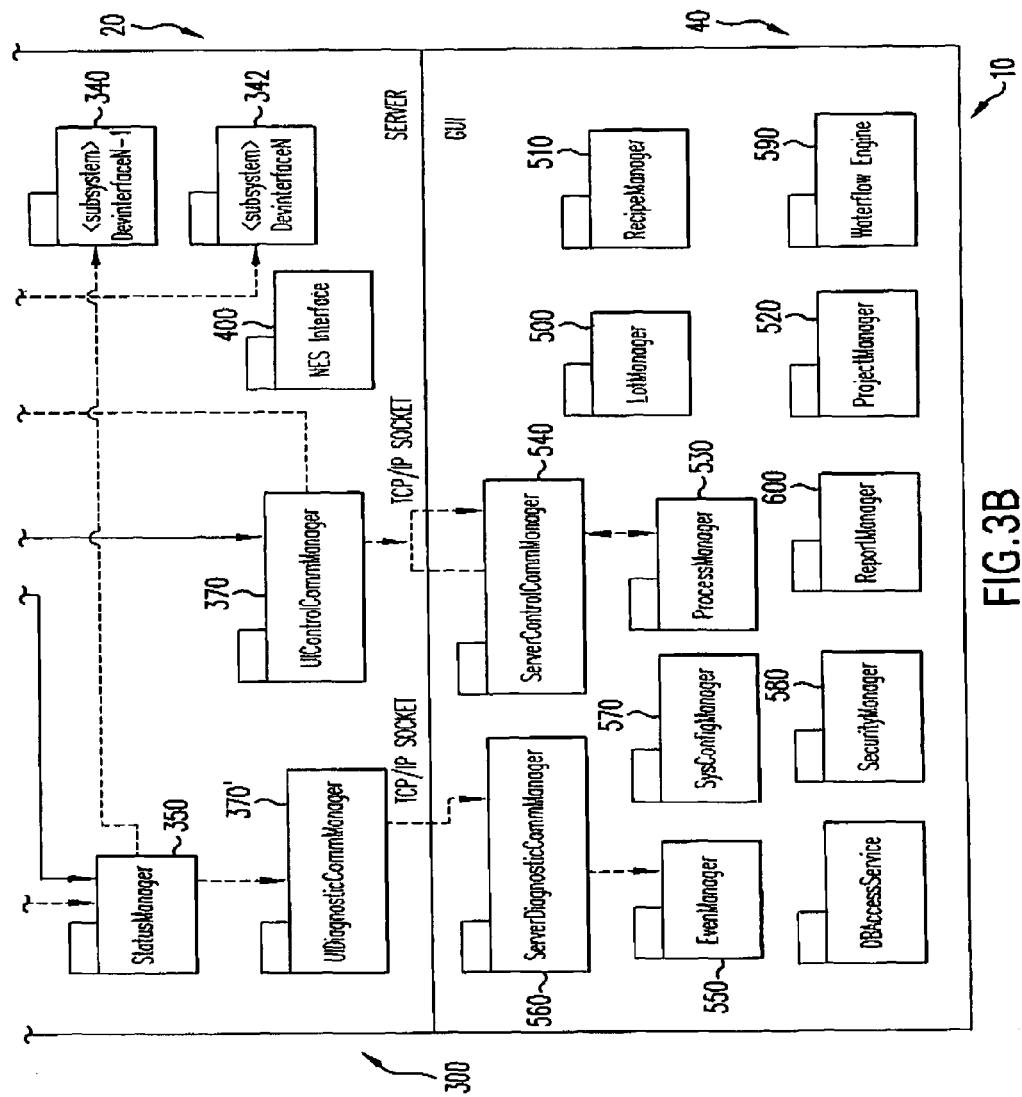

According to aspects of an embodiment of the disclosed subject matter, on the GUI 40 side, illustrated in FIGS. 2 and 3 the following components may be a part of the logical view of MSC 10 controller system. A recipe manager 510 may serve to allow users to create, update, delete, copy and paste recipes and their associated images using the GUI 40. A project manager 520 may allow users to create, update, and delete projects in terms of system supplied tasks using the GUI 40, and also allow users to provide, e.g., schedules for projects. A Job Manager/Process Manager 530 may allow users to create, delete, reorder, and execute jobs from the GUI 40. The job/process manager 530 may also allow users to halt, resume or abort job execution. The job/process manager 530 may also allow jobs to be run in step, stopping after each job, or continuous mode, without stopping between jobs/processes, and may send and receive control messages to and from the MSC server 20 through a server control communications manager 540. A status/event manager 550 may allow users to view status messages from the MSC server 20 over the server diagnostics communications manager 560, and also allow users to filter status messages based, e.g., on timing, severity and message content. A system configuration manager 570 may allow users to update the sever/GUI system configuration and device configuration information. System configuration information changes may be applied immediately in the GUI 40 and server 20 by refreshing the cached values. Device configuration changes may be applied when the devices can be reconnected or when appropriate jobs can be executed. The server communication manager 540, 560 may facilitates communication between GUI 40 and server 20. Depending on the purpose of communication, whether it is for control or for reporting status, more than one instance of this component may be used in the GUI 40 the server control communication manager 540 for control messages and the server status communication manager 560 for status messages. Control messages may go in and out of the GUI 40, i.e., can be bi-directional. Status messages may only come out of MSC server 20, i.e., can be unidirectional. In both cases, however, the GUI 40 first establishes connection to the MSC server 20 for communication. A security manager 580 may provide security and access control by authenticating/authorizing users and may also control access to the system features in GUI 40 layer. A workflow engine 590 may allow users to define, execute and report projects using custom screens. This component may provide custom views into the generic functionality available in the project management system component 520. The workflow engine 590 may also make use of a report management system 600 to display reports with project execution results reports created by various components in the system and displayed by the report manager 600. A data access service 610 may provide a high level abstraction for data access from GUI. 40.

Figure 4:
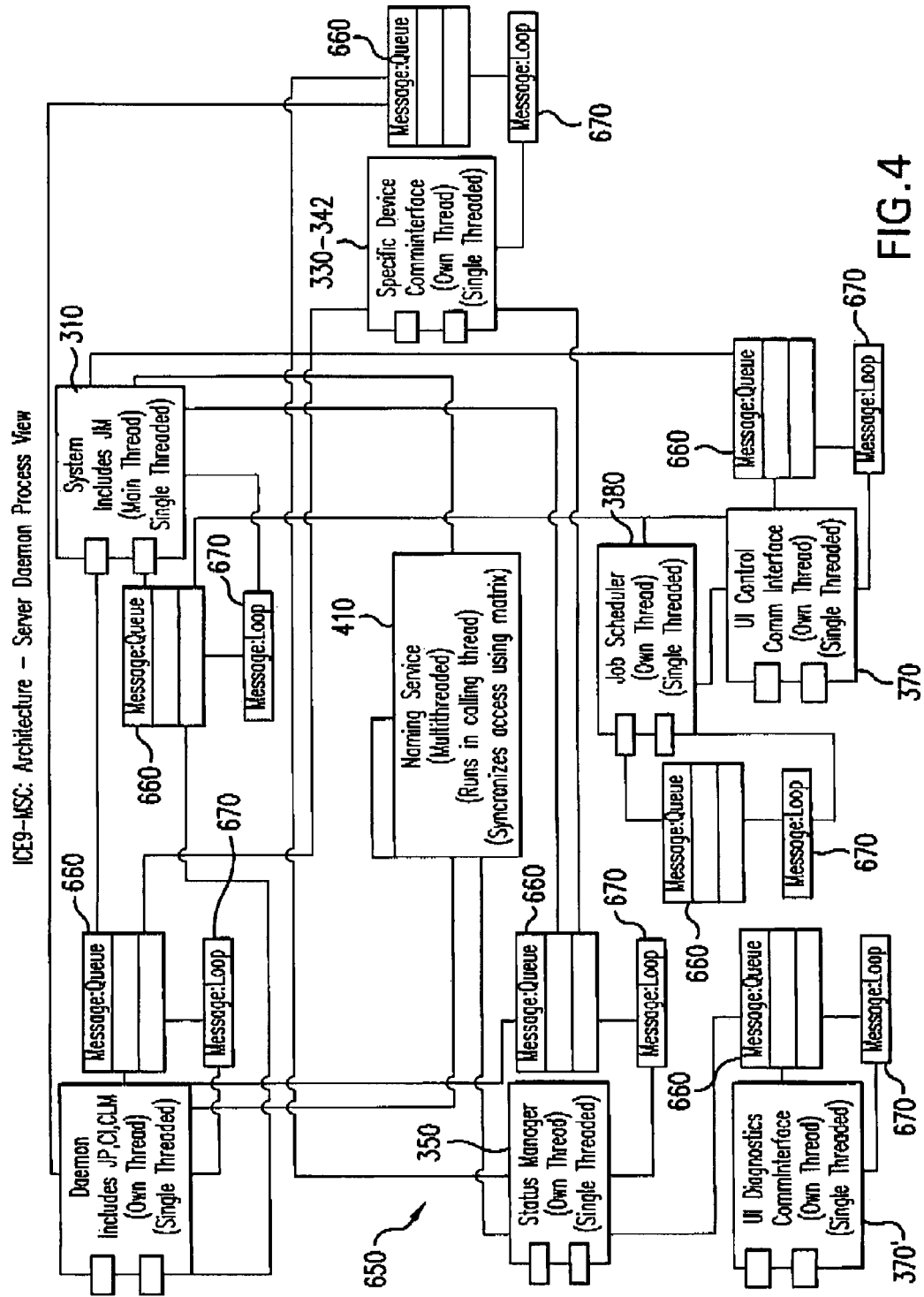
FIG. 4 shows by way of example in schematic and block diagram form a server daemon process view of a portion of an MSC, according to aspects of an embodiment of the disclosed subject matter.

According to aspects of an embodiment of the disclosed subject matter, a Server Deamon process view 650 illustrated in block diagram form in FIG. 4 addresses non-functional requirements like concurrency, performance, and scalability of the MSC 10. The exemplary process view 650 shown in FIG. 4, by way of example, captures the threading and synchronization aspects of the design. Two components, a Thread Service and Message Service provide concurrency and intra-component communication facilities in the MSC server 20. The Thread Service component provides high level threading and synchronization facilities in the MSC server 20. The Message Service component-facilitates communication among major components in MSC server 20. It consists of a Message Queue 660 to store received messages from other components and a Message Pump 670 to dispatch messages to the component in a First-In-First-Out (FIFO) order. The use of Message Queue 660 in the MSC 10 by various threads is more like the use of shared memory by different processes. When there can be no more messages left to dispatch, the Message Pump 670 thread can wait on a thread conditional variable, i.e., by way of example, after posting a message to the Message Queue 660 of a message destination component, the message source component can wake up the waiting thread of the destination component. This can provide maximized performance since there is no busy wait loop in the Message Pump 670.

Each major component in the MSC server 20 can run in its own thread with a respective Message Pump 670 and associated Message Queue 660. These components communicate with each other by posting messages to each other, thereby providing an asynchronous flow of communication. Communication with a single device 330'-342' (shown in FIG. 8) can be serialized by the use of the Message Queue 660 in a respective Device Interface component 330-342. Since each Device Interface 330-342 runs in its own thread, commands can be sent to multiple devices 330'-342' simultaneously.

Another advantage of running each major component of MSC server 20 in its own thread is that the component can be coded single threaded without the complexities of multi-threaded programming. Service components such as Message Service 440, Naming Service 410 and Data Access Service 420 (shown in FIG. 3) can be multi-threaded because more than one thread can use those services simultaneously. By limiting the multi-threaded programming to a few service components, the majority of MSC server 20 components can be easy to code and maintain.

Figure 5:
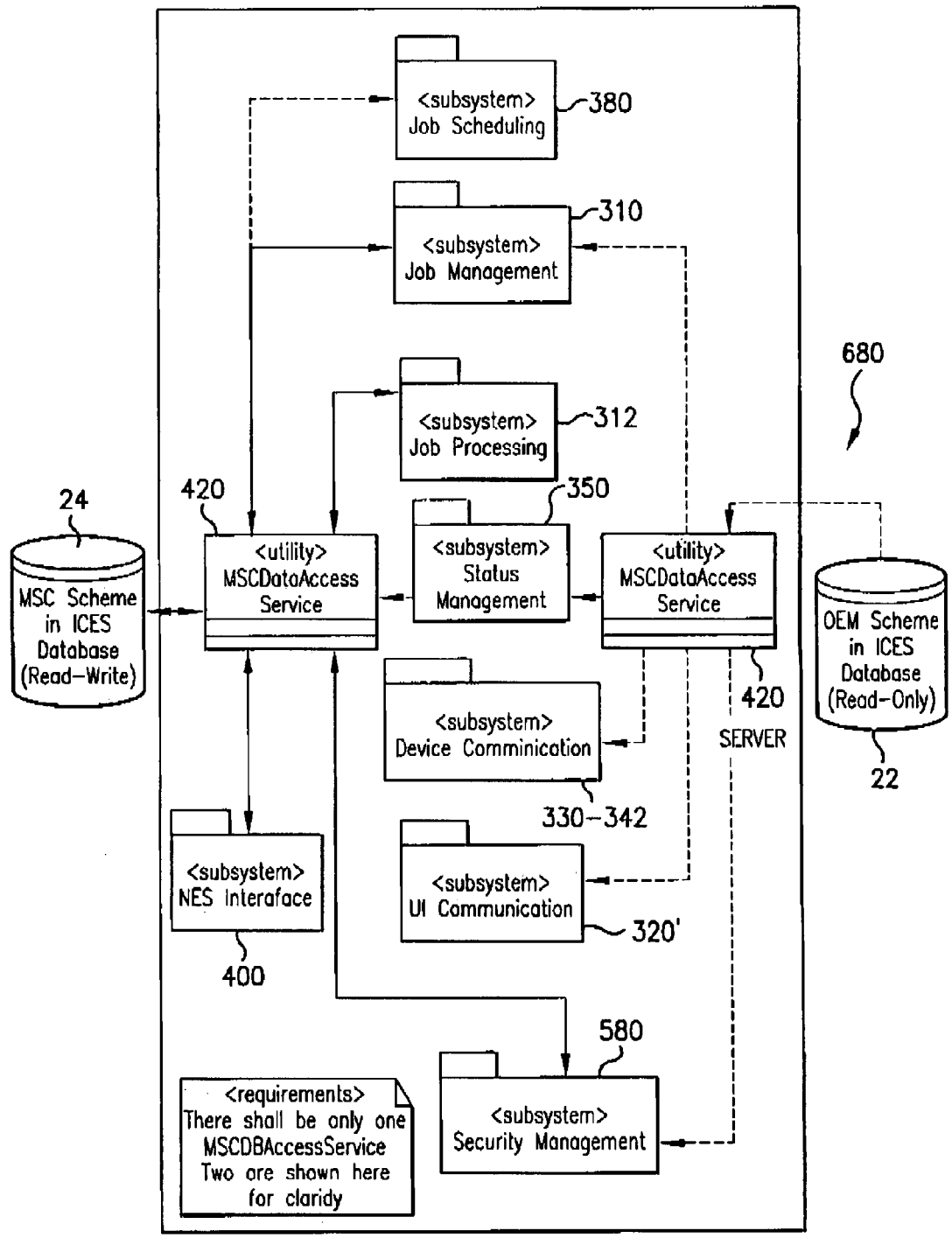
FIG. 5 shows by way of example in schematic and block diagram form a portion of an MSC, according to aspects of an embodiment of the disclosed subject matter.

A data view 680, illustrated schematically by way of example and in block diagram form in FIG. 5 can address the data needs, i.e., data storage and retrieval mechanisms of the MSC 10. The Data Access Service component 420 in the MSC server 20 and GUI 40 (shown separately in FIG. 5 for convenience of illustration although in actuality only one is needed and actually used according to aspects of an embodiment of the subject matter disclosed, though separate units may also be possible in some embodiments) can provide a high level abstraction for data access in the MSC 10. The data access service component(s) 420 can hide the details of the actual data store used to store and retrieve data in the MSC 10, in order to thereby provide a layer of data store independence for the MSC application and presentation logic. The MSC 10 may use two data stores one, 24, for both reading and writing user specific information recipe related data, and the other, 22, for only reading OEM specific data system and device configuration data. The read and write access paths are shown in the exemplary data view 680 of FIG. 5 as bi-directional communication. The read-only access paths are shown in the exemplary data view 680 of FIG. 5 as unidirectional communication.

Figure 6:
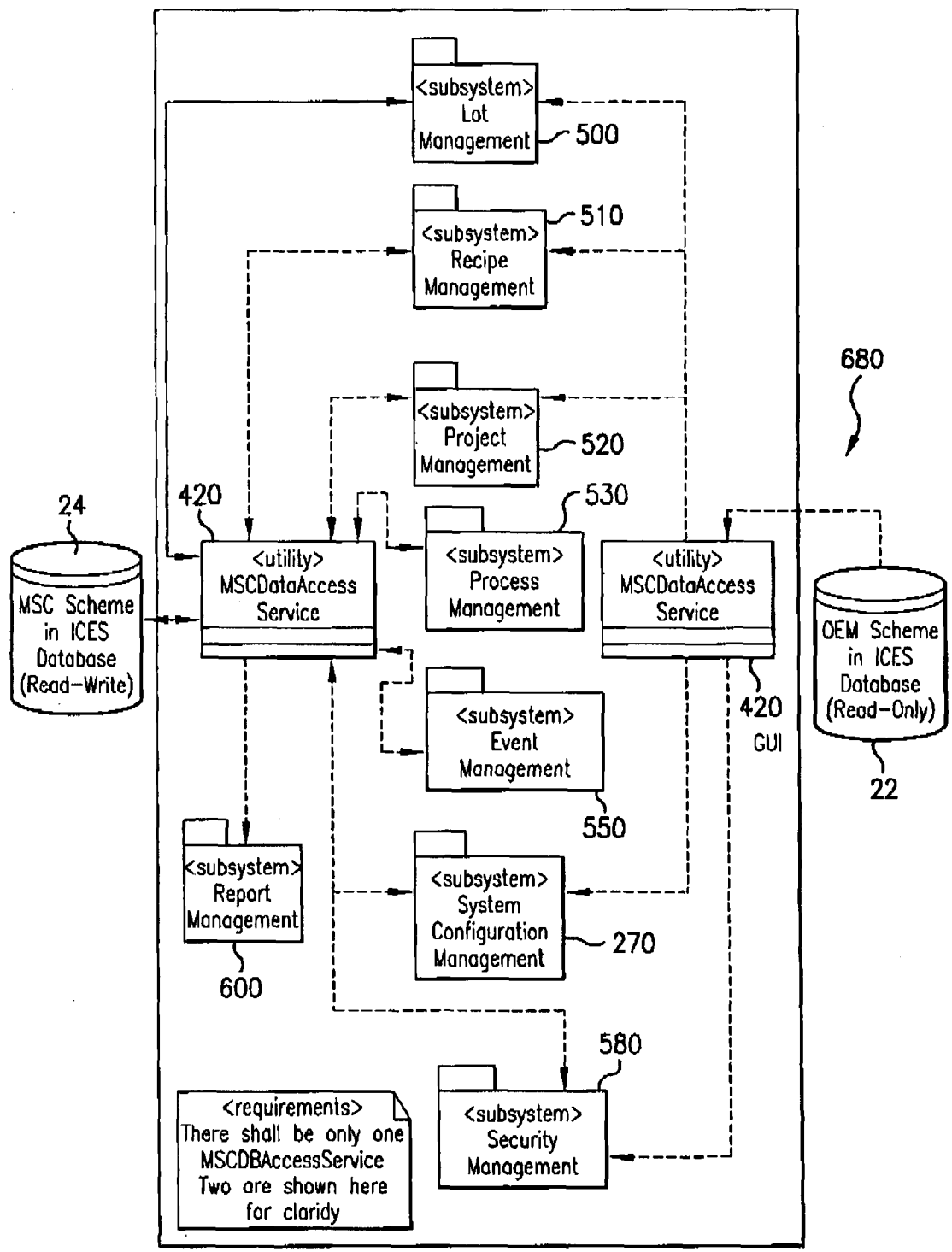
FIG. 6 shows by way of example in schematic and block diagram form a portion of an MSC, according to aspects of an embodiment of the disclosed subject matter.

A GUI data view, illustrated by way of example, schematically and in block diagram format, in FIG. 6, the data needs of the GUI, similarly to those noted above for the server. the data access service components(s) 9 two shown for illustration though only one may be needed) serve the Lot Management component 500, the Recipe management component 510, System Configuration Management component 270 and Security Management component 580 with access to both the MSC schema database portion 24 and the OEM schema database portion 22, while the Process Management component 530, Report Management component 600 and Event Management component is only served with connection to the MSC schema portion of the database.

Figure 7:
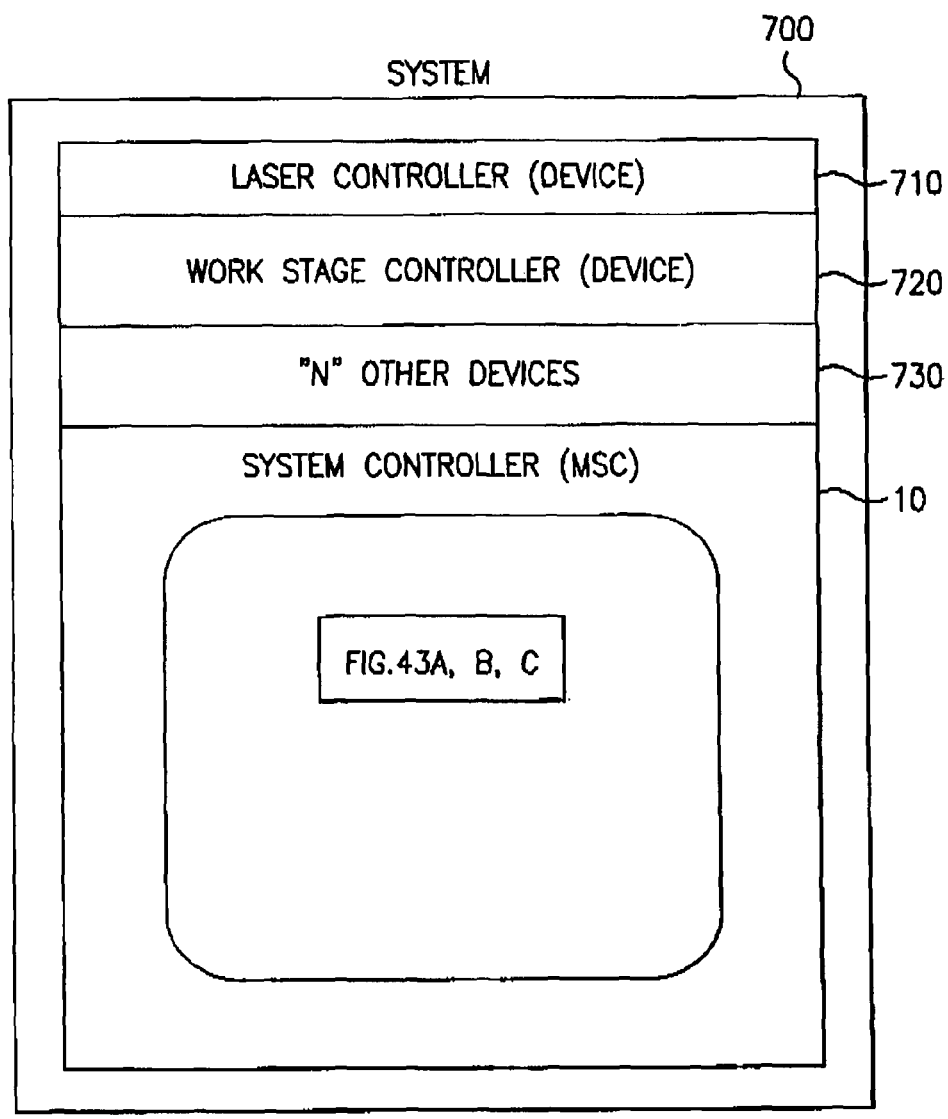
FIG. 7 shows by way of example in schematic and block diagram form an example of a system according to aspects of an embodiment of the disclosed subject matter.

FIG. 7 shows in schematic and block diagram form an irradiation processing system 700, such as a laser irradiation thin beam processing system, according to aspects of the disclosed subject matter. this may include a laser device controller, 710, a work stage controller 720, a controller for some other n devices and a system controller, e.g., MSC 10, an example of an embodiment of which may be seen in FIGS. 43 A, B and C.

Figure 8:
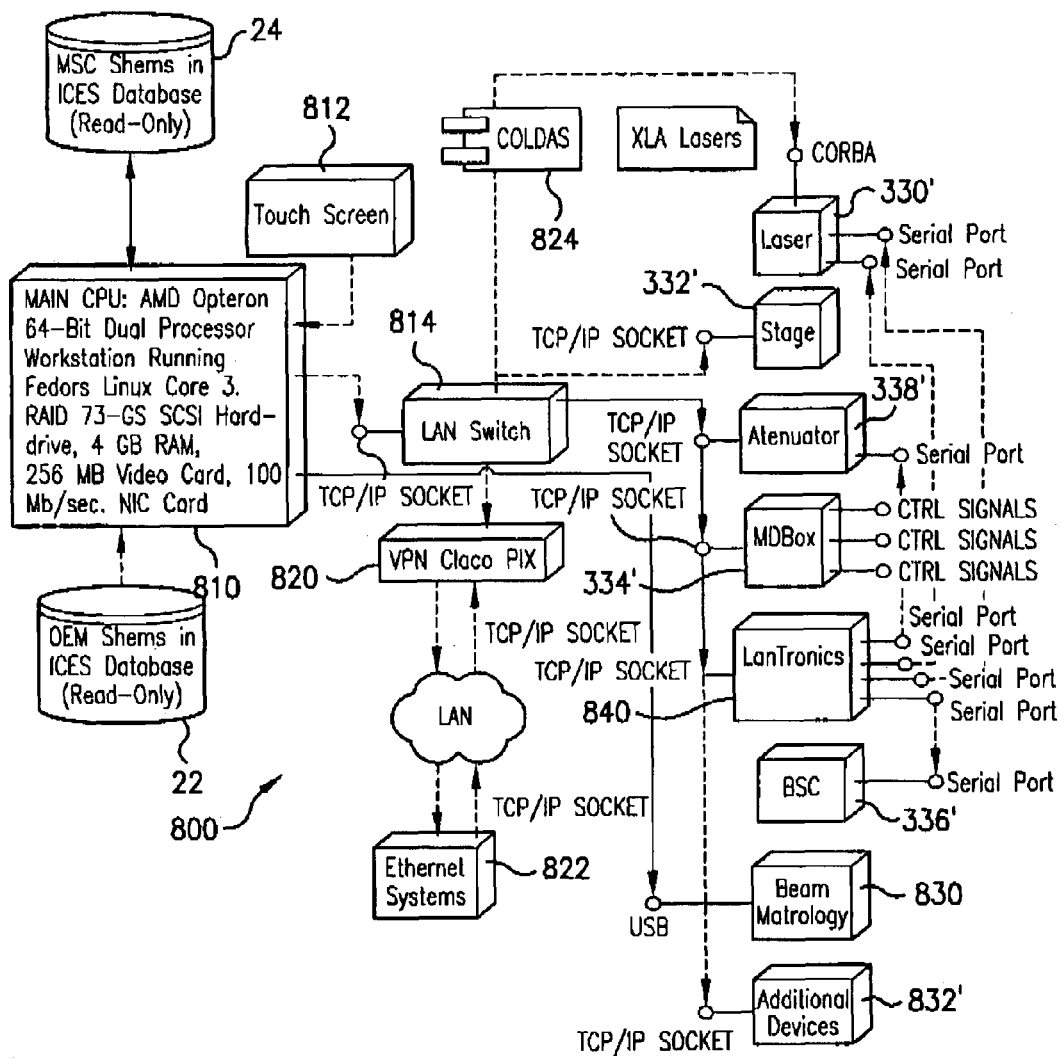
FIG. 8 shows by way of example in schematic and block diagram form an architecture deployment view of a portion of an MSC, according to aspects of an embodiment of the disclosed subject matter.

A deployment view 800, shown schematically in FIG. 8 by way of example and in block diagram form, according to aspects of an embodiment of the disclosed subject matter, can address the topology and communication aspects of an MSC 10. This deployment view 800 describes the mapping of the software onto the hardware and reflects its distributed aspect. The exemplary deployment view of FIG. 8 shows how the MSC 10 software can be physically implemented on the hardware. The MSC 10 can be a software component of the TCZ 900X project. The MSC server 20, MSC GUI 40 and the two databases/database portions (MSC 24 and OEM 22) can run on a single 64-bit Dual Processor Linux machine 810. The MSC 10 may be connected to a number of physical devices 330-336', that can be part of TCZ 900X machine. The communication between the MSC 10 and the devices 330'-336' may, for the most part, in this exemplary arrangement, be through TCP/IP sockets, as illustrated by way of example in FIG. 8. Also, a USB interface may be used to communicate with cameras (not shown) in a beam metrology unit 830, or with other beam metrology apparatus. The MSC server 20 may communicate with the MSC GUI 40 using TCP/IP sockets, as illustrated in FIG. 8 by way of example. Some of the devices such as Laser 330' and BSC 336' may have only serial ports for communication. In those cases, the MSC 10 may connect to a Lantronics module 840 through a TCP/IP connection, which can then convert serial port signals into TCP/IP and vice-versa. The MSC 10 may use PostgresQL for its MSC 24 and OEM 22 databases/database portions. The MSC server 20 may connect to the databases 22, 24, using libpq and the MSC GUI 40 using JDBC. The MSC 10 and the devices 330'-338' may also be on a private LAN with a LAN switch 814 behind a Cisco VPN PIX firewall 820. Access to the MSC 10 from outside the firewall 820 may be allowed in limited instances using VPN through the firewall 820.

The Table of FIG. 10 shows various messages used for communications among components of the system according to aspects of an embodiment of the disclosed subject matter. The Table of FIG. 11 shows illustrative messages that may be used.

Figure 12A:
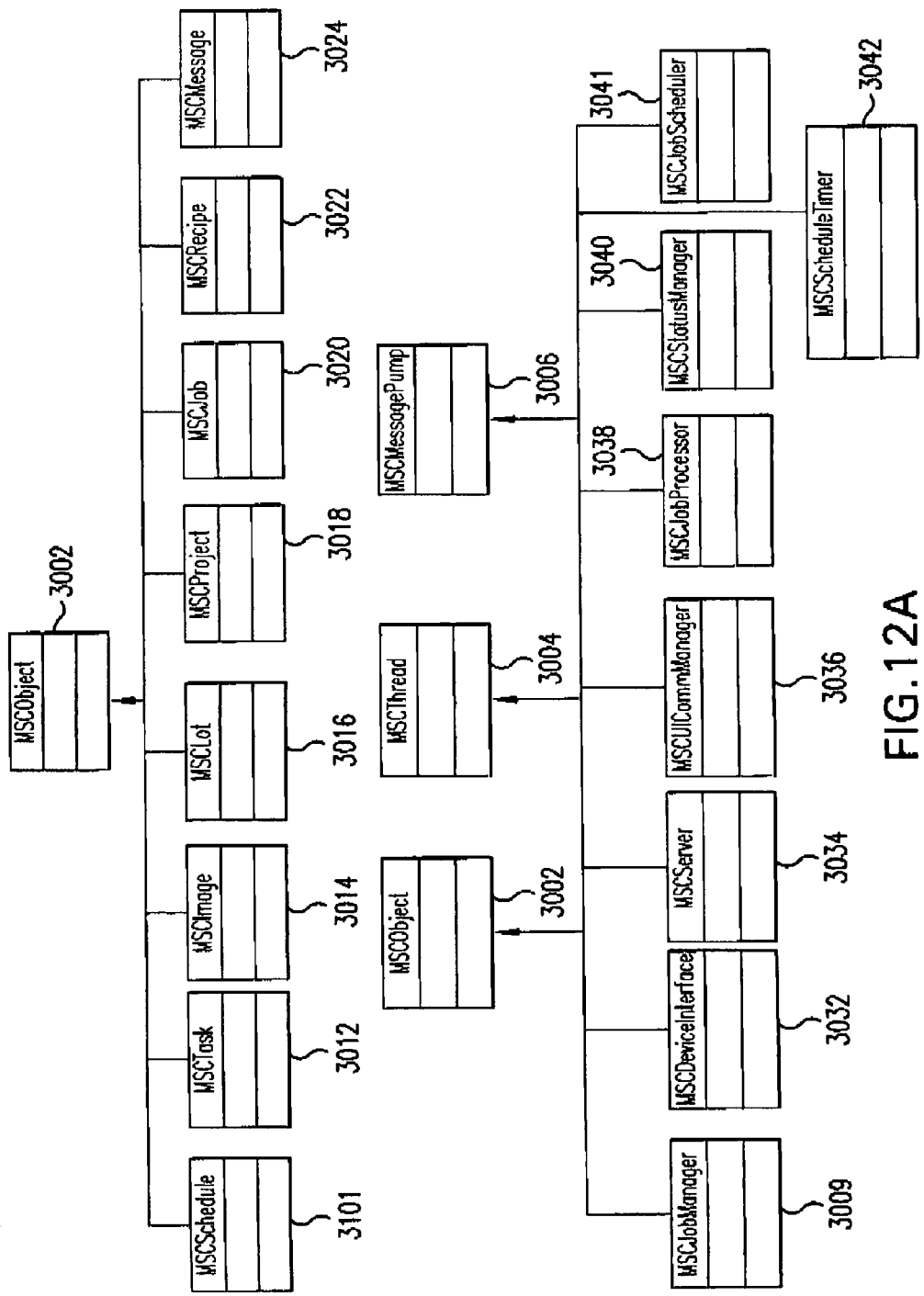
FIGS. 12A and 12B show by way of example in schematic and block diagram form UML diagrams, according to aspects of an embodiment of the disclosed subject matter.

Turning now to FIG. 12A, there is illustrated various organizational hierarchies 3000 and communication links within the MSC 10 server 20, according to aspects of an embodiment of the disclosed subject matter, including an MSCObject module 3002, which is in communication with an MSCSchedule module 3010, an MSCTask module 3012, an MSCImage module 3014, an MSCLot module 3016, an MSCProject module 3018, and MSC Job module 3020, and MSCRecipe module 3022 and an MCSMessage module 3024. There is further shown an illustrative connection of the MSCObject module 3002 and an MSC Thread module 3004 and an MSCMessagePump module 3006 with an MSCJobManager module 3030, an MSCDeviceInterface module 3032, an MSCServer module 3034, an MSCUICommManager module 3036, an MSCJobProcessor module 3038, an MSCStatusmanager module 3040 an MSCJob Scheduler module 3041 and an MSC SchedulerTimer module 3042.

Figure 12B:
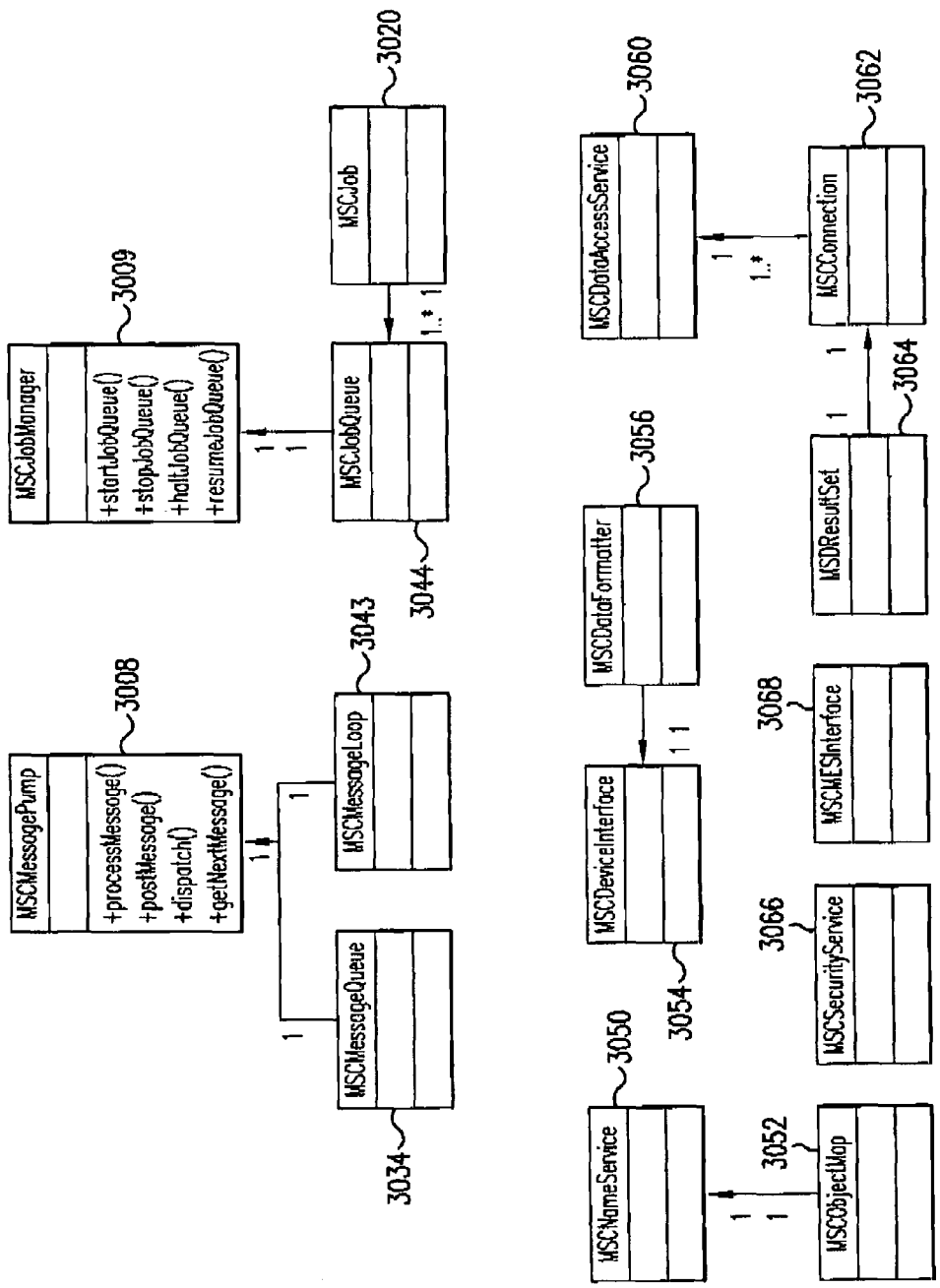

In FIG. 12B there is also illustrated an exemplary connection of an MSCMessagePump module 3008 with illustrative executable commands such as processMessage( ), postMessage( ), dispatch( ) and getNextMessage, and an MSCMessageQueue module 3039 and an MSCMessageLoopmodule 3043, as well as an MSCJobManager module 3009, with executable commands startJobQueue( ), stopJobQueue( ), haltJobQueue( ) and resumeJobQueue( ), in communication with an MSCJobQueue module 3044 and an MSCJob module 3020. Also illustrated is an MSCNameService module 3050 in communication with the an MSCObjectMap module 3052 and an MSC DeviceINerface module 3054 in communication with an MSCDataFormatter 3056 and an MSC DataAccessService module 3060 in communication with an MSCResultsSet module 3064 through an MSCCommunicationn module 3062 along with two stand alone modules, MSC SecurityService module 3066 and MSCMEInterface module 3068.

Figure 13:
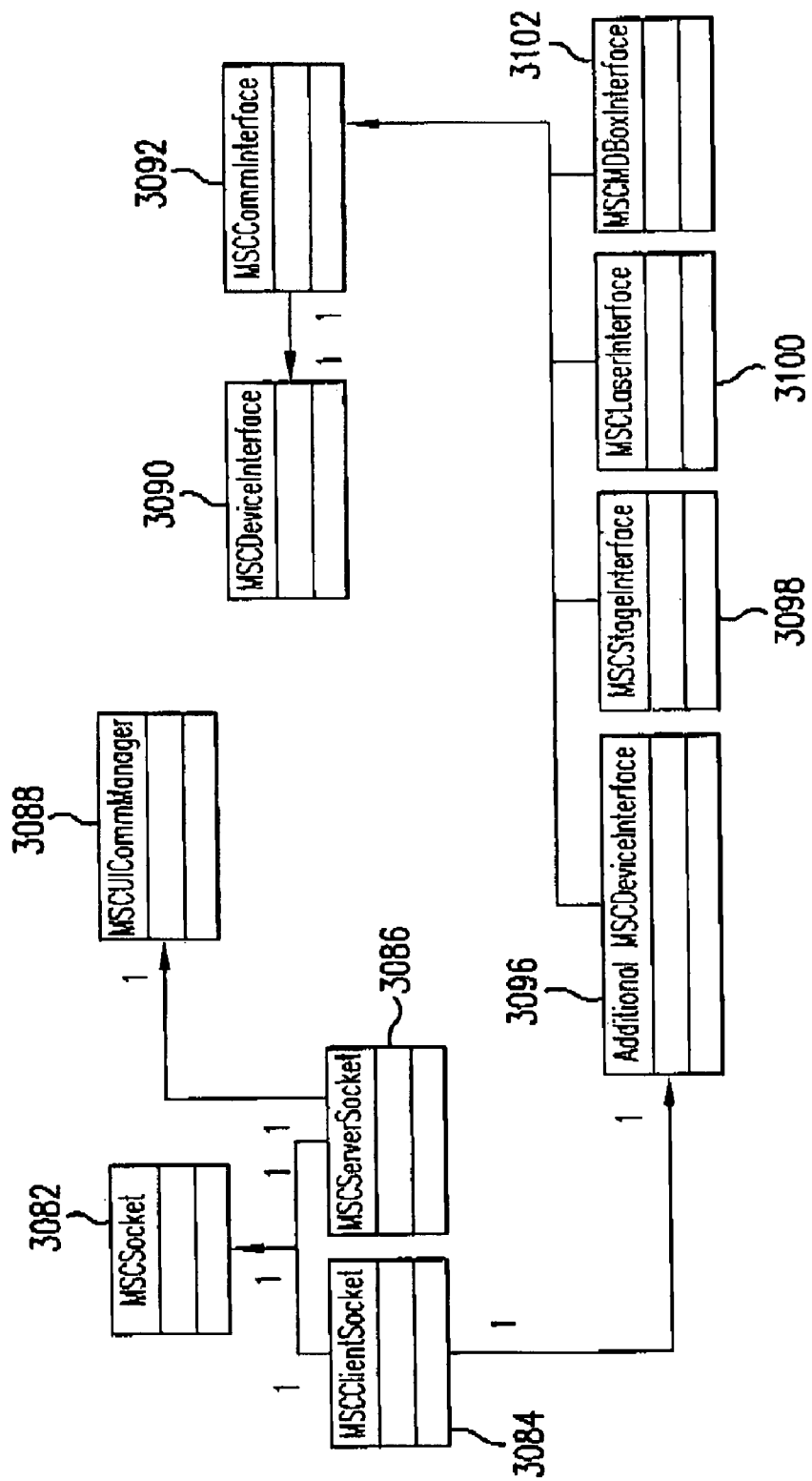
FIG. 13 shows by way of example in schematic and block diagram form a UML diagram, according to aspects of an embodiment of the disclosed subject matter.

FIG. 13 illustrates in block diagram form an example of an MSC 10 server design device interface, according to aspects of an embodiment of the disclosed subject matter showing, e.g., a an MSCSocket module 3082 connected to an MSCUserInterfaceCommunication module 3088 through an MSCServerSocket module 3086 and to an Additional MSCDeviceInterface module 3096 through an MSCClient Socket module 3084. Also shown is an MSCDeviceInterface module 3090 connected to the AdditionalMSCDeviceInterface module 3096, an MSCStageInterface module 3098, an MSCILaserInterface module 3100 and an MSCMDBoxInterface mosule 3102 through an MSCCommINterface module 3092.

Figure 14A:
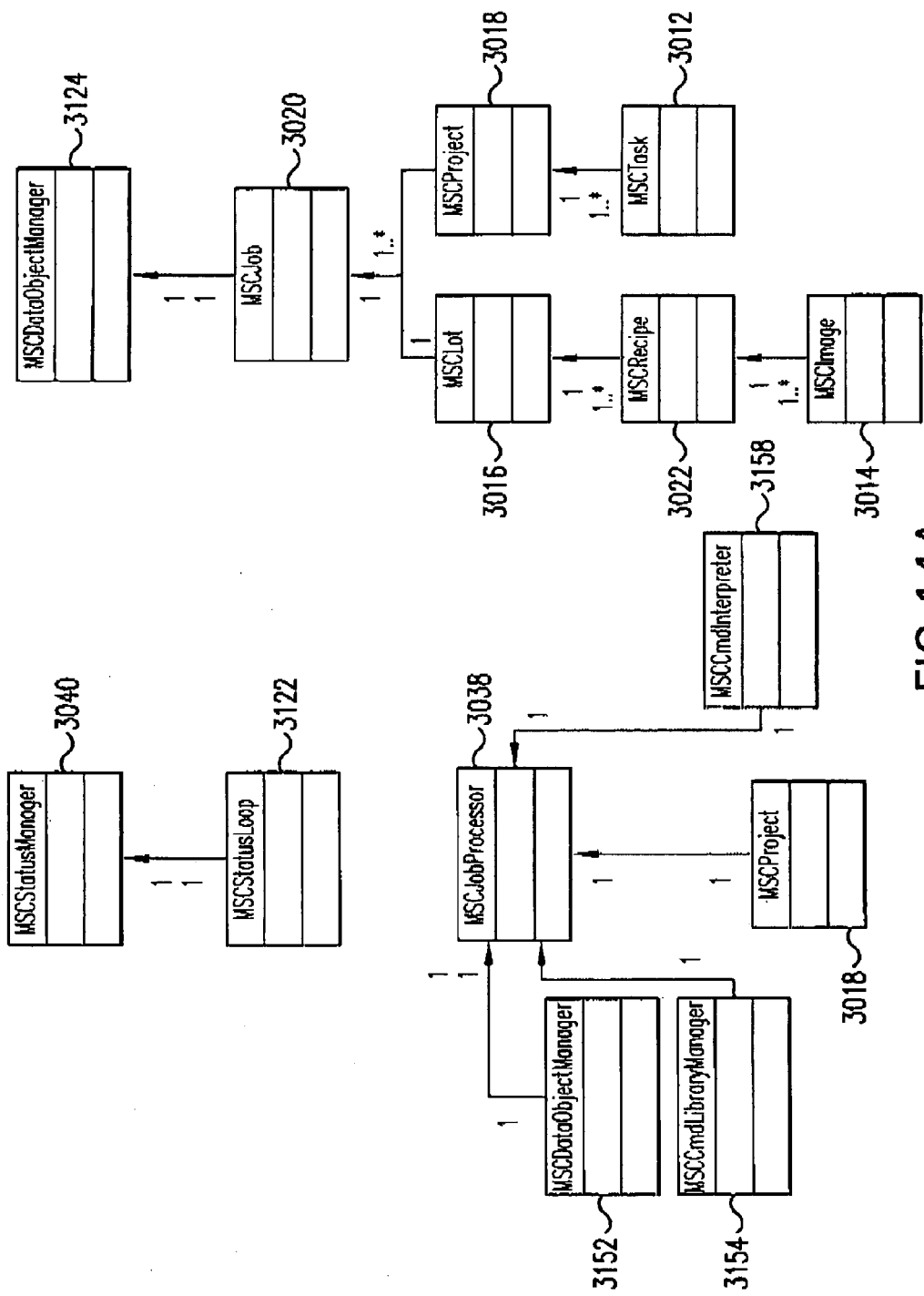
FIGS. 14A and 14B show by way of example in schematic and block diagram form UML class diagrams, according to aspects of an embodiment of the disclosed subject matter.
Figure 14B:
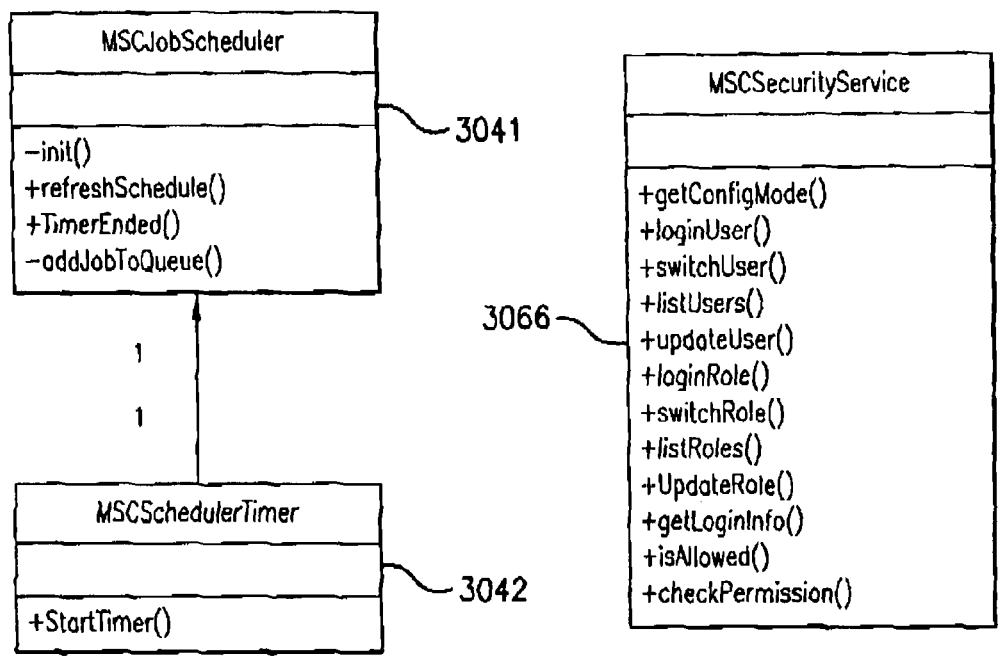

FIG. 14A illustrates in block diagram form an MSC 10 server design Manager Class Interface according to aspects of an embodiment of the disclosed subject matter, including an MSCStatusManager module 3040 communicating with an MSCStatusLoop module 3122. Also shown by way of illustration is an MSCDataObjectManager module 3124 communicating through an MSCJob module 3020 in parallel to the respective serial links, e.g., MSCTask module 3012 and MSCProject module 3018 and MSCImage module 3014, MSCRecipe module 3022 and MSCLot module 3016. Also illustrated is an MSCJobProcessor module 3038 communicating with an MSCDataObjectManager module 3152, an MSCCmdLibraryManager module 3154, an MSCProject module 3018 and an MSCCmdInterpreter module 3158. Also, as shown in FIG. 14B, an MSCJobScheduler module 3041 with such executable commands and information as initialize( ), refreshSchedule( ), timerEnded( ) and addJobToQueue( ), may be in communication with an MSCScheduletimer module 3042 with such executable commands as startTimer( ). Also illustrated is an MSCSecurity Services module with such executable commands and information as getConfigMode( ), login( ), switchUser( ), listUsers( ), updateUser( ), loginRole( ), switchRole( ), listRoles( ), UpdateRole( ), getLogin( ), isallowed( ) and checkPermission( ).

Figure 15:
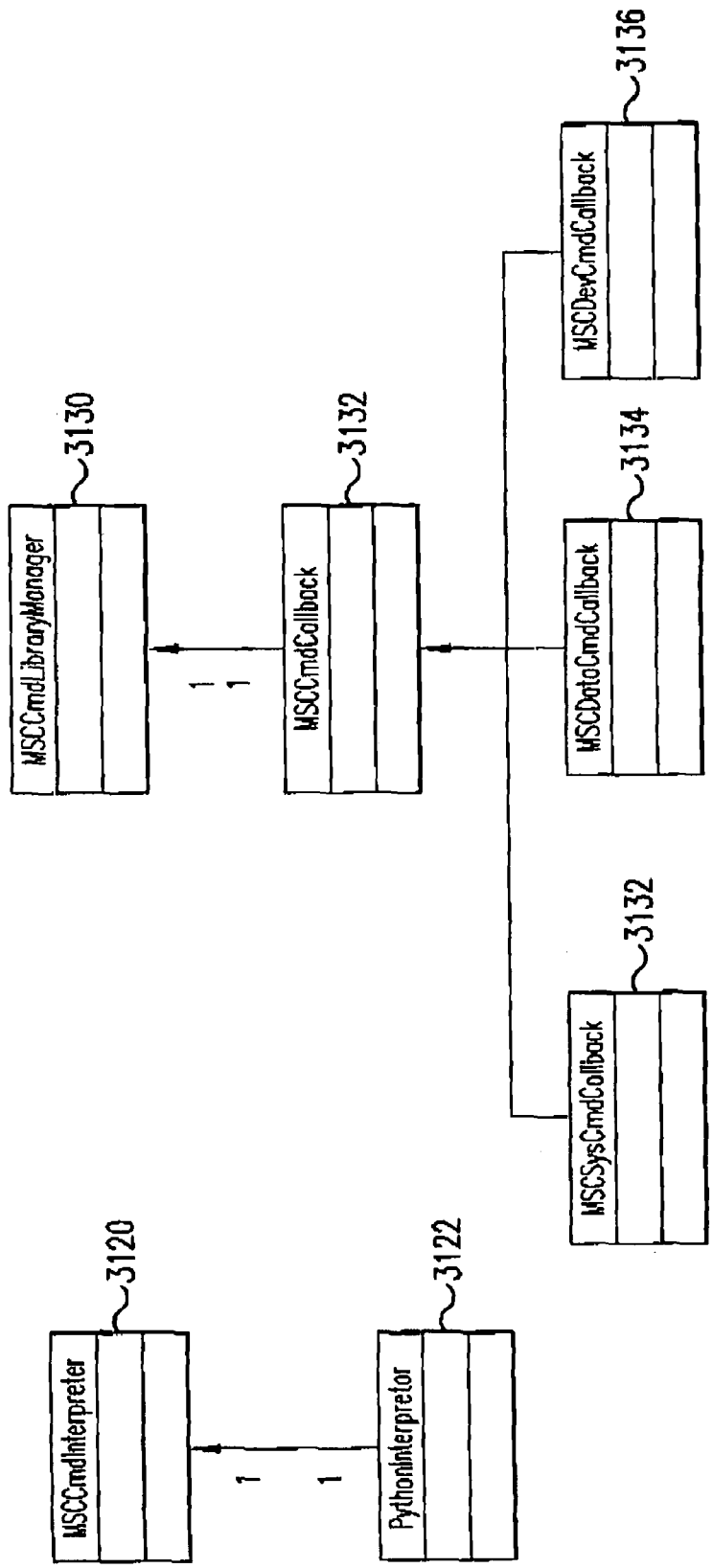
FIG. 15 shows by way of example in schematic and block diagram form UML class diagrams, according to aspects of an embodiment of the disclosed subject matter.

Turning to FIG. 15, there is shown an illustration in block diagram form of an MSC server interpreter interface including, e.g., an MSC CmdInterpreter module 3120 in communication with a PytononInterpreter module 3122 and an MSCCmdLibraryManager module 3130 in communication with an MSCSysCmdCallback module 3132, an MSCDataCmdCallback module 3134 and an MSCDevCmdCallback module 3136 through an MSCCmdCallback module 3132.

Figure 16:
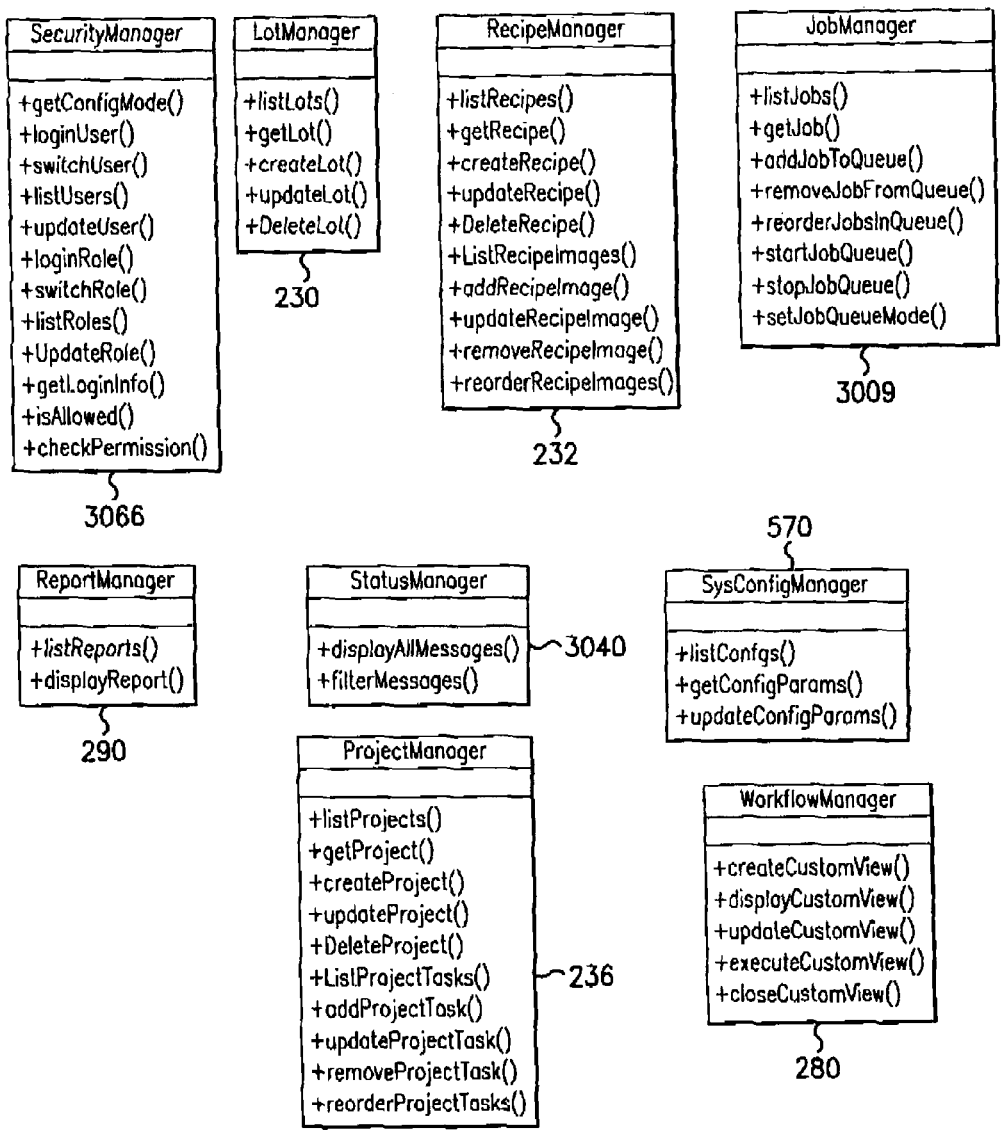
FIG. 16 shows by way of example in schematic and block diagram form UML class diagrams, according to aspects of an embodiment of the disclosed subject matter.

FIG. 16 shows schematically and in block diagram form an example of an MSC GUI design including the following modules containing the listed representative executable commands and information. A Security Manager module 3066 as noted above, a Lot Manager module 230 also shown in FIG. 2 listLots( ), getLot( ), createLot( ), updateLot( ), deleteLot( ); a RecipeManager module 232 (listRecipe( ), getRecipe( ), xcreateRecipe( ) updateRecipe( ) deleteRecipe( ) listRecipeImages( ), addRecipeImage( ), updateRecipeImage( ), removeRecipeImage( ), reorderRecipeImages( ); a JobManager module 3009 (listjobs( ), getJob( ), addJobToQueue( ), removeJobFromQueue( ), reorderJobQueue( ), startJobQueue( ), stopJobQueue( ) and setJobQueueMode( )); a ReportManager module 290 (listReports( ), displayReport( )); a StatusManager module 3040 (displayAllMessages( ), filterMessages( )); a SysConfigManager module 570 (listconfigs( ), getconfig( ), updateConfigParameters( )); a ProjectManager module 236 (listprojects( ), getproject( ), createproject( ), updateproject( ), deleteproject( ), listProjectTasks( ), addProjectTask( ), updateProjectTask( ), removeProjectTask( ), reorderProjectTasks( )), and a WorkfloManager module 280 (createCustomView( ), displayCustom View( ), updateCustomView( ), executeCustomView( ), CustomViewclose( )).

Figure 17:
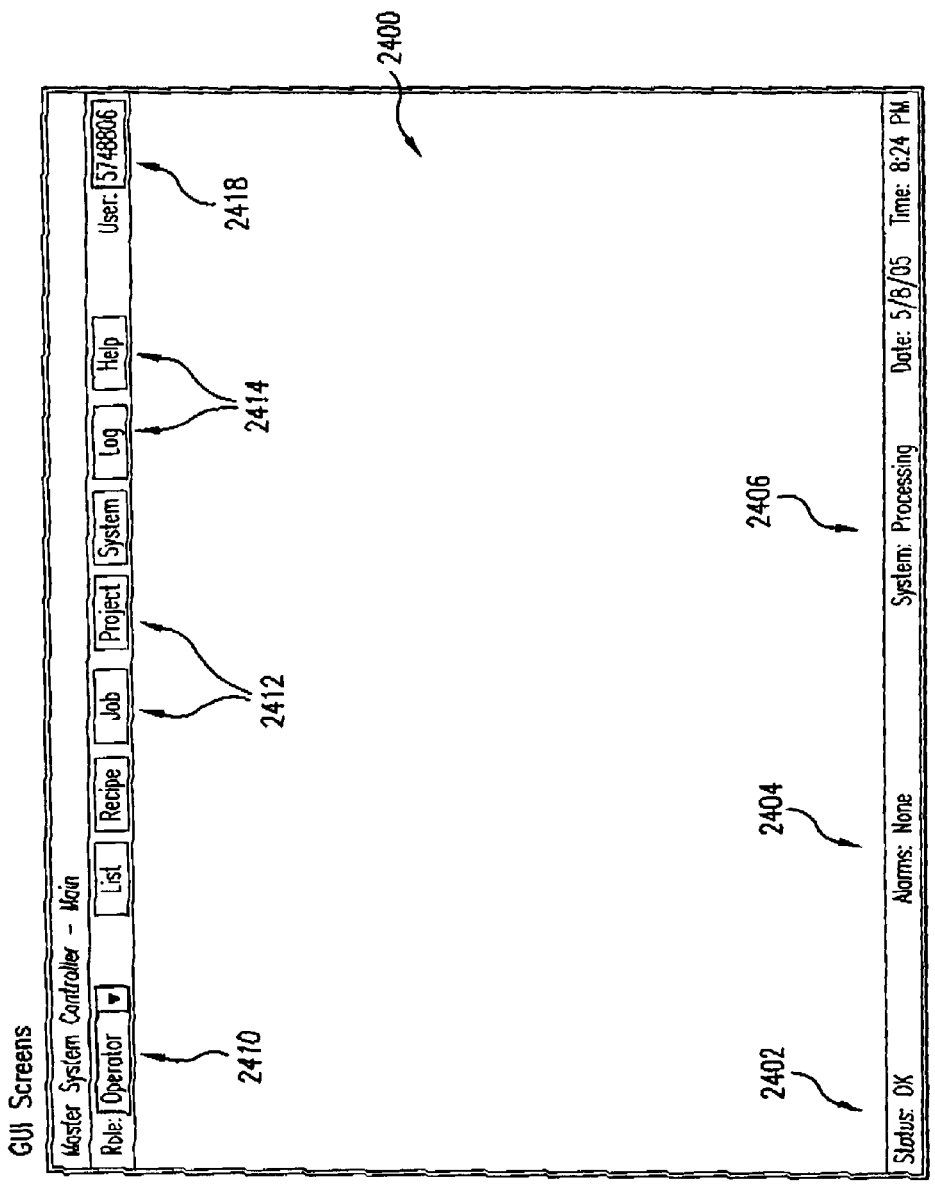
FIG. 17 shows by way of example an illustrative graphical user interface screen which may be utilized according to aspects of an embodiment of the disclosed subject matter.

FIG. 17 shows an illustration of an example of a Graphical User Interface ("GUI") display "Main" screen 2400, which may indicate at locations across the bottom of the screen 2400, in addition to the date and time, a system status 2402, e.g., "OK", as shown, an indication 2404 of "Alarms" currently pending, e.g., "None" as shown, and an indication of the System condition 2406, e.g., "Processing" as shown. across the top are an indication of the role of the person logged in at the time 2410, e.g., Operator as shown and selection button 2412 for the user to get to other displays, e.g., Lot, Recipe, Job, Project, and System, in order of system level hierarchy and also Log and Help function buttons 2414. also displayed in this exemplary "Main" screen is the user ID number 2418. Selecting, e.g., log can get the user to the GUI screen 2160 of FIG. 18, described elsewhere in this application.

Figure 19:
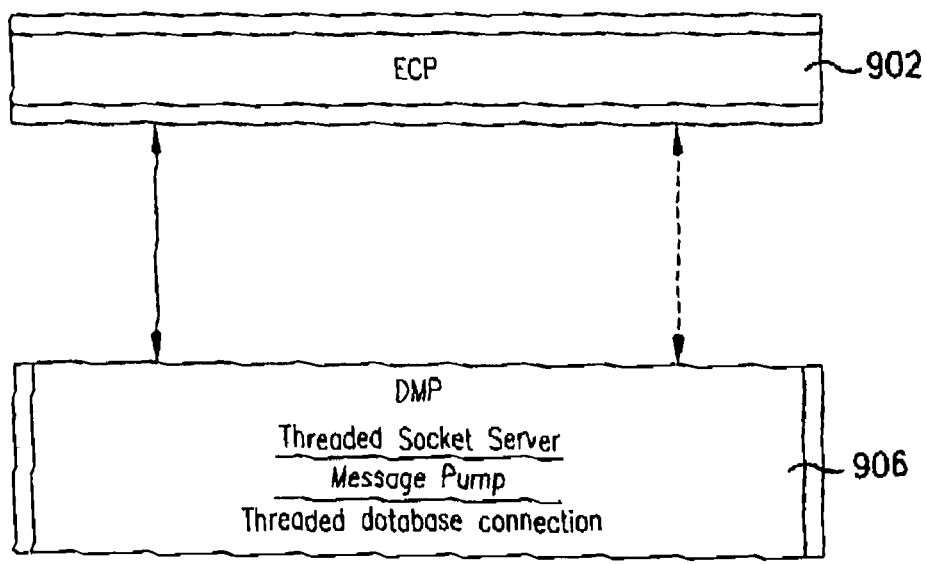
FIG. 19 shows by way of example in schematic and block diagram form a portion of an MSC, according to aspects of an embodiment of the disclosed subject matter.
Figure 21:
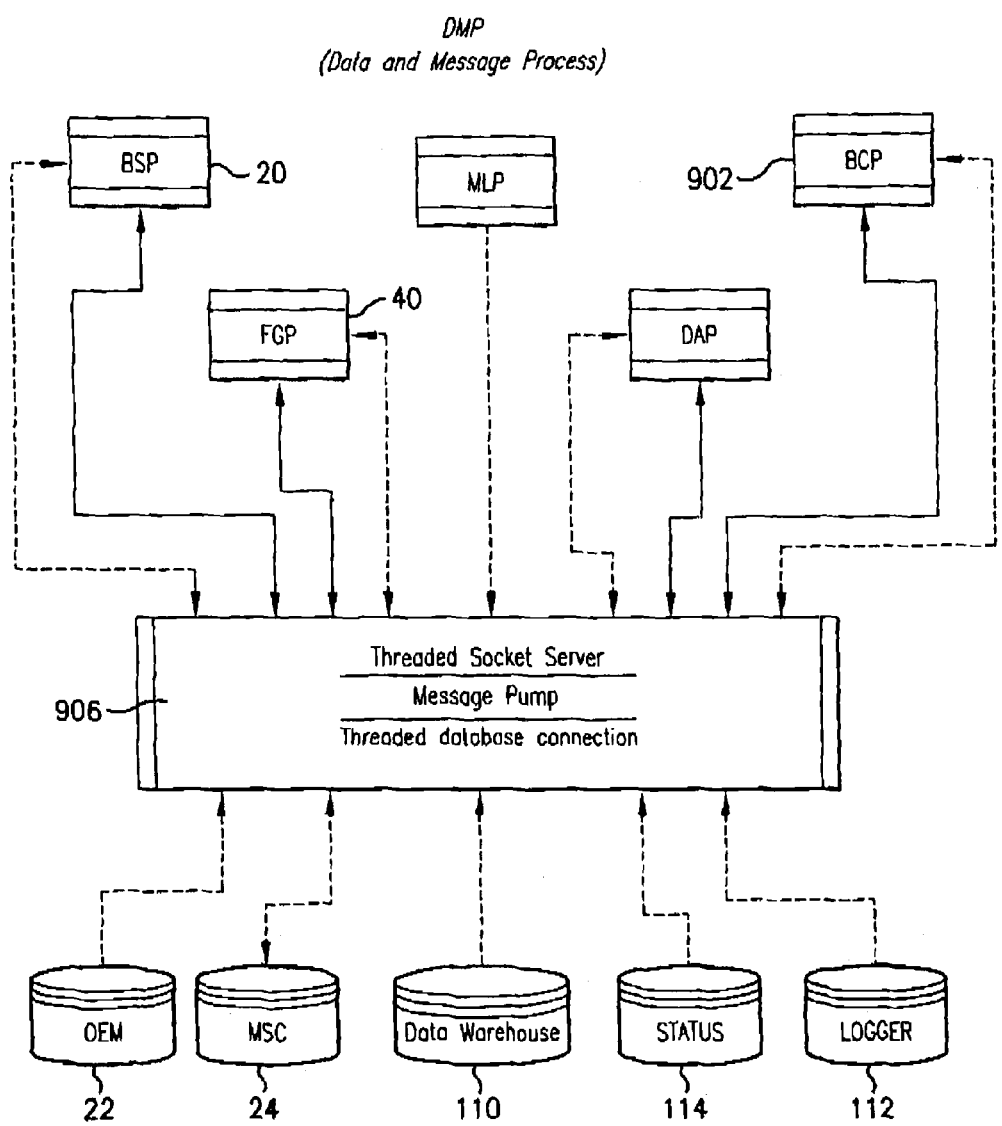
FIG. 21 shows by way of example in schematic and block diagram form a portion of an MSC, according to aspects of an embodiment of the disclosed subject matter.

Turning to FIG. 19 there is illustrated in schematic and block diagram form a connection of the external communication process ("ECP") 902 to the data and message process ("DMP") 906, with a threaded socket server, a message pump and a threaded database connection, e.g., to either or both of the front end GUI process 40 or the backend server process 20.

FIG. 20 A illustrates code implementing a device abstraction natural language format ("NLF") to device format ("DF") in, e.g., python laser class or python task script. Similarly in FIG. 20B is shown such code in PostgreSQL.

According to aspects of an embodiment of the disclosed subject matter Master System Controller (MSC) software can function as a master system controller to control the hardware components of an TCZ 900X apparatus/workpiece processing tool. Using the MSC software, process engineers can define recipes and projects, execute jobs to process silicon substrates and monitor machine performance and the like.

Figure 43A:
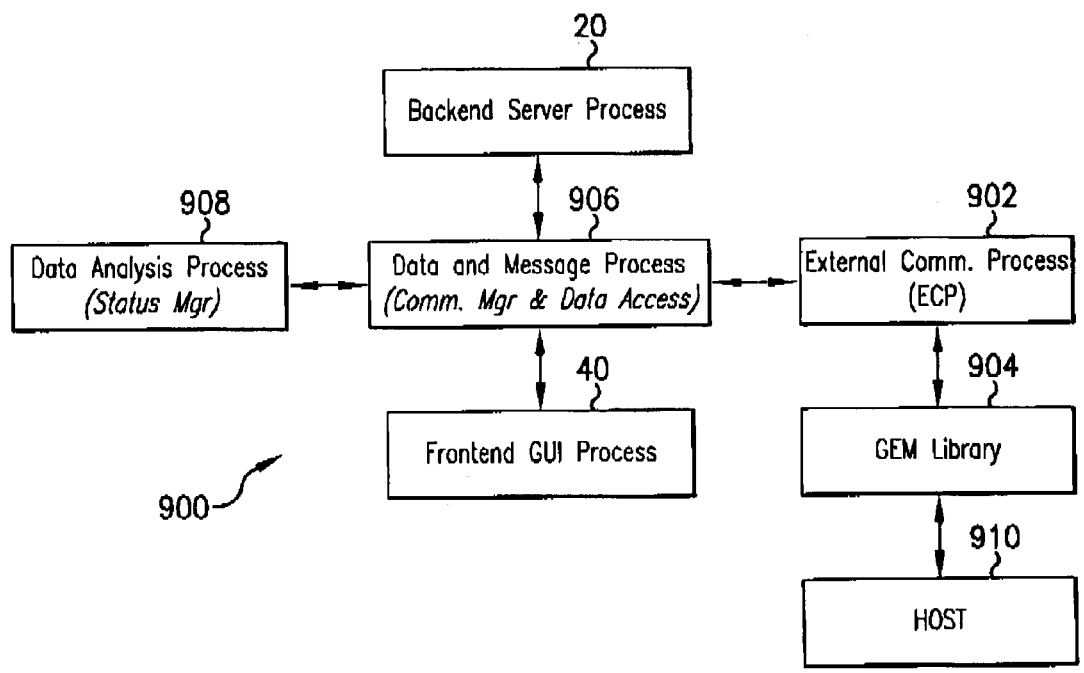
FIGS. 43A-C shows by way of example in schematic and block diagram form a portion of an MSC, according to aspects of an embodiment of the disclosed subject matter.
Figure 43B:
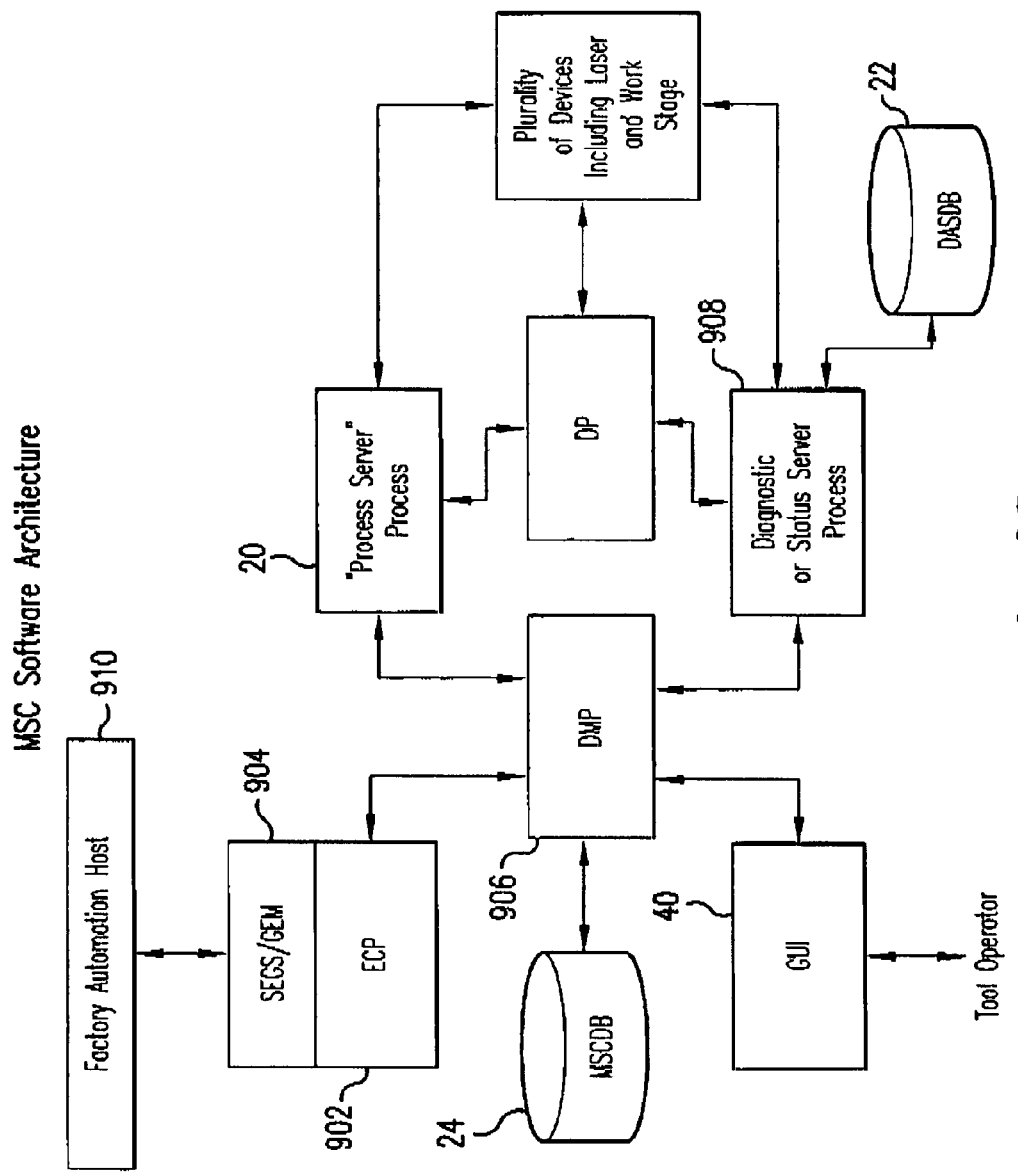
Figure 43C:
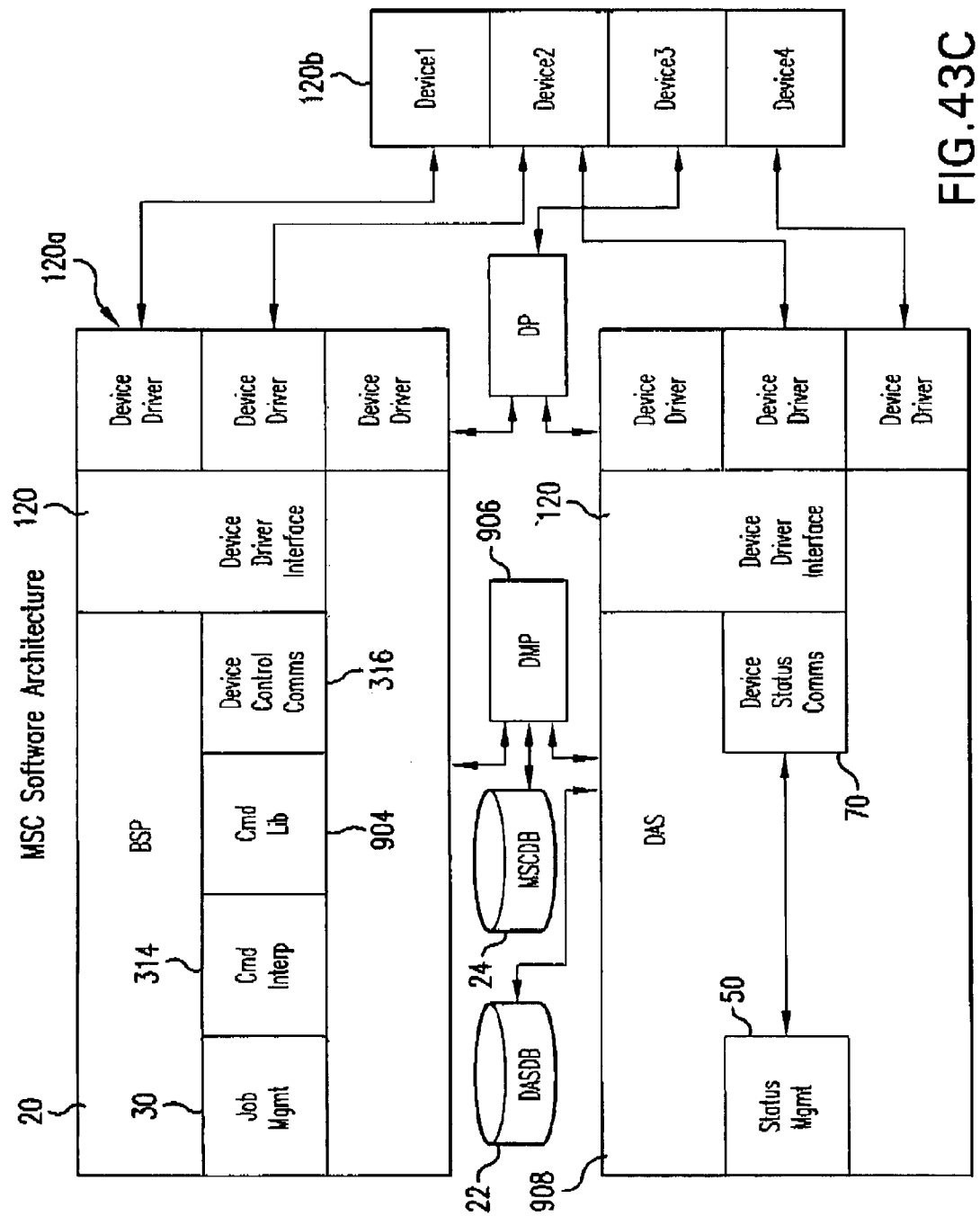
Figure 44:
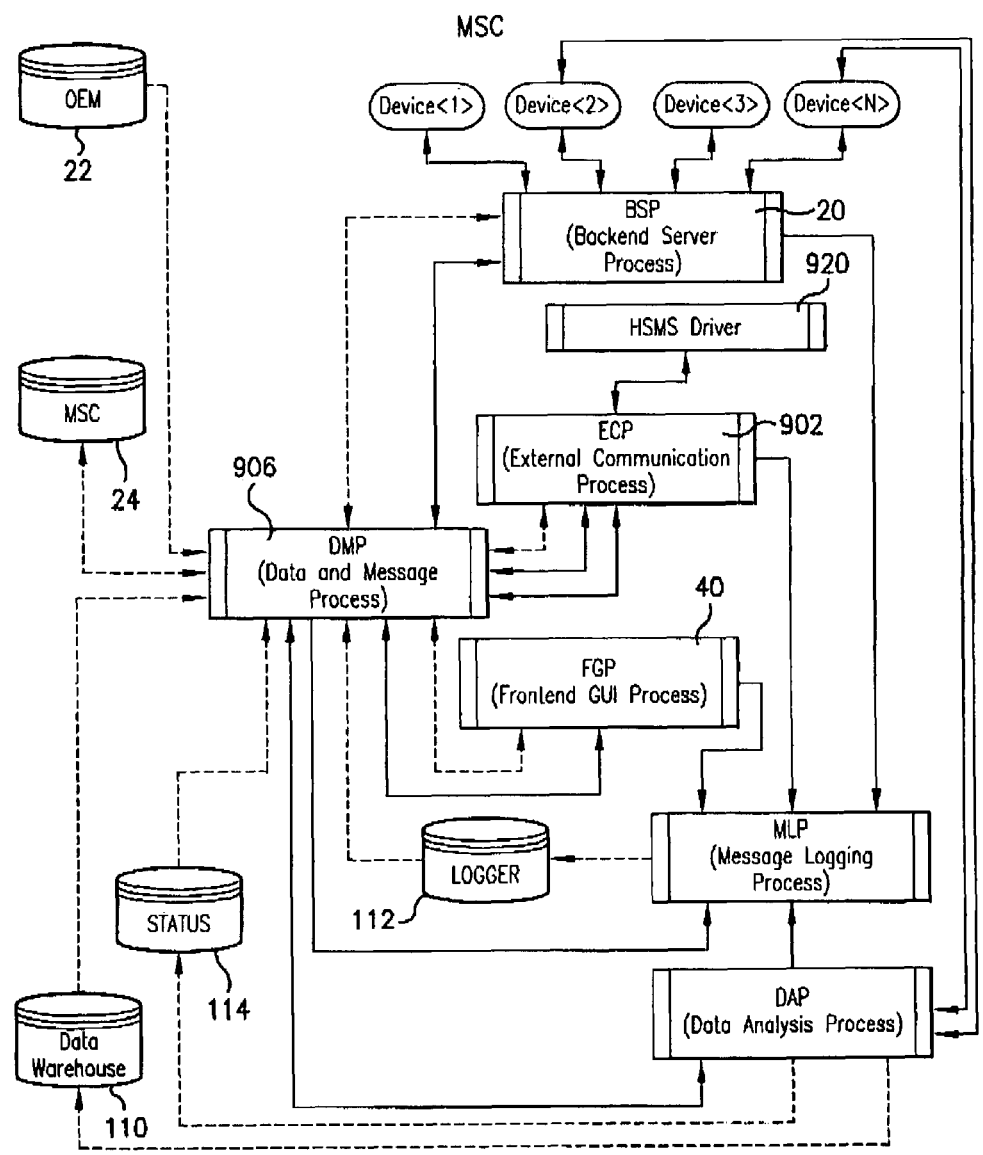
FIG. 44 shows by way of example in schematic and block diagram form a portion of an MSC, according to aspects of an embodiment of the disclosed subject matter.

Turning now to FIGS. 43A-C there is shown in block diagram and schematic form a system controller, such as system controller MSC 10 of FIG. 7 according to aspects of an embodiment of the disclosed subject matter. A host 910, such as a factory automation host may be connected to an external communication processor ("ECP") 902, e.g., through a GEM library 904. A data and message processor ("DMP") 906 may be connected to the ECP 902 and to a GUI interface 40 to a tool operator. The DMP 906 may also be connected to the back end service processor ("BSP") 20 and to a diagnostic data analysis processor ("DAS") 908, which may also communicate with the OEM database 22 and with devices 120b, e.g., through a device driver interface 120 and device drivers 120a (shown in FIG. 43C). The BSP 20 may also communicate with devices 120b through device interfaces 120 and device drivers 120a (shown in FIG. 43C). A device processor may communicate also with the devices directly or through the DAS 908 or BSP 20, through the device drivers as shown in FIG. 43C.

The daemon process backend server process ("BSP") 650 can issue device commands and check device status. The graphical user interface front-end GUI process ("FGP") 40 can allow users to interact with the system, e.g., to define recipes and execute jobs. A daemon process data and message process ("DMP 906") that can route messages between the processes and serve as a conduit for database access. A daemon process data acquisition server process ("DAS") can collect status and data from devices, store the information, and provide it to other processes. A daemon process message logging process ("MLP") that can receive information from other processes and log it in a text form. A daemon process external communication process ("ECP") that can handle external communication, such as a manufacturing execution system ("MES 80") interface.

In using a database to store its data persistently, the MSC 10 can use a database with a plurality of schemas, e.g., five schemas—an OEM read-only schema that contains system specific information; an MSC read-write schema that can contain user specific information; a data warehouse 110 read-only schema that can contain device data; a status read-only schema that can contain device status and a logger 112 read-only schema that can contain log data generated by the system. According to aspects of an embodiment of the disclosed subject matter, the MSC architecture can include the server, communication, user interface and database aspects of the system. The software may include, a number of functionalities, e.g., import/export; module concept (lifetime counters); substrate concept; workflow, e.g., with custom project screens; project scheduling; user configurable status tabs, with visual indications/colors; graphical and textual representations of the cassette; runtime parameters for project/lot; MES Interface using SEMI SECS/GEM standards; security and access control; and finer error handling, and upgradeability (versioning, etc.)

The above high-level features can serve to satisfy certain system requirements, e.g., import/export of recipes/images/projects in file format, with copy/paste of projects/lots; hierarchical organization of recipes; improved consistency checks for recipe/image parameters; access control of parameters (e.g., who can change them, etc.); dependencies among parameters; null recipes; hierarchical organization of recipes; lot definition according to cassette station number, operator ID, substrate ID, etc.; a need a substrate concept, an introduce module concept that is flexible and generic, an ability to monitor modules, as opposed to just devices; screens for module replacement; flexible and generic mechanisms for lifetime counters; display maintenance counters in status tabs as value and text; custom project screens for diagnosis, download and control; project reporting, scheduling with a folder/file structure; project scheduling event and schedule based; idle timeout for job queue; changing of workpiece position, e.g., rotation of the glass substrate with accompanying changes to crystallization graphics; additional recipe processing status info; graphical representation of the cassette; runtime parameters for the lot and project when added to the job queue; security and access control; encoded scripts to protect user intellectual property; interfaces with devices using serial numbers to identify a device; control of apparatus components, e.g., a robot for cassette loading/unloading; user configurable status tabs; finer error handling; crash recovery handling for, e.g., a missing or out of specification pulse; colored status tabs and entries; integration with customer MES 80 using SEMI SECS/GEM Interfaces; upgradeability and performance metrics.

Below are shown exemplary features and components to which they can be applied.

| | |
|---|---|
| Import/Export: | GUI - Recipe Management; GUI - Project Management; |
| Hierarchical Organization of Recipes: | GUI - Recipe Management; |
| Module Concept (Lifetime Counters): | GUI - System Configuration Management; GUI - Report Management; |
| Substrate Concept: | GUI - Lot Management; |
| Workflow with Custom Project Screens: | GUI - Project Management; GUI - Workflow Engine GUI - Report Management; |
| Project Scheduling: | Server - Project Scheduling; |
| User Configurable Status Tabs - Visual Indication/Colors: | Server - Status Management; GUI - Process Management; GUI - Event Management; |
| Graphical and Textual Representation Of Casette: | Server - Job Processing; GUI - Process Management; |
| Runtime Parameters for Project/Lot: | GUI - Process Management; |
| Security and Access Control: | GUI - Security Management; |
| Improved Error Handling: | Server - Job Processing; GUI - Process Management; |
| MES Interface: | Server - MES Interface. |

According to aspects of an embodiment of the disclosed subject matter an exemplary low level design of the MSC 10 may be described using class diagrams for exemplary components of the system. The following discusses an exemplary list of hierarchy of components (from lowest to highest) which may be in an MSC server 20 according to aspects of an embodiment of the disclosed subject matter.

A Core Objects component may contain mostly data object classes common to all components in the MSC server 20, which data object classes may be configured to have no logic and to just contain data. In most cases, the data is also public so that any component can access the data in such data objects. The following exemplary classes may be a part of the Core Objects component:

MSCObject, which may be the most notable class in this component, and the preferred base class for all other major classes in the MSC 10. Behavior common to all classes in MSC 10 can be implemented in this class. The majority of classes in the MSC 10 may derive from the MSCObject class, including: MSCAtom, which may be a multiple data type holder that may use a union to store any type of data integer, real, string, boolean or object data types; MSCConstants, which may provide a namespace for constants used throughout all server components; MSCPair, which may simplify using a pair of strings in standard container collections; MSCException, which may be a base exception class in the MSC server 20, from which all application specific exception classes may be expected to derive; MSCUtils, which may contain string and other miscellaneous utility methods to be used by all components; MSCImage, which may be a data object class for images and may contain image parameters; MSCRecipe, which may be a data object class for recipes containing recipe parameters and a list of images for each recipe; MSCLot, which may be a data object class for lots, and contain lot parameters and a list of recipes applicable to a lot; MSCTask, which may be a data object class for tasks in projects and contain task parameters, body and runtime parameters, e.g., in Python script, corresponding to the task; MSCProject, which may be a data object class for projects, and may contain project parameters and a list of tasks; MSC-Job, which may be a data object class for jobs and may contain the name of the lot/project and the job status; MSCStatus-Check, which may be a data object class that contains status check information for a device parameter, and may be used by a status loop to check the status of a device parameter; MSCStatusData, which may be a data object class that contains all the status checks for a device parameter, and may be used by a status loop to check if a device status is an error, warning or other operational information; MSCStatusCommand, which may be a data object class that contains the name of a status command and its associated input and may also return argument parameter names, and may be used by a status loop to determine device and system status.

According to aspects of an embodiment of the disclosed subject matter a ThreadService component may be a component that provides high level threading and synchronization facilities in the MSC Server 20, while using threads, may include the following exemplary classes (1) MSCThread, may be an abstract base class that can be inherited by any class needing a new thread of execution. The inheriting class may then implement the MSCThread's abstract run( ) method. To start the thread execution, the MSC may call the MSCThread's start( ) method, which can in turn invoke the run( ) method. The class can wrap commonly used thread management application programming interface ("API"). Other features of pthreads mutex and condition variables may have their own wrapper classes. (2) MSCMutex may be a class that can encapsulate a pthread's mutex providing a mechanism to lock and unlock objects and make objects thread safe. (3) MSCLockableObject may be a class that provides a mechanism for objects to be thread safe and, e.g., thread safe objects may need to derive from this class. (4) MSCSingleLock may be a wrapper class using MSCLockabaleObject to allow synchronized access to multi-threaded code. This class may be used by a MSCLockableObject to synchronize methods on an abject level. Nested use of the MSCSingleLock may be allowed as the MSCLockableObject object uses a recursive mutex. (5) MSCWaitCondition may be a class that implements a pthread's condition variable to notify a waiting thread, using its wait( ) and notify( ) methods called with the mutex already locked. The mutex may then be automatically released when the wait( ) may be called and may also be automatically reacquired when notify( ) method wakes up the waiting thread. This class may be used by MSCMsgPumps to notify waiting MSCMsgPumps.

According to aspects of an embodiment of the disclosed subject matter a System Utilities component may provide common utilities used by all components such as utilities for system wide logging and retrieving system configuration information. The following exemplary classes may be a part of this component.

(1) MSCIniFileHandler may provide utility methods to handle configuration files, which methods in this class may be global and may serve to load configuration parameters from a server configuration file. The parameters may be specified as option=value pairs, with one specification per line. Blank lines and comment lines may also be allowed. (2) MSCLog may provide logging facilities and may define various error levels and the severity of messages as defined in MSCConstants class.

According to aspects of an embodiment of the disclosed subject matter a NamingService component may provide object discovery facilities in the MSC server 10, and may include the following class. MSCNamingService may be a service class that provides object discovery in the MSC server 20. Objects may be stored in the naming service by one component and then be used by other components. Since this is a service, it may be multi-threaded and thread safe.

According to aspects of an embodiment of the disclosed subject matter a MessageService component may facilitate communication among major components in the MSC server 20, and may include the following classes. (1) MSCMessage may be a class that contains message information used to communicate among MSC server components by storing a string in a message. (2) MSCMessagePump may be a class that implements a mechanism to fetch messages from the message queue and to dispatch them to the server components. (3) MSCMessageQueue may be a class that includes a First-In-First-Out (FIFO) container for messages used to communicate among server components, and may be used by MSCMessagePump to store and retrieve messages.

According to aspects of an embodiment of the disclosed subject matter a DataAccessService component that may provide a high level abstraction layer for data access in the MSC server 20. The database server 20 used for the TCZ 900X database in MSC (with OEM and MSC schemas) may be PostgreSQL. The libpqpp package may be used for the high level C++ API to the database. The following exemplary classes may be a part of this component. (1) MSCDataAccessService may provide a high level database abstraction layer hiding the underlying details of the actual database used in MSC. (2) MSCConnection may be a class that implements a connection interface to the database to connect to the database if a connection may be not already open, and which can be used to execute queries including transaction based queries with reference cursors. (3) MSCResultSet may be a class that holds the results returned by executing a query on the database, which can be retrieved from this class as strings.

According to aspects of an embodiment of the disclosed subject matter a SecurityService component may provides the security and access control services in the server layer.

According to aspects of an embodiment of the disclosed subject matter, a DataFormatter component may be a component that provides utility methods to convert device commands from Neutral Language Format (NLF) to Device Format (DF) and back. The following exemplary class may be a part of this component. MSCDataFormatter may be a class that converts device commands and responses back and forth between Neutral Language Format (NLF) and Device Format (DF). The MSC 10 may use Neutral Language Format thereby providing a uniform language format to communicate with various types of devices in the ICE9 system.

According to aspects of an embodiment of the disclosed subject matter a DeviceDrivers component may contain device drivers for various devices connected to MSC 10. Device driver classes in this component may implement the methods in abstract base class: MSCCommInterface. The device drivers may be dynamic shared libraries so that additional devices can be added without recompiling the MSC 10 operating code. If a command exists for a device to, e.g., retrieve its serial number, the device may retrieve the serial number and use it to identify the device in a message logging the device and/or in device status reporting. The following exemplary class may be a part of this component. MSCCommInterface may be a class that provides a standard API to be used by all device drivers used to communicate with the physical devices. The MSC 10 may use this abstract class to uniformly communicate with various devices, independent of the protocol used: TCP/IP sockets, USB, CORBA etc.

According to aspects of an embodiment of the disclosed subject matter a DeviceInterface component may be utilized, which may include one or more instances of this component that may be used to communicate with physical or logical devices in the ICE9 laser annealing apparatus, and also may provide a high level abstraction for communication between devices and the MSC server 20. Communication to devices from within the MSC server 20 may be done using Neutral Language Format (NLF). The NLF commands may be converted into Device Format (DF) specific to each device before they are sent to the device. The following exemplary classes may be part of the DeviceInterface component. (1) MSCDeviceInterface may be a class that provides a high level API for MSC 10 to communicate with devices. There may be one instance of this class for every connection to a physical or logical device attached to MSC 10. This class may communicate with the respective device by loading a device driver conforming to the MSCCommInterface abstract class. The MSCDeviceInterface may also serialize multiple communication requests to the device. After loading the device driver, this class may first call the init( ) method followed by multiple set( ) methods to set the device parameters. Then the MSCDeviceInterface may call the open( ) method followed by multiple write( ) and read( ) calls. Finally the MSCDeviceInterface may call the close( ) method. (2) MSCDevice InterfaceDAO may be a class that is a data access helper class for the MSCDeviceInterface, which may make calls to a database from the DeviceInterface component from this class. (3) MSCSocket may be a class that contains a generic TCP/IP socket implementation with wrapper methods for low-level socket communication. (4) MSCServerSocket may be a class that uses the MSCSocket class to implement the server side TCP/IP socket connections. (5) MSCClientSocket may be a class that uses the MSCSocket class to implement the client side TCP/IP socket connections.

According to aspects of an embodiment of the disclosed subject matter, a UserInterfaceCommunication component may be used to facilitate communication between the MSC server 20 and GUI 40. Depending on the purpose of communication, e.g., for control or for reporting status, two instances of this component may be used in MSC server 20, i.e., UIControlCommManager used for control messages and UIStatusCommManager used for status messages. Control messages may go in and out of the MSC server 20, i.e., can be bi-directional. Status messages may only go out of server 20. They may therefore be unidirectional. In both cases, the sever waits for the GUI 40 to initiate the communication connection request. The following exemplary classes may be a part of this component.

(1) MSCUICommManager may be a communication interface between the GUI 40 and the server 20, which may use TCP/IP sockets to communicate with the GUI 40, and may be used to send both control and diagnostics messages to the GUI 40. When the connection may be initially established from the GUI 40, the server 20 may authenticate the connection by requesting the GUI 40 to send identifying information, e.g., the user ID and/or encrypted password, and, if authentication fails, the server 20 may terminate the connection. (2) MSCUIMessageListener may be a class that may be used to receive control messages from the GUI 40 created and managed by the MSCUICommManager 540, 560. This class may run in a worker thread so that its host component thread does not get blocked while this thread may be waiting to receive messages from the GUI 40. (3) MSCUIMessageTranslator, may be a class that translates client side messages to server codes and vice versa, and needs to be thread-safe because both UICommManager 370, 370' and UIMessageListener can call it.

According to aspects of an embodiment of the disclosed subject matter a StatusManager 350 component may monitor the status of all devices, and also log status messages in MSC server 20. The following exemplary classes may be a part of this component. (1) MSCStatusManager may be a class that logs status messages received from anywhere in the system 10. It may also create and manage a status loop to continuously poll devices for their status, and if a fatal error is detected notify the MSCJobManager 310 class. (2) MSCStatusManagerDAO may be a class that acts as a data access helper class for MSCStatusManager 350. Calls to a database from the MSCStatusManager class may be made from this class. (3) MSCStatusLoop may be a class that polls devices that continuously polls devices for their status. The MSCStatusLoop may monitor the devices for fatal or error status indications. The MSCStatusLoop, may also retrieve values for certain parameters from the devices and post them to the GUI 40. The MSCStatusLoop can also run system commands to check if lifetime counters and other system or device parameters have exceeded their thresholds, and if so, may also get the GUI 40 to perform one of the following requested actions pop up one or more selected dialog box(es), display an error or warning message in the form of an icon and/or perform a custom action using a script. The following exemplary commands from a database may be run by the status loop to determine device and system status.

TellSystem <System Command and Args> <System Command Results>

TellDevice <DeviceName with Device Command and Args> <Device Command Results>

DeriveStatus <Input Param Names> <Derived Param Name>

(4) MSCStatusLoopDAO may be a class that may be the data access helper class for MSCStatusLoop, with calls to a database from the MSCStatusLoop class being made from this class.

According to aspects of an embodiment of the disclosed subject matter a Job Processor component 312 may be a component that constitutes the workhorse of MSC server 20. The JobProcessor component 312 may execute jobs using a command interpreter like Python with command callbacks from the command library manager 316. The command callbacks may be categorized into three groups, (1) Device commands for communication with devices, (2) Data commands for data transfer with the MSC 10 and (3) System commands for communicating with the MSC 10. The data object manager 320 may facilitate the implementation of data commands. The following exemplary classes may be a part of this component. (1) MSCJobProcessor 312 may be a class that executes jobs using a Python interpreter, and also provides callbacks from a Python scripting engine using the MSCCommandLibraryManager 316. The MSCJobProcessor may decode encoded scripts retrieved from the MSC schema database 24. (2) MSCCommandLibraryManager may be a class that contains callbacks for the Python Scripting engine, which may be classified into three groups (1) device callbacks, (2) data callbacks, and (3) system callbacks. Device callbacks can provide communication with the devices. Data callbacks can allow retrieval of data for system, device and recipe parameters. System callbacks can e.g., provide message logging and system control functionality.

The following exemplary command callbacks may be supported from Python script:

TellDevice <DeviceName> <DeviceCommand> <Command Arg>

TellSystem <SystemCommand> <CommandArg>
GetValue <GetParamName>
PutValue <SetParamName> <SetParamValue>
LogMessage <DeviceName> <MessageSeverity> <MessageText>
LogParameter <ParamName> <ParamValue>
RunProcedure <ProcName> <ProcType> <ProcArg>.
<DeviceName> is the name of the device to send the device command. <DeviceCommand> is the device command in Neutral Language Format (NLF). The command, e.g., "GetConnectStatus" can be sent to any device. The response can be one of the two values, e.g., "OK" (if the device is currently connected) and "NOK" (if failed to connect to the device).
<SystemCommand> may be one of the following (1) StartStatusLoop, (2)
StopStatusLoop. <GetParamName> may be one of the following (1)
Data.<UserParamName>, (2) Device.<DeviceName>.<DeviceParamName>, (3)
Module.<ModuleName>.<ModuleParamName>, (4)
Component.<ModuleName>.<ComponentName>.<ComponentParamName>, (5)
System.<SysParamName>, (6) Task.Name, (7) Task.<TaskParamName>, (8)
Lot.Name, (9) Lot.FirstRecipe, (10) Lot.NextRecipe, (11) Recipe.Name (12)
Recipe.FirstImage, (13) Recipe.NextImage, (14) Recipe.<RecipeParamName>, (15)
Image.Name, (16) Image.<ImageParamName>
<SetParamName> may be one of the following (1) Data.<UserParamName>, (2) System.<SysParamName>, (3) Module.<ModuleName>.<ModuleParamName>, (4) Component.<ModuleName>.<ComponentName>.<ComponentParamName>.
<MessageSeverity> may be one of the following (1) "Fatal", (2) "Error", (3) "Warning", (4) "Info". <ParamName> may be the same as the <GetParamName>. <ProcName> may be the name of a stored procedure in the MSC Schema database 24 of TCZ 900X database. <ProcType> may specify the type of result set returned by the stored procedure call "0"—for normal result set and "1"—for reference cursor based result set.

(3) MSCCommandInterpreter may be a wrapper class for the Python command interpreter 314, which may load and execute Python scripts.

Lifetime counters of components in modules can be consistently updated by using modularized Python scripts that can encapsulate logic for updating the counters. The Python scripts can access lifetime counters or any other Module information by using the GetValue and SetValue commands and passing Module.<ModuleName>.<ModuleParamName> or Component.<ModuleName>.<ComponentName>.<ComponentParamName> as arguments. To support improved error handling, the Python scripts can catch exceptions and resume execution at the next image or next recipe instead of continuing just with the next lot.

(4) MSCDataObjectManager may be a class that implements the data retrieval capabilities provided by the Data callbacks defined in MSCCommandLibraryManager. It allows retrieval of system, device, project, lot, task, lot and recipe parameters. It allows setting and retrieval of user defined parameters from Python script.

Job Manager 30 may be a component which may be a gatekeeper of the MSC server 20, which may respond to the control messages from the GUI 40 and control job execution. The following classes may be part of this component. (1) MSCJobManager 30 may be a class that responds to the control messages sent from the GUI 40, and also notifies the GUI 40 of any significant events like fatal errors in the server 20. The MSCJobManager 30 services the jobs in the job queue. The MSCJobManager 30 uses the MSCJobProcessor 42 to execute jobs. If the MSCJobManager 30 receives notification from the JobScheduler 32 that a job may be added to the job queue, the MSCJobManager 30 sends a control message to the GUI 40 asking it to refresh the display of the job queue. If there are no jobs in the job queue, the MSCJobManager 30 reverts the job queue to Step Mode. If the system is idle for a pre-configured timeout, it puts the devices in a known state by running a pre-defined Standby project. (2) MSCJobManagerDAO_ may be a data access helper class for the MSCJobManager 30, and make calls to a database from the JobManager component from this class.

Figure 9:
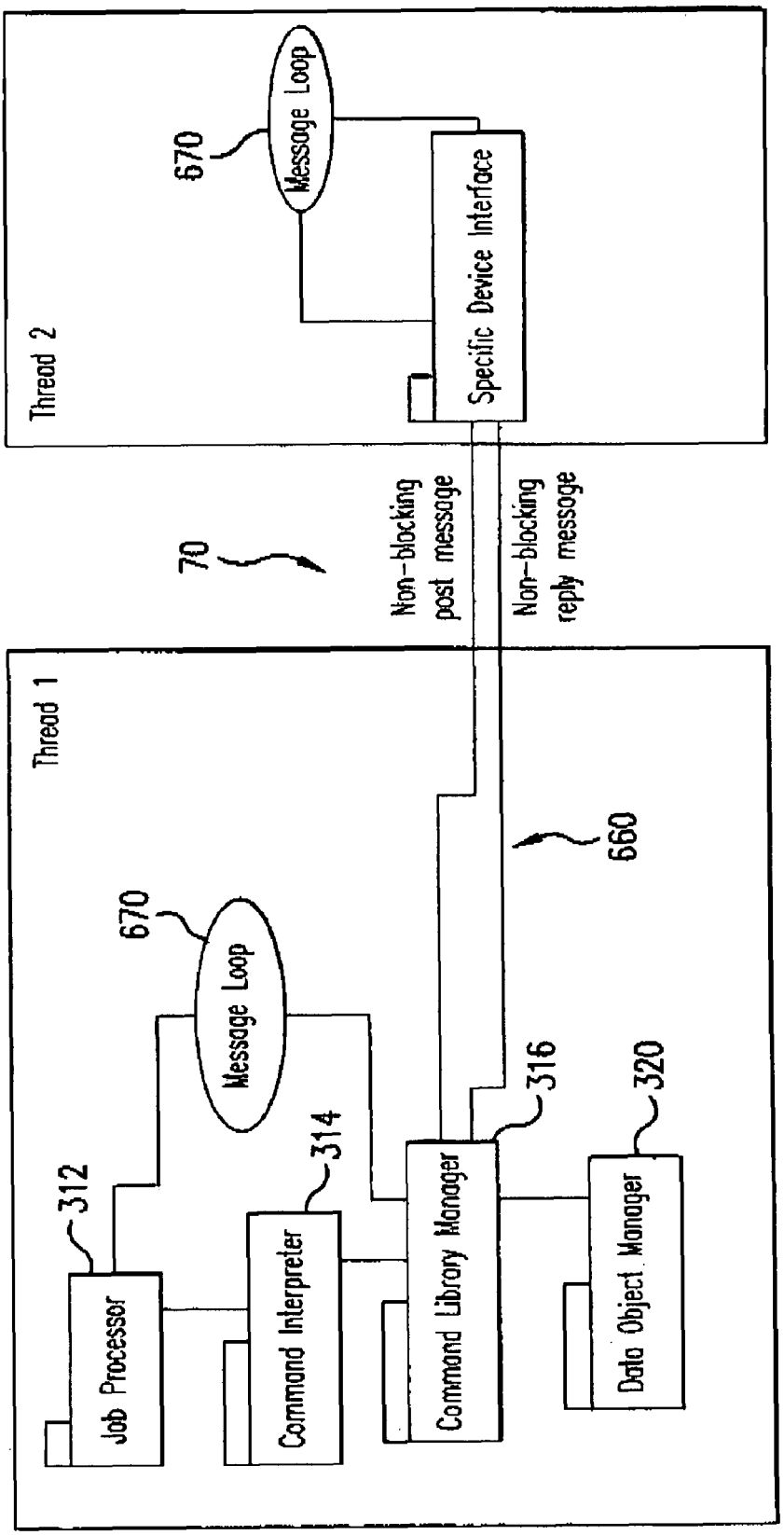
FIG. 9 shows by way of example in schematic and block diagram form a server daemon message loop, according to aspects of an embodiment of the disclosed subject matter.

The JobScheduler 32 may be a component that schedules jobs/projects for execution using predefined project schedules stored in the MSC schema. The following classes can be part of this component. (1) MSCJobScheduler 32 may be a class that reads the project schedules from the database, determines the next execution time for each scheduled job, orders the schedules from first to last, e.g., based on their execution time, and uses the MSCSchedulerTimer class to wait until the execution time is reached for the first schedule in the list, which can, e.g., be used to schedule jobs, e.g., with the job queue running independently of time, thus, e.g., awaiting the scheduled tome to queue up jobs. The MSCJobScheduler 32 then adds the project corresponding to the first schedule in the list to the end of the job queue, such that, anything already on the job queue get priority. The MSCJobScheduler 32 repeats this process until MSC exits. The MSCJobScheduler 32 class runs in its own thread with its own MessageLoop, similar to that shown for the job processor in FIG. 9, ready to process any incoming messages. Also, scheduled jobs may, e.g., run only within a system defined pre-configured time window. They can not be executed outside the time window and a warning message can be logged if they missed their window.

The GUI 40 may be expected to notify the MSCJobScheduler 32 class when users create, update, or delete projects. In response to this notification, the MSCJobScheduler 32 class updates the scheduled projects execution times by retrieving the project schedules from the MSC Schema database 24 and re-evaluating the project execution times. The MSCJobScheduler 32 can also interrupt the MSCSchedulerTimer if this class is already using it for waiting.

(2) MSCSchedulerTimer may be a class that runs in its own thread with its own MessageLoop. The MSCSchedulerTimer may be a helper class for the MSCJobScheduler 32 class. The MSCSchedulerTimer waits until the given time is elapsed and then notifies the MSCJobScheduler 32 class that the time has elapsed and waits for an incoming message from the MSCJobScheduler 32 class.

(3) MESInterface 80 may be a component that provides communication to and from the external systems like MES 80 using SEMI SECS/GEM interface standards.

ServerDaemon may be a component that contains the main program for the MSC server 20. The following classes can be part of this component. (1) MSCServerMain may be the main program for the MSC server 20. It creates an instance of MSCServer 20 to manage the server 20 functionality. (2) MSCServer 20 class may be the stand in for the MSC server 20 itself. It loads system configuration, starts and initializes all the MSC server 20 components. On system shutdown, it stops all components and cleans up resources. It runs init script on start up. It also performs crash recovery if needed. (3) MSCServerDAO may be the data access helper class for MSCServer 20. All calls to database from the Server component can be made from this class. (4) MSCDaemon class provides functionality to convert the calling program into a deamon. It forks two new processes, creates a new session, and detaches the daemon from the console.

In addition to the above components, an external USB interface component may be used to communicate with the camera devices for Beam Metrology 830. Also, COLDAS 824, a product of Cymer, Inc. that uses, e.g., a CORBA interface to the Laser 330', may be used to get diagnostics information from the Laser 330'. MSC 10 treats COLDAS 824 as a logical device and connects to it using a device driver that conforms to MSCCommInterface.

The user interface design of MSC 10 may be described using screen sketches for primary screens in the UI, as shown in the referenced FIGS. The following may be the hierarchy of packages (from lowest to highest) in MSC GUI.

The ice 9.msc.core package contains common classes used by all packages in the GUI 40. It also contains the main( ) method to start GUI 40. The following major classes can be part of this package.

Constants may be a class that contains constants used throughout the GUI 40. DefaultPanel may be the base class for all panels used in GUI 40. It implements functionality common to all panels. MSCSystemProperties may be a class that loads system level properties from a database that can be used to control the look and feel of GUI screens. StartMSC may be the class with main( ) method to start the GUI 40. MSCDynParam classes provide the display and update functionality of dynamic parameter screens in the GUI 40. These classes use the standard Model View Controller (MVC) design pattern with the controller, model and view classes.

The ice9.msc.util package contains common utility methods used by all packages in the GUI 40. It contains utility methods to load images, validate data in fields, sort data in tables etc. The ice9.msc.comm package facilitates communication between GUI 40 and the server 20 using TCP/IP socket API in Java. This package also provides a high level abstraction for data access from GUI 40 using JDBC API in Java. The following classes can be part of this package. (1) SocketConn implements the socket communication using TCP/IP in the GUI 40. (2) CommandSocketConn uses the SocketConn class to send and receive control messages to and from the server 20. All the messages sent to the server 20 include the session ID returned by the server 20 when the connection is first established. The server 20 uses this session ID to enforce access control. (3) DiagnosticSocketConn uses the SocketConn class to receive status messages from the server. (4) MSCDBConn provides a standard connectivity device, e.g., a Java Database Connection ("JDBC") to the MSC database. Using this connection, stored procedures in the MSC 10 database can be executed to retrieve and update data in MSC 10.

The ice9.msc.security package authenticates and authorizes users to various features in the GUI 40. It validates user login. It determines access control based on the user's role. The following classes can be part of this package:

SecurityManager: This class logs-in a user or a role into the system based on the security type. It supports two types of security: User-based security and Group-based security. If the system may be configured to be user-based security, it expects user ID and user password to be supplied. It then finds the role corresponding to the user from the database. On the other hand, if the system may be configured to be group-based security, it expects role ID, role password and user ID to be supplied. Irrespective of which configuration is chosen, at the end, the system knows who is the user using the system and the role he/she can be playing. From the role, it can determine the user permissions.

Roles and permissions can be pre-defined. They can be stored in the OEM schema. There can be three common roles: Operator (Process Engineer); Service Engineer (Filed Service Engineer); and Administrator.

Permissions can be defined for each role using the actions they can perform. There can be five common actions the users can perform on any feature: View; Create; Modify; Delete; Execute.

The system allows permissions to be set at any level by the MSC supplier (OEM). Permissions can be set at the following levels: System; Feature; Entity.

Permissions set at the System level (i.e. Database level) can be overridden by the permissions set at the Feature level (i.e. Table level), which in turn can be overridden by the permissions set at the Entity level (i.e. Field level).

Two important methods of this class can be: bool is Allowed (string SessionID, string FeatureID, string ActionCode); bool checkPermission (string SessionID, string permissionID, string ActionCode).

The bool is Allowed( ) method can be used to check access for a given feature. If the access is not allowed, then the corresponding menu or button can be disabled. The checkpermission( ) method can be used to check field level security. If, for example, a permission ID may be attached to a task parameter in the database, the corresponding parameter row in the GUI can be enabled/disabled based on the return value from the checkpermission( ) method.

An ice9.msc.sysconfig package allows users to update system and device configuration information. It uses MSCDynParam classes from the ice9.msc.core package to display and update system and device configuration parameters. The number and content of tabs on the system configuration screen may be database driven. Usually, one tab may be displayed for each device attached to the MSC 10.

An ice9.msc.status package allows users to view the status messages from MSC server 20. It also allows users to filter status messages based on, e.g., timing, severity and message content. It uses the standard Model View Controller (MVC) design pattern with the controller, model and view classes. For displaying status messages, the GUI 40 listens to the "StatusMessage" messages from the server 20. An ice9.msc.proj package allows users to create, update, and delete projects in GUI. It uses the standard Model View Controller (MVC) design pattern with the controller, model and view classes. This package also allows users to provide schedules for projects. A project may be limited to at most one schedule. Tasks may have a parameter to indicate if it can be scheduled or not. A project cannot be scheduled if it contains tasks that prohibit scheduling. If a task's schedulable parameter changes, the system can re-validate the schedules containing that task and notify the user if a scheduled task becomes un-schedulable. If the user decides to use template based project screens for control, diagnostics or download, custom screens can be displayed using the requested template. The saving and retrieval of the project data into and out of the database can still be done using the standard project definition (i.e. a project may be simply a collection of tasks with task parameters). So, the template-based custom logic in the GUI can convert the project data back and forth between the standard format and the template-based custom format. To import/export and copy/paste projects an XML format can be used.

A stylesheet can be used to convert the XML to a text format for easy viewing of project information. The project schedule information may not be included in the import/export of projects. Also, the import/replace functionality may not be supported. An import can create a new project. It can error out if a project with the same name already exists. The exported XML document can be divided into two sections: the head and the body. To ensure the integrity of the exported data, a hash can be created for the exported data in the body section and included in the heading section.

On import, if the hash of the body section doesn't match the hash stored in the heading section, a warning can be displayed to user. The import operation can then proceed or abort based on user's choice.

An ice9.msc.recipe package allows users to create, update, delete, copy and paste recipes and their associated images in GUI. It uses a standard Model View Controller (MVC) design pattern with the controller, model and view classes. Users can organize recipes using folders. These folders may not be real folders in the file system. The folder hierarchy (as parent child relationships) can be stored in the database. The short recipe names need not be unique across folders. The long name of a recipe includes its folder hierarchy. The folder names in the long name of a recipe can be separated by forward slashes (/). The GUI retrieves the folder hierarchy from the database and displays it. Consistency checks for recipe and image parameters include comparison among recipe parameters. The consistency checks themselves can be stored in the OEM schema of the database along with other information of the recipe and image parameters. For example, they may be stored as Image.EndX<Image.StartX. The GUI retrieves the checks from the OEM schema, substitutes the values for the parameters and evaluates the checks for true or false.

To import/export and copy/paste recipes, a XML format can be used.

A stylesheet can be used to convert the XML to a text format for easy viewing of recipe and image information. An import creates a new recipe or image as appropriate. It errors out if a recipe with the same name already exists. Images can be appended to the existing list of images in a recipe, irrespective of the names of images in the imported XML file. As described above in the ice9.msc.proj section, the integrity of the exported file can be verified by saving a hash of the exported data in the exported document.

An ice9.msc.lot package allows users to create, update and delete lots in GUI. It uses the standard Model View Controller (MVC) design pattern with the controller, model and view classes.

To copy/paste lots, a XML format can be used.

Figure 33:
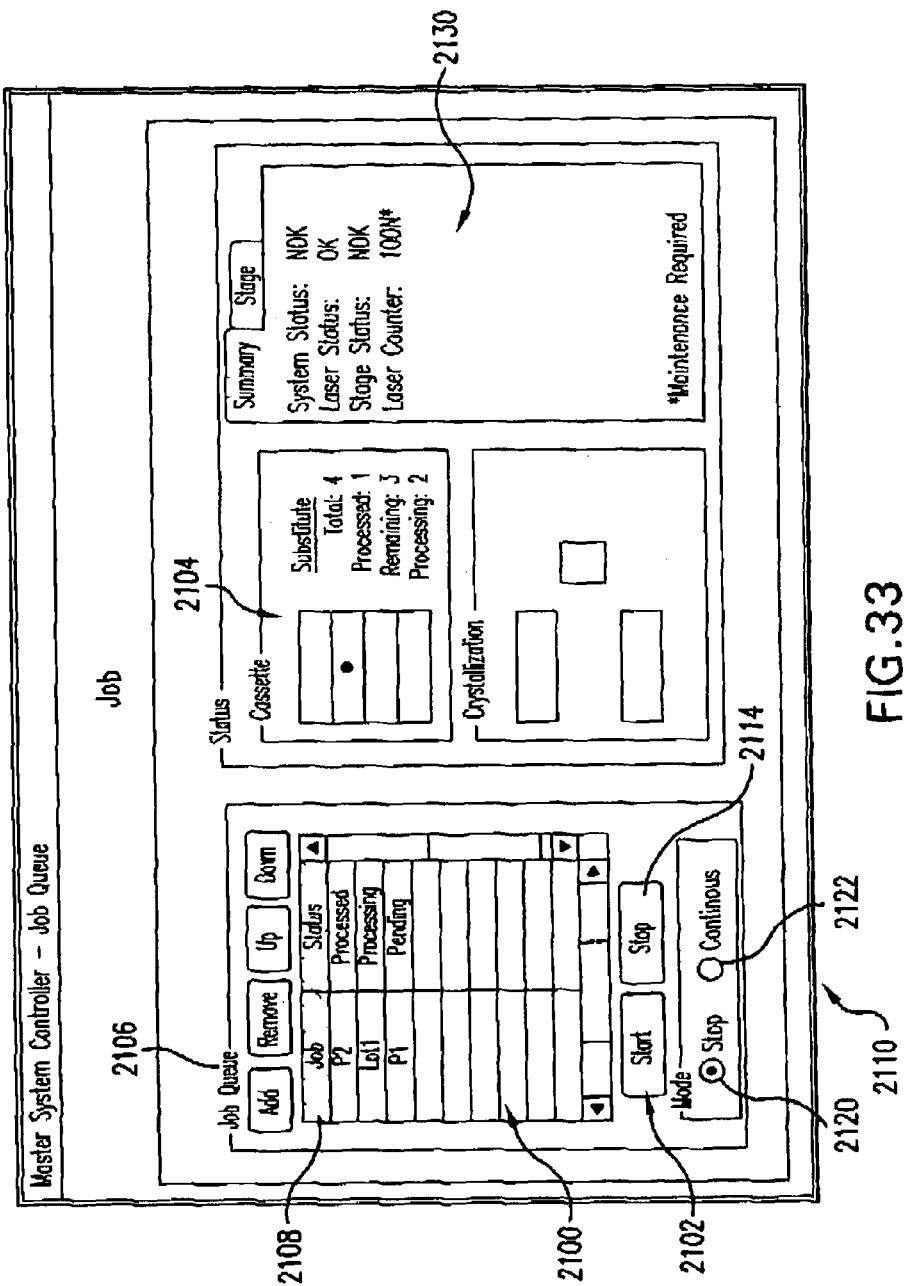
FIG. 33 shows by way of example an illustrative graphical user interface screen which may be utilized according to aspects of an embodiment of the disclosed subject matter.
Figure 34:
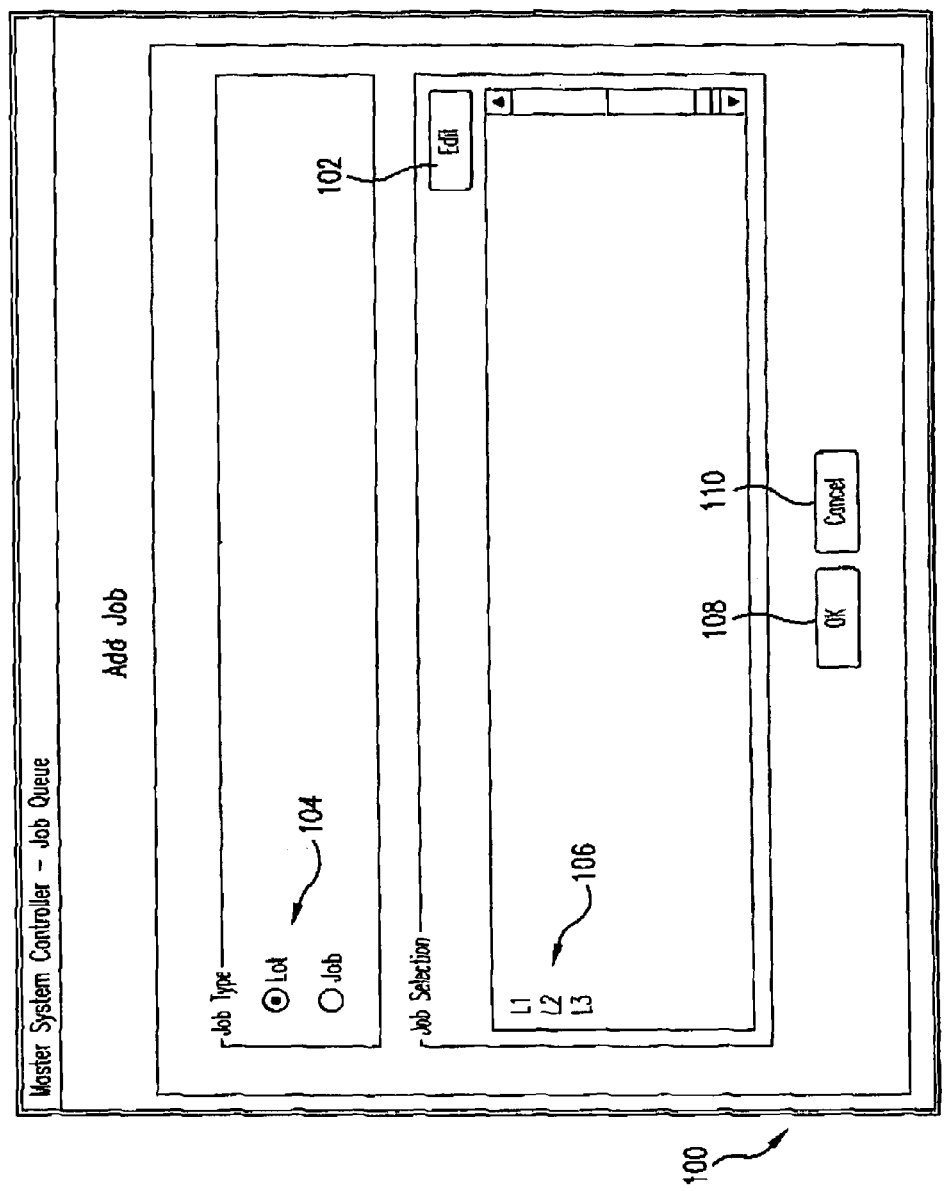
FIG. 34 shows by way of example an illustrative graphical user interface screen which may be utilized according to aspects of an embodiment of the disclosed subject matter.

An ice9.msc.job package allows users to create, delete, reorder, and execute jobs from the GUI 40. It also allows users to halt, resume or abort job execution. It allows jobs to be run in step or continuous mode. It sends and receives control messages to and from the MSC server 20. It also displays the crystallization graphics and the system status. The number and content of system status tabs can be database driven. The system uses the standard Model View Controller (MVC) design pattern with the controller, model and view classes. When the user adds a job to the job queue, the GUI 40 allows the user to supply runtime parameters by clicking on the Edit button 102 in the Add Job to Queue screen 100, illustrated in FIG. 34. Clicking on the Edit button brings up the corresponding job lot or project's Modify screen, e.g., as illustrated in FIG. 33. Alternatively, a new screen can be displayed listing only the parameters of the corresponding lot or project. Irrespective of whether the user supplied runtime parameters or not, the GUI 40 can make a copy of the job in the database and add it to the job queue.

The add job screen 100 may also have a selection toggle 104 for indicating the type of job, lot or job, which also toggles the list from jobs to lots. It may display the jobs that are selectable in a list 106. Once a selection is made the user may click on the OK button 108 or the Cancel button 110.

The scheduled jobs also get added to the end of the job queue when the schedules reach their execution time. Depending on a system configuration parameter, if the job scheduler may be configured to be manual, then the system prompts the user before executing the job. On the other hand, if the job scheduler is configured to be automatic, the job gets executed without prompting the user. For the graphical representation of cassette, for the crystallization graphics and for the system status values, the GUI 40 listens to the "StatusParameter" messages from the server 20. The following parameters may be sent to the GUI 40 for crystallization graphics, using the LogParameter command from the script: Lot.Name; Recipe.Name; Image.Name; Stage.CurrentY.

For missed pulses, append "2" with a space to the currentY position value of the Stage. CurrentY parameter. If the glass substrate is rotated, the crystallization graphics need to adjust accordingly. In addition to containing the name and value of the parameter, the "StatusParameter" messages from the server 20 contain attributes that can be used to indicate an action to be taken by the GUI 40. These action attributes can be stored in the status table in the database. The GUI 40 can use the action attributes to do one or more of the following: Pop-up a dialog; Display an icon or alarm signal; Show an asterisk or exclamation mark; Send an email or pager; Perform a custom script based action.

An ice9.msc.workflow package provides custom project screens. It uses templates to render custom views to create, modify and execute projects. It uses the classes of the ice9.msc.proj package to store and retrieve projects from the MSC schema of the database. This package can be considered as an abstraction layer above the ice9.msc.proj package. This package renders the project definitions retrieved from the database, using the ice9.msc.proj package, as customized views based on the information contained in the templates. Three templates have been identified, Diagnosis, Control and Download. Additional templates can be added as required. The workflow engine in this package converts standard project definitions into custom views. The users can use these custom views to create, and modify projects. The workflow engine then converts the custom views back into the standard project definitions. Using the custom views, the users can also execute projects interactively. When users click on the Execute button in one of these custom views, the workflow engine, behind the scenes, creates a job and adds it to the job queue to be run immediately. It then displays the results of the project execution in the same custom view by redirecting the status messages in the status window.

An ice9.msc.reporting package allows users to list and view reports generated by various server components in the system.

According to aspects of an embodiment of the disclosed subject matter a Database Design can include a database design of the MSC 10, as, e.g., described using tables.

Tables in the database can store security, job scheduling, module, and recipe hierarchy information. This can include a user table with user ID's and passwords and the level of the user, e.g., the user's role, and can include other security, like passwords and permissions ascribed to the particular user, e.g., as Process Engineer, Field Service Engineer or Administrator. A table can track, e.g., sessions, e.g., a MSC:: Session Table: with the following data: SessionID (PK); SessionUserID; SessionRoleID; SessionType (GUI, MES, etc.); SessionStartTime; SessionEndTime. A MSC::Action Table may have the following: ActionCode (PK) (View, Create, Update, Delete, Execute etc.; ActionDesc. A MSC::Feature Table may include: FeatureCode (Lot, Recipe, Project, Job, Status, Queue, Schedule etc.); FeatureDesc; and a MSC::Access-Control Table any include the following: FeatureCode (PK-1); PermID (PK-1).

The PermID's can also be added to the parameter tables in the OEM schema 22 to control access at the field level. A MSC::Schedule Table may be part of the scheduling function, and may include the following: ScheduleID (PK); Schedule-Type (Hourly, Daily, Weekly, Monthly); RecurrenceTimes (i.e. Occurs Every); RecurrencePeriodType (Day, Days, Week, Months); Recurrence Period; StartTime; StartDate. This may be utilized, e.g., using the GUI screens 2132, 2134, 2136 and 2138 of FIGS. 29, 30, 31 and 32. The user may select Hourly, Daily, Weekly or Monthly on the timing selection box 2142, which can bring up the respective scheduling windows 2144, 2144', 2144" or 2144''' shown by way of illustration in the respective screens 2132, 2124, 2136 and 2138 of FIGS. 29-33, respectively for Hourly, Daily, Weekly and Monthly scheduling. as can be seen, these respective windows 2144-2144''' enable selection of scheduling times and frequencies on ah hourly, daily, weekly and monthly basis.

A MSC::JobSchedule Table may include: JobID (PK-1); ScheduleID (PK-1); ActiveIndicator (True or False); NextExecutionTime; and a MSC::Module Table may include: ModuleID (PK); ModuleName; and a MSC::Component Table may include: ModuleID (PK); ComponentID (PK-1); ComponentName; SequenceNumber. A MSC::ModuleParameter Table may include: ModuleID (PK-1); ParamName (PK-1); ParamValue; and all other generic parameter related columns. A MSC::ComponentParameter Table may include: ModuleID (PK-1); ComponentID (PK-1); ParamName (PK-1); ParamValue; and all other generic parameter related columns. A MSC::RecipeFolder Table may include: FolderID (PK); FolderName; ParentFolderID.

There can be added a SubstrateID to the LotRecipe table in addition to the RecipeID, and in the Recipe table, a column for the ParentFolderID. Encoded scripts can be stored in the database. The following parameters may be added to the system parameter list in the database, System Idle Timeout (in minutes), Scheduler Manual/Automatic Mode and Window to run scheduled tasks (in minutes), along with the following parameter for tasks, i.e., Task can be scheduled or not. The following can be added to the Status table, as, e.g., types of actions when the status checks fail, Pop up a dialog box, Display an error or warning icon or Perform a custom action using a script.

FIGS. 42a-E illustrate exemplary MSC database 24 and OEM database 22 tables, such as an OEM_form table 2500, e.g., containing form_id (PK) and form_name data, which may be linked to an OEM_form_variable table 2502, e.g., containing for each form variable-label, variable_uom, variable_data_type, variable_type, variable_default, variable_required, variable_validator, variable_order, variable_list and variable_internal data. Also included may be an MSC_n2_data table 2510 containing, e.g., xseries and yseries data, an MSC_water_data table 2508 also containing xseries and yseries data, an MSC_config_variable table 2506 containing, e.g., variable_name and variable_value data and an MSC_device_variable table 2504 containing, e.g., device_id, variable_name and variable_value data. Also shown by way of example is an MSC_linebeam_header table 2520 and an MSC-rawbeam_header table 2530, each containing respective lb-id and rb-id data and respective lb_timestamp, rb_timestamp, and lb_project_id and rb_project_id data and linked to a respective MSC_linebeam_calculation table 2524 and MSC_rawbeam_calculation table 2532 and a MSC_linebeam_data table 2522 and a MSC_rawbeam_data table 2534, the tables 2524 and 2532 containing, e.g., respectively, lb_id, rb_id, lb_capture_id, _capture_id, lb_name, rb_name and lb_value, rb_value data. The tables 2522 and 2534 contain, e.g., lb_id, rb_id, lb_filename, rb_filename and lb_diledata, rb_filedata data.

Figure 42A:
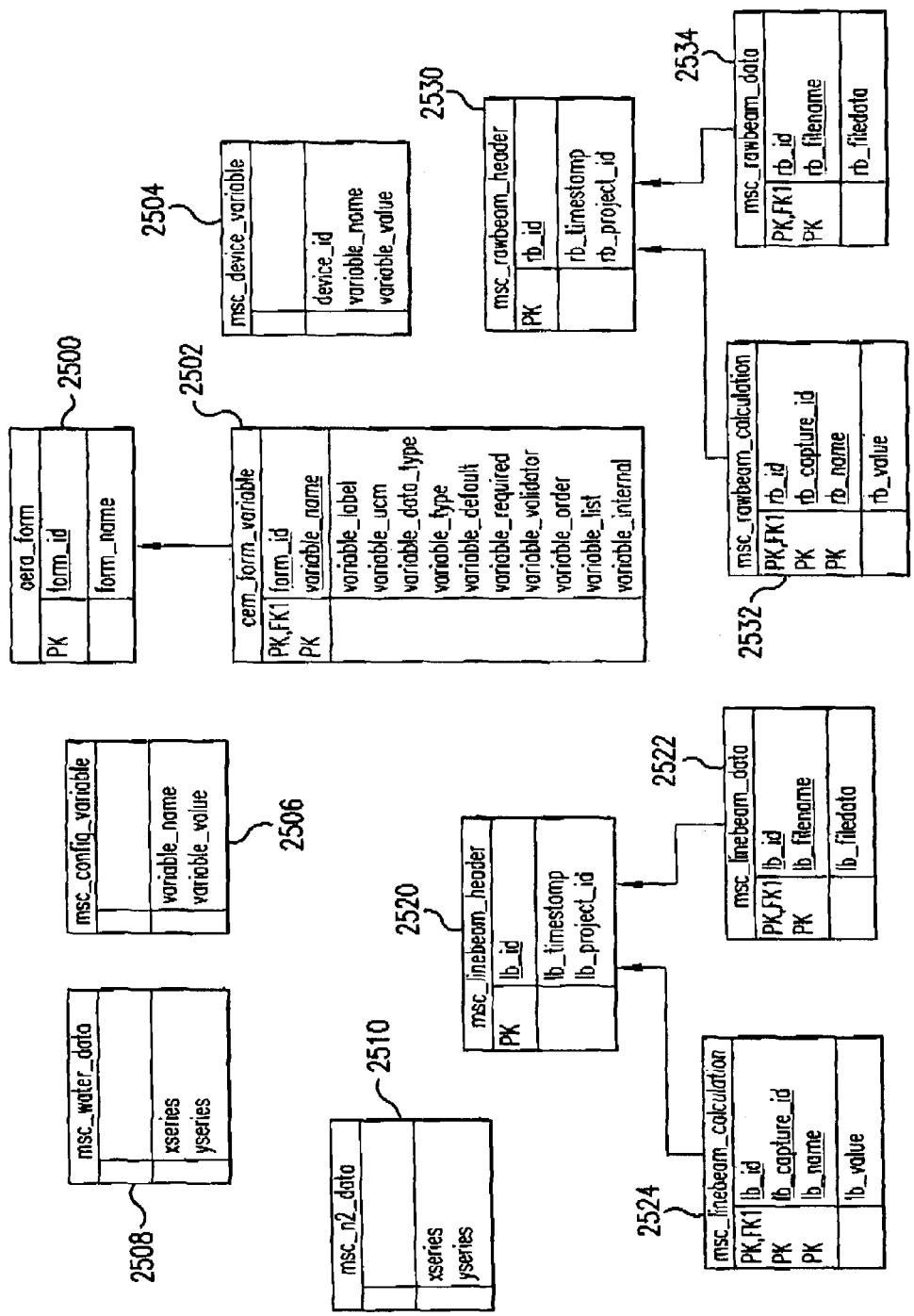
FIGS. 42A-E show by way of example in block diagram form sets of database tables, according to aspects of an embodiment of the disclosed subject matter.
Figure 42B:
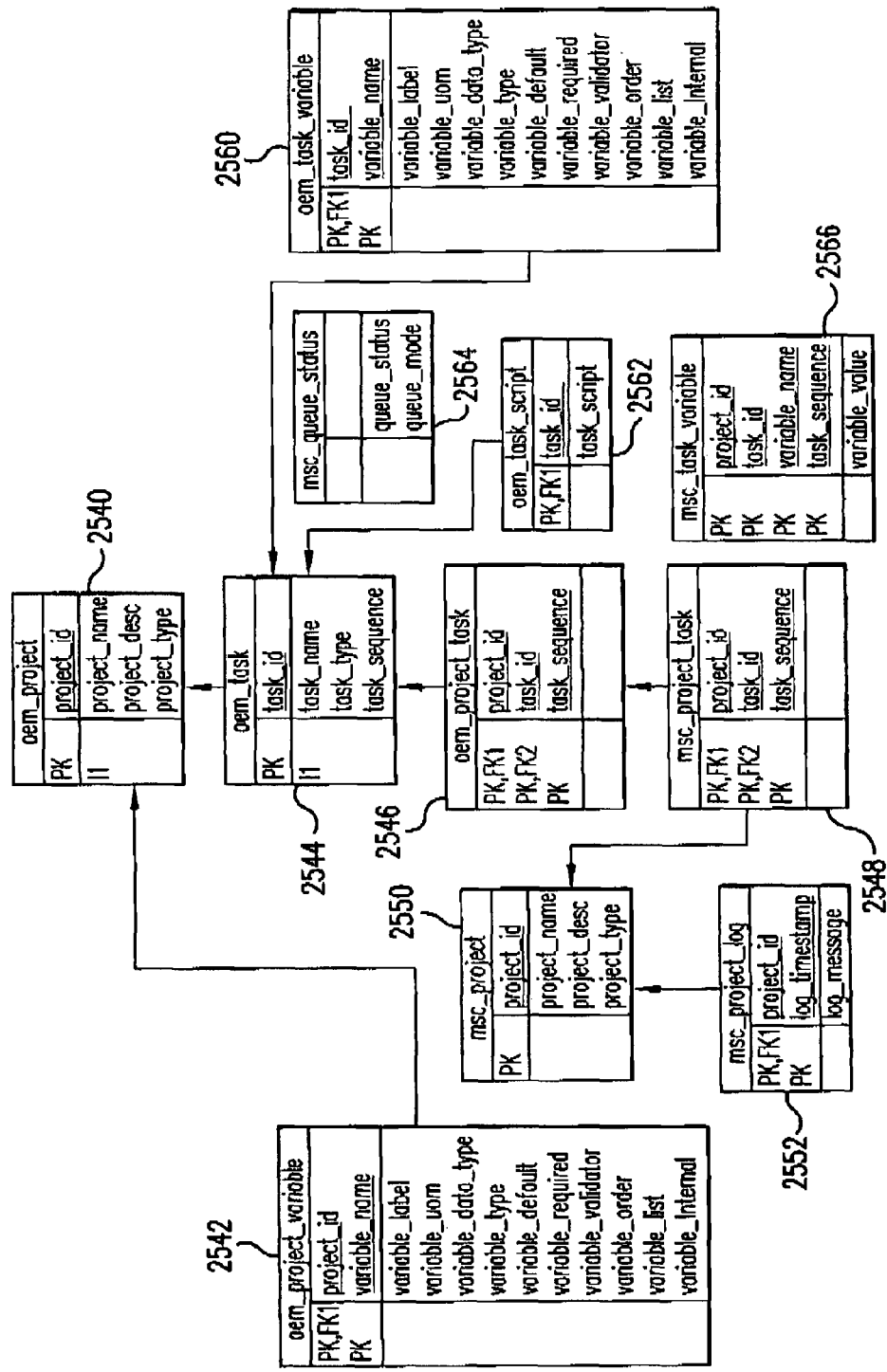

Shown in FIG. 42B by way of example are additional OEM/MSC database tables. An oem_project table 2540 containing project_id (PK), project_name, project_desc, and project_type data, linked to an oem-task table 2544 containing task_id (PK), task_name, task_desc, and task_type data and to an oem_project_task table 2546 and an msc_project_task table 2548, each of which may contain project_id, task_id and task_sequence for the tasks in a project. The table 2540 may be linked also to an oem_project_variable table 2542 which may contain project_id and variable_name data along with variable-label, variable_uom, variable_data_type, variable_type, variable_default, variable_required, variable_validator, variable_order, variable_list and variable_internal data. The table 2544 may be linked to an oem_task_variable which may contain task_id and variable-name data as well as variable_label, variable_uom, variable_data_type, variable_type, variable_default, variable_required, variable_validator, variable_order, variable_list and variable_internal data.

The table 2548 may be linked to an msc_project table 2550 which may contain project_id data and project_name, project_desc, and project_type data and may be linjked to an msc_project_log table containing, e.g., project_id and log_timestamp data as well as log_message data. The table 2544 may be linked to an oem_task_variable table 2560, which may contain task_id and variable_name data as well as variable-label, variable_uom, variable_data_type, variable_type, variable_default, variable_required, variable_validator, variable_order, variable_list and variable_internal data.

There may also be an msc_queue_status table 2564 which may contain queue_status and queue_mode data and an msc_task_variable table 2566, which may contain project_id, task_id, variable_name and task_sequence and variable_value data, and an msc_queue_status table which may contain queue_status and queue_mode.

Figure 42C:
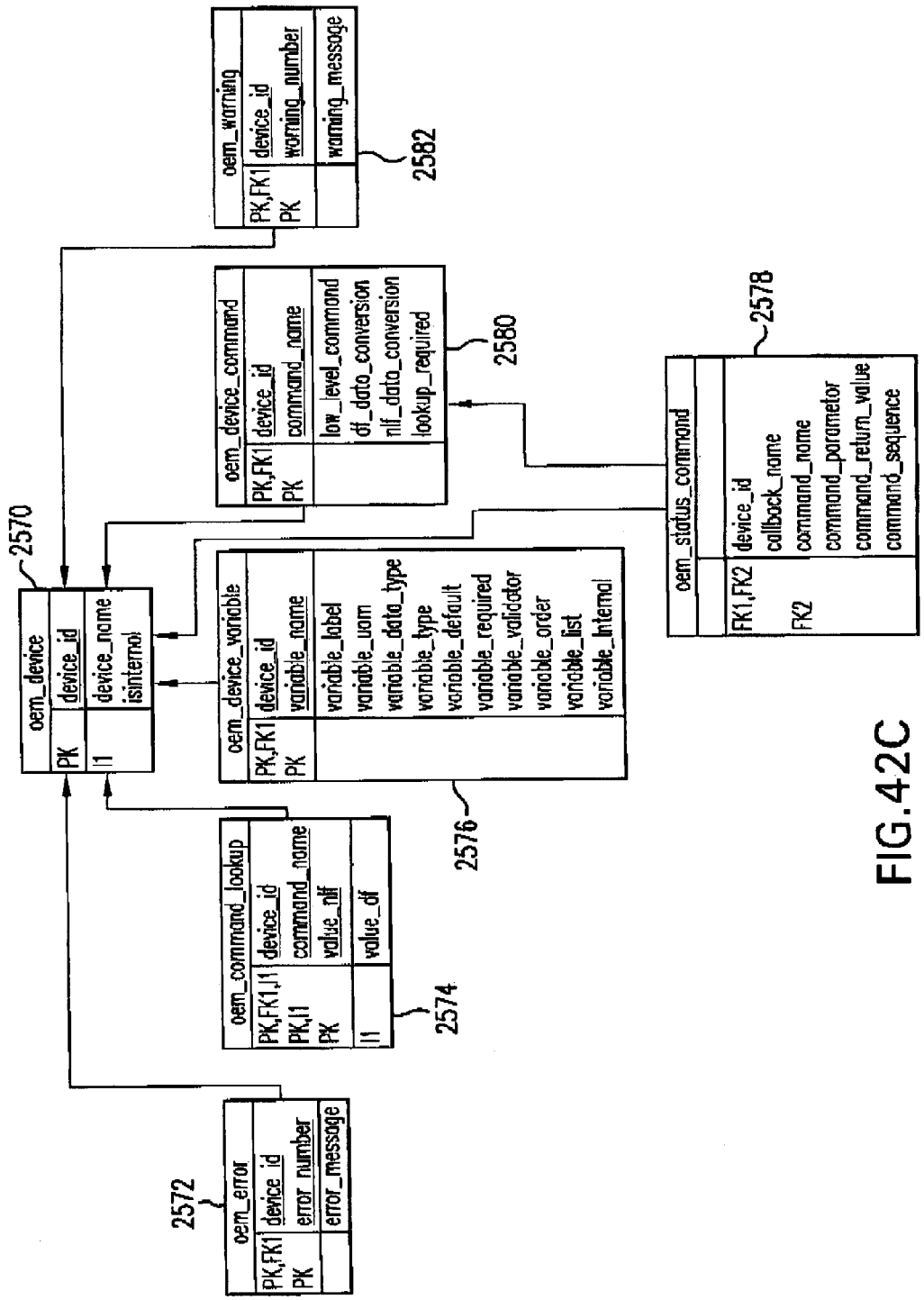

FIG. 42C shows by way of example an oem_device table 2570, which may contain device_id, device_name and isinternal data. The table 2570 may be linked to an oem_error table 2572, which may contain device_id, error_number and error_message data, and to an oem_command_lookup_table 2574, which may contain device_id, command_name, value_nif and value_df data, and to an oem_device_variable table 2576, which may contain device_id and variable_name data as well as variable-label, variable_uom, variable_data_type, variable_type, variable_default, variable_required, variable_validator, variable_order, variable_list and variable_internal data.

The table 2570 may also be linked to an oem_device_command table 2580 which may contain device_id and command_name data as well as low_level_command, df_data_conversion, nif_data_conversion and lookup_required data. The table 2570 may also be linked to an oem_warning table 2582 which may contain device_id, warning_number and warning_message data. The table 2570 and the table 2580 may also be linked to an oem_status_command table 2578, which may contain device_id, callback_name, command-parameter, command_return_value and command sequence data.

Figure 42D:
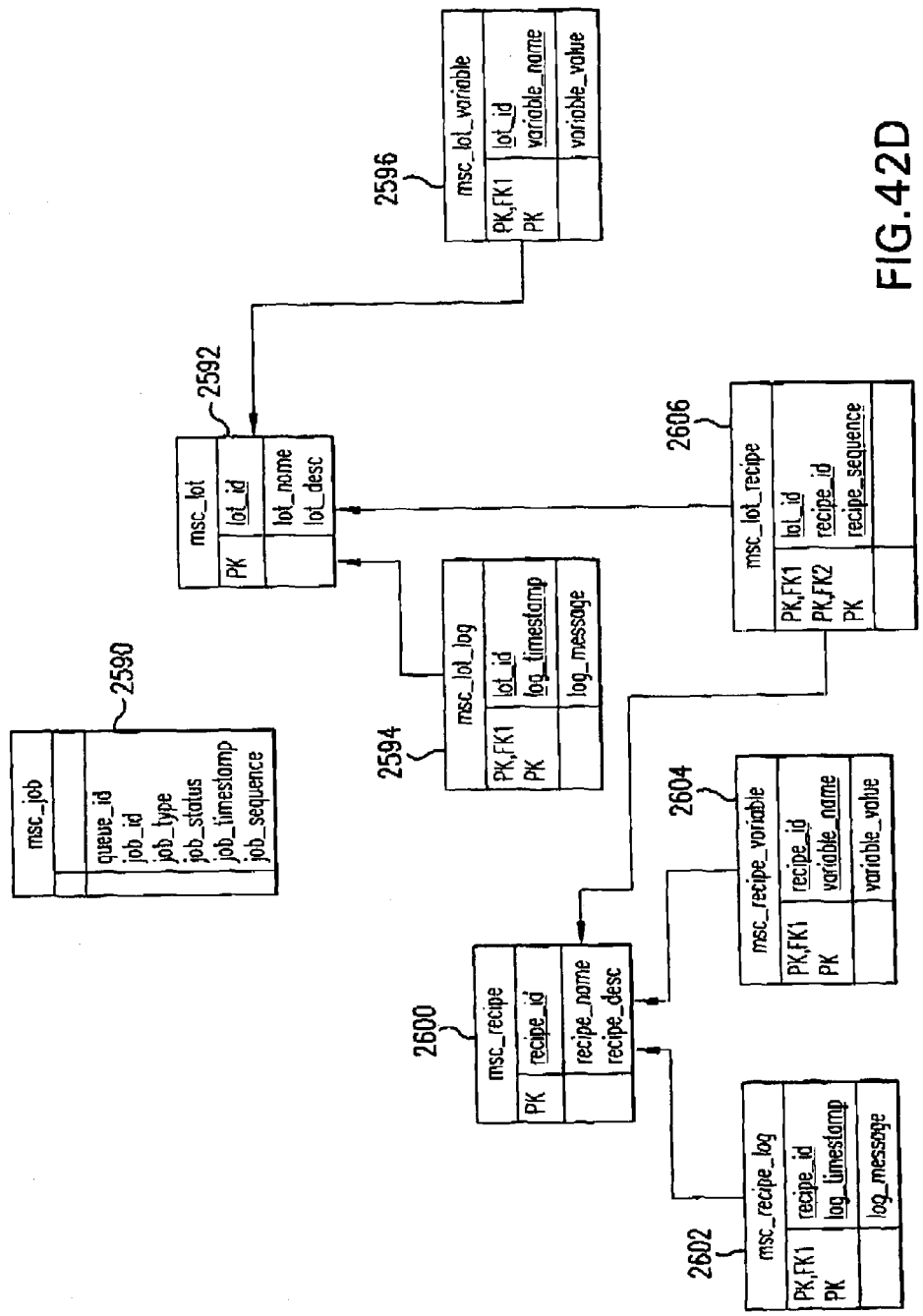

FIG. 42D shows by way of example an msc_recipe table 2600 that contains recipe_id table, recipe_name and recipe_desc data and may be linked to an msc_recipe_log table 2602 and an msc_recipe_variable table 2604, the table 2602 containing, for example, recipe_id, log_timestamp and log_message data and the table 2604 containing recipe_id, variable_name and variable_value data. the table 2600 may also be linked to an msc_lot_recipe table 2606, which by way of example may contain lot_id, recipe_id and recipe_sequence data. An msc_lot table 2592 may contain lot_id, lot_name and lot_desc data and be linked to the table 2606 and to an msc_lot_table containing lot_id, log_timestamp and log_message data and to an msc_lot_variable table containing lot_id, variable_name and variable_value data. there may also be an msc_job tablecontaining queue_id, job_id, job_type, job_status, job_timestamp and job_sequence data.

Figure 42E:
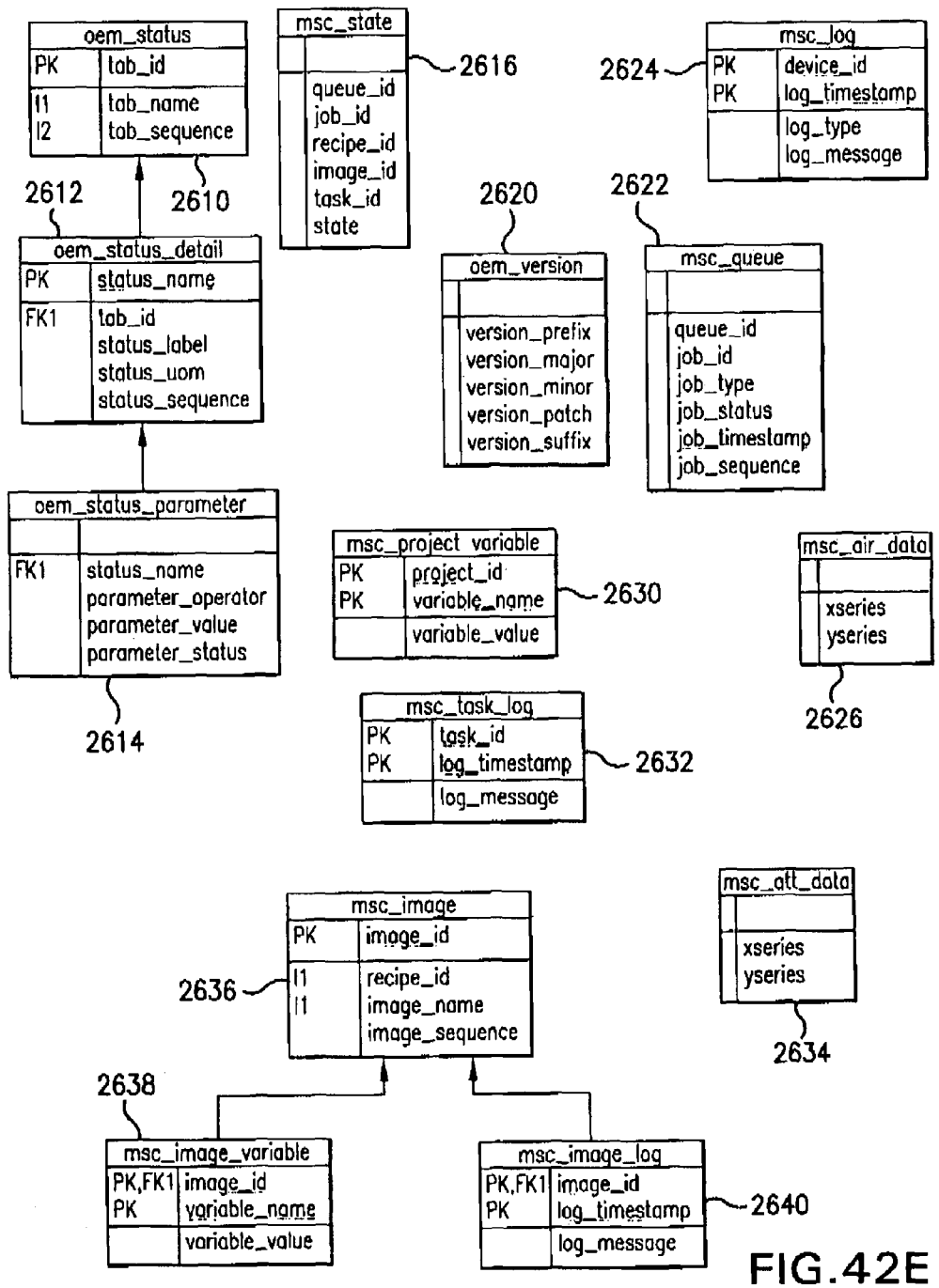

FIG. 42E shows by way of example other tables, e.g., an msc_image table 2636 containing image_id, recipe_id, image_name and image_sequence data, and may be linked to an msc_image_variable table 2638 containing image_id, variable_name and variable_value data and to an msc_image_log, containing image_id, log_timestamp and log_message data. An oem_status table 2610 may contain tab_id, tab_name and tab_sequence data and be connected to an oem_status_detail table 2612, containing status_name, tab_id, status_label, status_uom and status_sequence data and which table 2612 also may be linked to an oem_status_parameter table which may contain status_name, parameter operator, parameter value, and parameter_status data.

Other tables may include an msc_state table 2616 containing queue_id, job_id, recipe_id, image_id, task_id and state data, an oem_version table 2620 containing version_prefix, version major, version minor, version_patch and version_suffix data, an msc_queue table 2622, containing queue_id, job_id, job_type, job_status, job_timestamp and job_sequence data, an msc-log table 2624, containing device_id, log_timestamp, log_type and log_message data, an msc_air_data table 26236 and an msc_alt_data table each containing xseries and yseried data.

According to aspects of an embodiment of the disclosed subject matter a Data & Message Mapping Process (DMP 906) 906 can communicate with a host system 910 via the ECP 902 Gem Interface 904 as illustrated, e.g., in FIGS. 19, 43A-C and 44. The design can include three products offered from Asyst Technologies (ConX300, GEM and SDR). According to aspects of an embodiment of the disclosed subject matter a System Overview, can include that the TCZ900X (sometimes referred to herein in file names as ice9) consists of two major software components, MSC (Master Systems Controller) 10 and ECP 902 (External Communications Process) 900, with the latter being a message translation service between a factory host 910 and the MSC 10. The ECP 900 can use a TCZ 900X vendor library, e.g., the GEM Library 904 to exchange the messages to the factory HOST 910, and also communicate with the MSC 10.

The following terms and acronyms are used in the description of the design of the MES 80

| Term | Definition |
| --- | --- |
| TCZ900X | TCZ 900X is an innovative production tool for fabricating flat panel displays. It is a LTPS (Low Temperature Poly Silicon or tb SLS (this beam sequential lateral solidification) Tool. |

-continued

| Term | Definition |
| --- | --- |
| ECP | A process that interacts with Factory Host & MSC |
| Operator | The person who physically has access to the equipment's material port(s) and control panel. This is the person who is operating the laser annealing machine, e.g., the TCZ900X such as a Process Engineer. |
| Host | A computer which is connected to the TCZ900X equipment via the SECS/GEM interface |
| GEM | Generic Equipment Model. |
| SECS | SEMI Equipment Communications Standard |
| SEMI | Semiconductor Equipment and Materials International |
| SV | Status Variable |
| DV | Data Variable |
| CEID | Collection Event ID |

The following design considerations can be part of the design for MSC/ECP 900 integration, Multi-Process or Multi-Threading, since ECP 902 and MSC 10 can be two different processes running on the same server, though being also designed to run independently on separate machines as well, and also Single Thread or Multiple Threads for Interfaces, since ECP 902 uses an approach similar to MSC 10, where it uses separate threads to talk to the HOST 910 and to communicate with MSC 10.

According to aspects of an embodiment of the disclosed subject matter, communication between the MSC 10 and the SECS vendor software may be provided with a generic functionality which may also be extended to allow for customizations required by end users of the laser annealing machine, while at the same time providing that the central core of the MSC 10 may not have to be modified to support a standard GEM interface, e.g., GEM Library 910. MES 80 provides a set of classes that form the central part of the ECP 900 SECS/GEM Host Interface, which classes may be reusable, high quality, stable, and extendable to meet the specific needs of such end users. The implementation may be hidden from the interface where possible and practical to minimize the impact of an implementation change on other MSC 10 processes. An Asyst GWGEM implementation may require at a minimum 5 separately executing processes, including the main ECP, the GEM Extension Process, the GEM Message Process, the GEM Daemon and the SDR Daemon. Each of these components interfaces with the GEM and SDR DLLs in accordance with the GEM and SDR requirements. In addition, the GEM configuration can allow the application developer to develop a mechanism to communicate between the required processes listed above. The GEM Daemon process coordinates all interaction between the ECP 900 task, Primary Message Handler task, and Extension task. The GEM daemon contains the major portion of GEM logic.

The main ECP 900 may be considered to be the primary interface to the GEM system. The ECP 900 does not incorporate or include any of the equipment specific software modules and may be limited only to handling those tasks that are specific to SECS/GEM communications and interfacing to the GEM libraries. The purpose of the ECP 900 may be to act as a message translator, dispatcher and a server to the total SECS/GEM solution. The ECP 900 may be required to interface to the GEM Extension Process, the GEM Message Process and the DMP 906, e.g., as discussed in more detail below.

Three classes of users can use the MSC software, including Process Engineers, who perform day-to-day production operations of processing a substrate, e.g., in a TCZ900X elongated thin beam laser annealing apparatus, and who can only execute certain tasks and projects, with otherwise restricted access to the system. As an example, Process Engineers cannot edit or delete tasks and projects. Field Service Engineers may perform daily process optimization and performance monitoring operations, i.e., trained system engineers who have major access to the system and who may not be responsible for preparing low level commands or starting debug mode. Administrators may perform occasional administration, troubleshooting, and performance monitoring operations, i.e., trained system engineers who have administrator access to the system, i.e., full access to the system but are not responsible for preparing low level commands or starting debug mode.

The following matrix shows the access levels for the above user classes:

|  | Process Engineer | Field Service Engineer | Administrator |
|---|---|---|---|
| Lot Management | ✓ | ✓ | ✓ |
| Project | Not All Projects | ✓ | ✓ |
| Edit Tasks | X | X | ✓ |
| Scheduling | X | ✓ | ✓ |
| Recipe Monitor | ✓ | ✓ | ✓ |
| Run Recipe Queue | ✓ | ✓ | ✓ |
| Crash Recovery | ✓ | ✓ | ✓ |
| Error Recovery | ✓ | ✓ | ✓ |
| Login | ✓ | ✓ | ✓ |
| Reports | ✓ | ✓ | ✓ |

The MSC 10 may be expected to provide response times in the range of a second or so when it interacts with the attached devices while processing the silicon substrates.

Below is a requirement listing for the MSC 10. The Cross Ref., in parenthesis, refers to the Layer-Component-Class codes, e.g., the code GUI-CFG-MOD refers to the Module class in the System Configuration component of the GUI layer.

For the General Functional Group, the General Functional Requirements listed here are the general functional requirements of the MSC. The system can have the following high level functionality: Process the substrate Performance Reporting Periodic Monitoring (GUI-JOB, GUI-REP, GUI-SCH); Process Optimization may be part of substrate processing (GUI-CFG); Users can update system wide configuration parameters using the User Interface (UI) (GUI-CFG); UI can be workflow driven. Some portions of GUI 40 such as the custom Project screens, such as illustrated in FIGS. 23-32, can simulate basic workflow (GUI-WFE); MSC can support Serviceability and Maintainability (GUI-PRJ, SVR-SCR-MOD).

For the Recipe Manager functional group, Recipe Information Requirements listed here can be the requirements related to the lot and recipe characteristics and management of the recipe information: A recipe may be a container of all the parameters for a substrate process. It may contain one or more images GUI-RCP-RCP; A recipe may have parameters like: Substrate Rotation: 0 or 90, Substrate Size: 2, 3, 4, 5 GUI-RCP-RCP. The number of the recipe parameters may be not fixed. Additional parameters added to the recipe can not involve coding modifications to the user interface screens (GUI-RCP-DYN, DB-OEM-PAR). Users can supply unique descriptions for recipes (GUI-RCP-IMG). An image can have parameters like: Start Position: (50 mm, 0 mm), End Position: (100 mm, 360 mm), Energy Density: 1000 mJ/cm2; Step Size: 1 um, Energy Mode: EXT, INT, Auto Focus: ON, OFF, Focus: 5 um, (GUI-RCP-IMG). The number of the image parameters may be not fixed. Additional parameters added to the image may not involve coding modifications to the user interface screens (GUI-RCP-DYN, DB-OEM-PAR). The users can create, modify, delete, save and load a recipe (GUI-RCP-RCM). The users can save and load a recipe to and from a file for transferring recipes across machines.

The users can save and load an image to and from a file for transferring images across recipes or machines. The users can copy/paste images while editing recipes (GUI-RCP-CPY). The users can copy/paste recipes to create new recipes (GUI-RCP-CPY). When a recipe is modified, recipe level consistency checks can be performed to ensure the validity of the recipe. Some parameters may be required, or optional. Examples of recipe level consistency checks can be: Position Value is smaller than substrate size, Pulse Energy is smaller than Max, value Step size is within a certain range, Focus Offset is within Auto Focus Module range (GUI-RCP-RCP, DB-OEM-PAR). When performing recipe level consistency checks, the system may assume constant values for parameters such as min and max. Values can be controllable by the Field Service Engineer (i.e. control can be role based). The system may set min and max values to ensure no damage, oversights and safety (GUI-RCP-RCP, DB-OEM-PAR). Additional recipe level consistency checks may not require code recompilation. The checks can be dynamic (GUI-RCP-RCP, DB-OEM-PAR). Each consistency check can be a row in a table or it may be a stored procedure (DB-OEM-PAR). Consistency checks and who can modify them etc. may be attached to recipe and image parameters (DB-OEM-PAR). There can be dependencies among recipe and image parameters. Recipe creation or update time checks can insure the elimination of any such dependencies. For example, in a recipe definition, EndX cannot be greater than the StartX. Also, a recipe or image parameter value might may be checked against a device parameter for consistency (DB-OEM-PAR).

A lot contains one or more substrates. Different substrates in a lot may use different recipes (GUI-LOT-LOT). The user can create, modify, delete, save and load a lot (GUI-LOT-LTM). The user can modify a lot/recipe while it is currently processed by the job queue. The system may be expected to make a copy of the lot/recipe and use that copy for processing (GUI-JOB-QUE).

The user can access any drive configured on the local machine (including network drives), while performing import/export of images/recipes/projects (GUI-RCP-EXP). The following image parameters can be named alternatively as Step Size->Pitch; Pitch->Tilt in Y direction; Yaw->Tilt in X direction (GUI-RCP-IMG). The MSC can support unused panels in the lot. It can use null recipes for this (GUI-LOT-LOT). There may be as many as 1000 recipes available at any given time. Therefore the ability to group these recipes can be available. This grouping can be up to 10 levels. An example of a recipe name is CRYS800-CHUNG-200QCIF. It includes, e.g., energy density (CRYS800), engineer (CHUNG) and device name (200QCIF). An exemplary directory structure can be: CRY->TFI-LCD->20QCIF->ENGR Name->Data->2 more levels (GUI-RCP-FLD). A new tab to view the layout of the recipe in terms of images may be needed (GUI-RCP-GRP). The system may provide a text file for importing/exporting recipes that can be read, shared and easily communicated (GUI-RCP-EXP). In production, typically, one recipe may be used per substrate. Therefore a function such as an "ALL" button to use the same recipe for all substrates in a lot may be required (GUI-LOT-LOT).

There may be more than one cassette loading station. The MSC 10 may need the cassette station number as input from the user in the lot definition (GUI-LOT-LOT). Input parameters may be required for the laser scanning process: a. Lot information: Lot ID, process step, quantity, operator ID; b. Process Information: beam width and length, scan pitch and length, energy density, laser output energy, substrate rotation or tilt angle etc. (GUI-LOT-LOT, GUI-RCP-RCP). The system can associate a substrate ID with the recipe for the lot definition (GUI-LOT-LOT). The system may have a grid based layout for the recipe images screen (GUI-RCP-IMG). The system may track substrate information separate from the recipe (GUI-LOT-LOT).

For the Maintenance Manager group, the maintenance/monitoring/servicing project requirements listed here may be the requirements related to maintenance/monitoring/servicing projects and their execution. A project may be a collection of maintenance, monitoring and operation tasks related to an individual module or the whole system. Examples of tasks can be: Download laser related monitoring data (Laser); Operation of laser (Laser); Measurement of uniformity (System); Measurement of Intensity (System); Focal Plane Calibration (System); Absolute/Relative movement of Stage (Stage); Turn off close loop of SMM/TMM (BSC 336); Download Pulse Energy from SMM (BSC 336) (GUI-PRJ-PRJ). Maintenance and monitoring tasks have parameters. Users may supply data for these parameters. Users may not be able to change task definition (GUI-PRJ-TSK). The number and type of the task parameters may vary from task to task. Adding additional tasks or changing number/type of task parameters can not involve coding modifications to the user interface screens (GUI-PRK-DYN, DB-OEM-PAR). The user may create, load, save and modify projects (GUI-PRJ-PJM). The users can copy/paste and/or import/export a project from a file. The user can execute a project on-demand (GUI-JOB-QUE). Before executing a task in a project, the system may save the state of the devices, and restore the state if an error occurs (SVR-SCR-TSK).

Users may supply unique descriptions for projects (GUI-PRJ-PRJ). The user may supply machine and system configuration parameters (GUI-CFG-SYS, GUI-CFG-DEV). While executing a project, if new calculated values are well outside the defined min and max values, the system can restore old values (SVR-SCR-TSK). The MSC 10 can gather data for servicing and maintenance (SVR-SCR-MOD), e.g., how many pulses were fired by Laser. The system may treat the MSC as a collection of modules instead of devices. A Module may be a group of components that work together. For example, the laser system spectral analysis module ("SAM") has 30 optics. The whole module might be replaced for servicing purposes (DB-OEM-MOD). The MSC Software can be general enough to support change in the number of modules and the components of a module because of servicing. It can have the flexibility to increase or decrease the number of modules (GUI-CFG-MOD, DB-OEM-MOD). The system can approximate the number of pulses of individual components (SVR-SCR-MOD), e.g., including maintenance counters for servicing and maintenance, e.g., lifetime counters (DB-OEM-MOD). The MSC 10 can monitor all modules, i.e., be aware that all modules are working. If the MSC 10 detects a non-functioning module, it can report such and stop operations requiring the module (SVR-SCR-MOD, SVR-STS-STL).

Not all devices connected to the MSC 10 are intelligent. The MSC 10 can provide the missing intelligence. Even if a device is intelligent, the MSC 10 still can monitor the device. For example, the Raw Beam Profiler has no intelligence of its own. The Attenuator 338 has its own intelligence. The MSC 10 still has to monitor Attenuator 338 (SVR-STS-STL). MSC can have a project to diagnose Laser from the GUI 40. The MSC 10 can allow the user to supply various Laser mode configurations in terms of Mode, Frequency, Number of Pulses and Average Number, through the GUI 40. The task can perform a Laser refill, check the Laser mode in varied configurations and write the results to a report file (GUI-PRJ-PJM, SVR-SCR-PJC). The Laser Diagnosis Report file can be a special character delimited (like a semicolon) text file with a header row followed by value rows. The report can be generated automatically when the Laser Diagnosis task is run. The name and the location of the report file can follow a well-defined naming convention (GUI-REP-PRJ). The MSC 10 can have a project to download data from the Laser to the GUI 40. The MSC 10 can allow the user to supply various pre-run configurations in terms of Mode, Frequency, and Number of Pulses, through the GUI 40. The task can run varied pre-run configurations, retrieve diagnostics, configurables, Rawshot, 10K and 1 M data from Laser and finally write the results to a report file (GUI-PRJ-PJM, SVR-SCR-PJC). The Laser Download Report file can be a special character delimited (like a semicolon) text file with a header row followed by value rows. The report can be generated automatically when the Laser Download task is run. The name and the location of the report file can follow a well-defined naming convention. The report file can include the name and location of files that contain downloaded Laser data (GUI-REP-PRJ). The MSC 10 can have a project to control the Laser from the GUI 40. The MSC 10 can allow the user to run any task on any of the equipment, e.g., the Laser, including Full Initialization, Refill, and Inject. It can also allow any valid command to be sent to the Laser. The response from the equipment, e.g., Laser can be displayed in the GUI (GUI-PRJ-PJM, SVR-SCR-PJC). Whenever a project is run, the MSC 10 can generate a project report. A project report can include the results summary and start/end times of all tasks in the project. It can include the list of task report and data files. It can use well-defined file naming and location conventions. It can delete old reports if they exceed a AGE (GUI-REP-PRJ, SVR-SCR-PJC).

The following monitoring data and Interlock functions can be required: Monitoring data: Real-time laser stability, Number of the last halogen injection, total accumulative number of laser pulses, accumulative number of laser pulses after gas exchange, P-lens heating temperature, real-time focus. Interlock and warning functions (limited to process): Laser irradiation stop when P-P stability is out of range expected, Warning relating to laser status (ex. abnormal laser tube temp, missing pulse, communication errors between laser and control PCs, abrupt laser output energy variations, etc.) (DB-OEM-SPR, SVR-SCR-ERH, DB-OEM-STS). A functionality like Cymer Online referenced in one or more of the above noted patents and co-pending patent applications (i.e. LTPS online) can be used to collect data in real-time, remotely. Local passive monitoring of MSC 10 may be used. Custom screens for diagnostics, download, and control projects to the laser and other devices may be provided (GUI-PRJ-PJM, SVR-SCR-PJC). A flexible and generic mechanism may be provided to collect and store lifetime counters for devices and for components in modules. Three values: 1) Expected lifetime 2) Maintenance lifetime, 3) Current lifetime may be collected (SVR-SCR-MOD, DB-MSC-MOD). The MSC 10 may track things at the module level (SVR-SCR-MOD, DB-MSC-MOD). When a module is replaced, a GUI 40 screen may be used to enter new serial numbers and clear relevant lifetime counters (GUI-CFG-MOD).

For the Process Manager Group lot process requirements noted here can be the requirements related to the execution of the lot process and job execution. Users can add and remove lots from the job queue (GUI-JOB-QUE). Users can change the job sequence in the job queue (GUI-JOB-QUE). Users can start, stop and resume the job queue (GUI-JOB-QUE). The system can process the lots in the job queue from the front of the queue when the user starts the job queue (SVR-JOB-JBM). the User can execute a lot process immediately by adding the lot to the job queue, moving it to the front and starting the queue (GUI-JOB-QUE). When the system may be executing the lot process, the progress of the crystallization process and substrate location can be displayed graphically (e.g. a rectangular area with different colors) in the GUI. (GUI-JOB-CRY); The system can perform process level consistency checks and error handling while processing the lot. The consistent checks can be at machine level, module level, lot/recipe level, substrate level and image level. The system can also perform lot-to-lot, recipe-to-recipe and image-to-image maintenance while processing the lot (SVR-SCR-LOT). A scheduling engine for pre-defined projects may scheduled them, e.g., on an hourly, daily, weekly or monthly basis (SVR-SCH, GUI-SCH); A scheduling engine can be configurable to run projects both automatically and manually. In manual configuration, scheduled projects can require user confirmation before they can be run (GUI-CFG-SYS, GUI-JOB-QUE). To process the lot, the system may perform several steps that can be both parallel and serial (SVR-SCR-LOT). Multiple scans might be needed to process the substrate in the long term. The system architecture can support this. Two images can overlap (symmetrically or asymmetrically) during the processing of the substrate. The system architecture can support this (SVR-SCR-LOT, GUI-JOB-CRY). The substrate can be loaded manually or automatically.

A job queue can have a step mode in addition to the queue mode. In Step mode, the job execution can stop after each step (i.e., after processing each job) (GUI-JOB-QUE). If an error occurs while processing the lot or the project, the job queue can be stopped (SVR-STS-ERH, GUI-JOB-QUE). The job queue can have a configurable idle timeout. If the timeout occurs, the system can put the devices in a known state (e.g. return laser to standby state) (GUI-SYS-CFG, SVR-JOB-JBM).

Both projects and recipes can be added and removed from the job queue (GUI-JOB-QUE). Scheduled projects can also be displayed in the job queue. They can be added to the queue at the appropriate position in the queue if they meet their scheduling criteria. The lack of calibration may require moving images by an offset on the stage (GUI-RCP-IMG). Glass rotation in production for special devices may be required. For the currently processing recipe, the start and estimated end time can be displayed in the GUI (GUI-JOB-STS). The system can provide visibility (preference is graphical) to the substrate in the cassette being processed (GUI-JOB-CAS). Graphical representation of process details can include: a. the step in the process, b. the section of the substrate currently being scanned, and c. the remaining steps in the process (GUI-JOB-CAS). The cassette station number can be visible in the job queue (GUI-JOB-QUE). 3-D graphics may be used for the visualization of the crystallization process.

Runtime parameter values may be collected just before a lot or project is added to the job queue (i.e., the Lot may be a template and an instance of the lot can be added to the job queue) (GUI-JOB-QUE). Project scheduling in the MSC can be a combination of both event based and schedule based (SVR-SCH-SCH). The system can check for availability of resources (e.g. Availability of utilities like Nitrogen and Water) before executing a lot or project (SVR-SCR-LOT, SVR-SCR-PRJ). Scheduled projects can optionally be specified to run only within a specified time window (GUI-SCH-SCH, SVR-SCH-SCH). Tasks can have properties to indicate whether they can be scheduled or not. The scheduling engine can prevent scheduling of projects that cannot be scheduled (DB-OEM-PAR, GUI-SCH-SCH).

For the Security Manager Group, security, audit and access control requirements listed here can be the requirements related to security and access to control of the system, recipe information, task information, lot process execution and task execution. The system can support three levels of user access: Process Engineer, Field Service Engineer and Administrator. The Administrator has the most access, followed by the Field Service Engineer, then the Process Engineer, e.g., Field Service Engineers can have admin access to the system (DB-MSC-ACS), whereas Process Engineers may execute only certain tasks and projects (DB-MSC-PAR).

Figure 18:
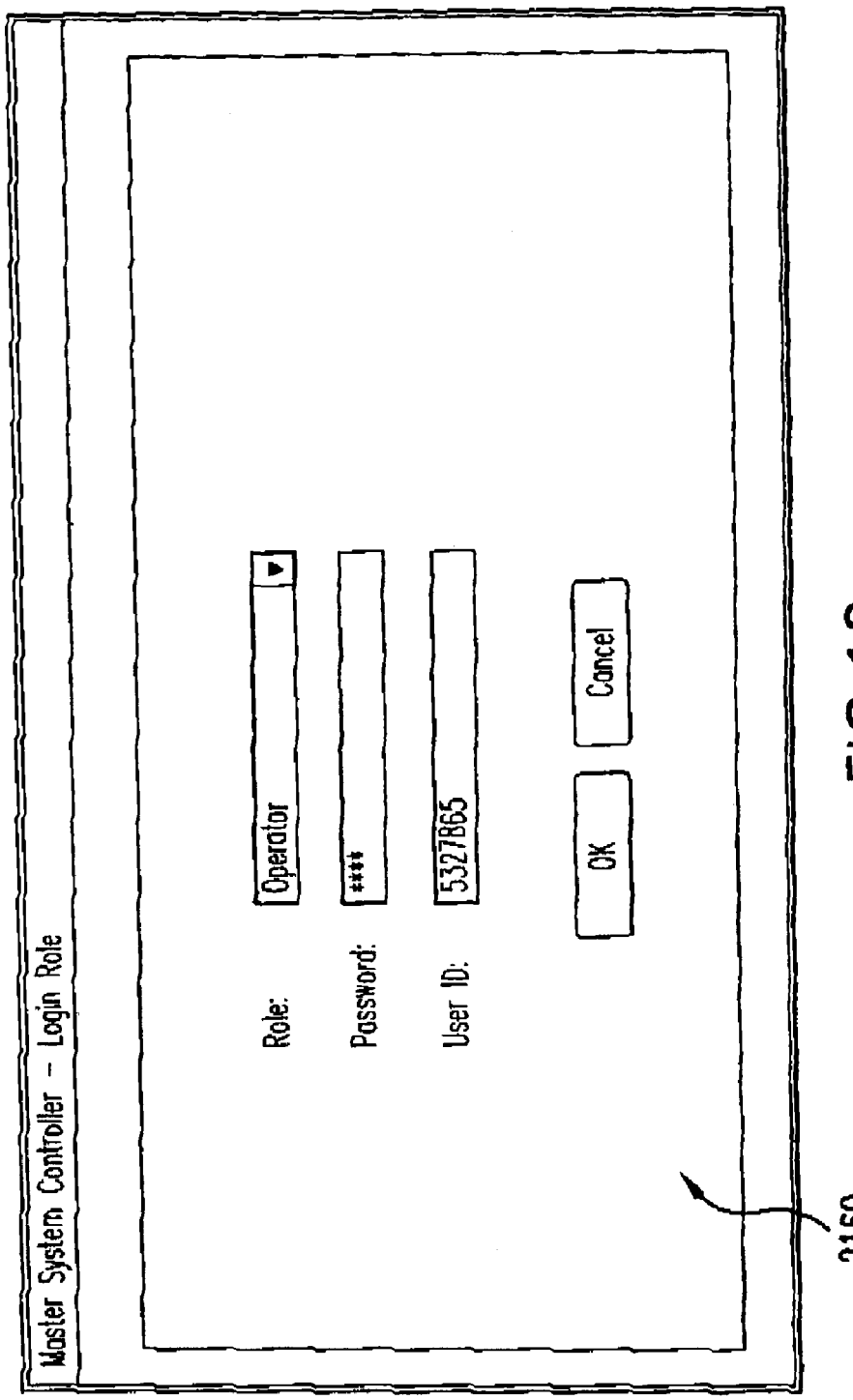
FIG. 18 shows by way of example an illustrative graphical user interface screen which may be utilized according to aspects of an embodiment of the disclosed subject matter.

The system need not maintain the modification history of the recipe information (DB-MSC-RCP). If a Field Service Engineer starts a recipe process, the Process Engineer may later cancel it (DB-MSC-ACS). The MSC 10 can be flexible enough to support both single login and user ID based tracking (GUI-SEC-SCM). The following Access levels (based upon roles) can be required: a. Process Engineer, b. Field Service Engineer, c. Administrator. The Administrator can perform all functions that can be available to the Process Engineer and Field Service Engineer. Field Service Engineer and Process Engineer roles overlap (GUI-SEC-SCM). The MSC 10 can show a screen, e.g., as illustrated in FIG. 18, with role-based login followed by an ability to enter the ID of the user prior to, e.g., running a recipe. The ID of the user can be included in the recipe process reports. Users can create recipes without entering a user-ID. An ID may be required when the recipe is processed (GUI-SEC-SCM). Users cannot change task scripts (DB-MSC-ACS). Information in the task scripts may be proprietary to the machine supplier.

General Interface Requirements, listed here may relate to communication interfaces. TCP-IP may be a main type of communication needed between the Master System Controller 10 and the devices unless otherwise explicitly specified under the specific device interface requirements (SVR-DEV-DRV). The system can use a generic mechanism to issue device commands corresponding to the high level actions. This mechanism can be independent of the device types (SVR-DEV-FMT). The device commands can be stored in a database or file. They may or may not be hard-wired in the code (DB-OEM-CMD).

The communication between the Master System Controller 10 and the devices may be for two purposes: control and diagnostics (SVR-DEV-DRV). After, e.g., an exposure command is given (i.e. the scan is started), the Master System Controller 10 can wait until the exposure is complete (SVR-SCR-LOT). The Master System Controller 10 can know the serial numbers of the attached devices and use them to identify the devices during communication if the devices provide commands to retrieve their serial numbers (SVR-DEV-DRV). The Master System Controller 10 can poll the devices, so that no interrupts from the devices are processed (SVR-DEV-DRV). The system can integrate with customer MES 80. The MSC 10 can support the SEMI standard: SEMI Equipment Communication Standard and Generic Equipment Model (SECS/GEM) Interface to facilitate communication with a host machine 910. There may be, e.g., a WAN or LAN connection to the MSC 10 over VPN 820, e.g., as shown in FIG. 8.

Service and maintenance areas can be physically divided. Access to Laser status information from the service area can be required. It can be possible to monitor the MSC from a different physical area. The interface protocol can support four modes of communication: 1) Receive Only 2) Send Only 3) Receive followed by Send 4) Send followed by Receive (SVR-DEV-DRV);

Laser Interface Requirements listed here can be the requirements related to the communication of the Master System Controller 10 with the laser device module. There can be one communication interface between the MSC 10 and the laser 330 for control purposes. There are currently approximately 10-15 such commands (SVR-DEV-DRV). There can be one communication interface between the MSC 10 and the laser 330 for diagnostic purposes. There are currently approximately 80-100 such commands (SVR-DEV-DRV). The MSC 10 can use a CORBA 824 to get diagnostic information from, e.g., XLA or XLX series of Lasers, such as those sold by applicants' assignee Cymer Inc. and related Cymer lasers with similar diagnostic facilitators (SVR-DEV-DRV). Some of the lasers have more than one serial port, RS232 or RS422, the latter for needed fast response and the former for acceptable slow response (SVR-DEV-DRV).

Stage Interface Requirements listed here can be the requirements related to the communication of the MSC 10 with a stage device module. The user can be able to view the Stage device's GUI 40 from the MSC 10 machine using remotely running control software or some other similar mechanism. There can be one communication interface between the MSC 10 and the stage for diagnostic and control purposes (SVR-DEV-DRV). For the MDBox 334 Interface Requirements, listed here can be the requirements related to the communication of the MSC 10 with the master distribution box device module. There can be one communication interface between the MSC 10 and the MDBox 334 for diagnostic and control purposes and another communication interface for admin and logging (SVR-DEV-DRV). BSC 336 Interface Requirements listed here can be the requirements related to the communication of the MSC 10 with the BSC 336 device module. There can be one communication interface between the MSC 10 and the BSC 336 for control purposes (SVR-DEV-DRV). Attenuator 338 Interface Requirements listed here can be the requirements related to the communication of the MSC 10 with the Attenuator 338 device module. There can be one communication interface between the MSC 10 and the Attenuator 338 for control purposes (SVR-DEV-DRV). Handler Interface Requirements listed here can be the requirements related to the communication of the MSC 10 with the cassette handler device module. A Robot can be used for substrate loading and unloading. From the MSC 10 point of view, the Robot can be treated like any other device with a serial interface connected to MSC 10 using Lantronics TCP/IP interface 840 (SVR-DEV-ROB). The system may account for the fact that such a Robot may have no storage capability (SVR-DEV-ROB). Process Shutter Interface Requirements listed here can be the requirements related to the communication of the MSC 10 with the process shutter device module. One can exist (SVR-DEV-DRV).

Beam Metrology Interface Requirements listed here can be the requirements related to the communication of the MSC 10 with the Beam Metrology device module 830. The beam metrology interface can be internal or external to the MSC 10 (SVR-DEV-DRV). Reporting Requirements listed here can be the requirements related to the creation and presentation of the reports and logs by the MSC 10. The System can capture lot or project execution info and store it in a datastore for later retrieval (SVR-SCR-PRJ, SVR-SCR-LOT). Users can view and print the lot/recipe info and lot/project execution info (GUI-REP-PRJ, GUI-REP-LOT). Users can view/print the event log (GUI-STS). The system can maintain the history of lot and project executions. Also the system log may be required for crash recovery, Access Log, etc. (DB-MSC-JOB). When a project or lot is run, the execution log can be saved for a certain period of time (DB-MSC-JOB). Data analysis may be required. Trend data may be needed. The reports may mostly be needed for diagnosis. They can be files with simple format. Users might use Excel to analyze the data. The MSC 10 can report system and device configurables (GUI-REP-CFG). Additional status parameters such as Laser high voltage etc. could be required and user selectable for the currently running process. The MSC 10 can show these in the Job queue screen, e.g., the screen 33 illustrated in FIG. An FSE can be able to configure the status tabs (GUI-JOB-STS, GUI-CFG-STS).

Error Handling, Exceptions and Error Recovery Requirements listed here can be the requirements related to the exceptions and error recovery of tasks execution by the MSC 10. An event loop in the MSC 10 can poll the status from all attached devices. Most of this polling can be done through the MDBox 334 (SVR-STS-STL). The MSC 10 may not be responsible for handling the fast errors in the devices, but it can report the status of the devices. The MSC 10 may not have any control after it starts the scan (SVR-STS-STL). There can be a timeout for each device command to acknowledge (SVR-DEV-DRV). The timeout parameter in the event loop can be adjustable. All timeout periods can be database driven (GUI-CFG-SYS). A window showing the status and errors from the system can be open for view. It may have date, time, error code, source file, line number etc. (GUI-STS-STM). An ability to override errors by error level, module level or error code can be provided (GUI-JOB-QUE). All errors can be logged in the event log (SVR-STS-STM). There can be a handshaking timeout for each interface (GUI-CFG-DEV). Initialization, Status check, Project execution, lot-to-lot check, recipe-to-recipe check, image-to-image check and Scan errors can be fatal. Utility errors during Scan might be treated as warnings and can be ignored (SVR-SCR-LOT). If an error is detected (whether fatal or not), the system can stop and give the user an option to abort, retry or override and continue (SVR-JOB-JBM, GUI-JOB-QUE). Field Service Engineers and Administrators can override an error and continue (DB-MSC-ASC). Manual initialization of the devices (GUI-PRJ-PJM) may be required. Warnings may be displayed as informational messages, which may not stop the process flow (SVR-STS-STL). If the lot processing is stopped or aborted due to an error, based on the user's choice, the recovery might be: Start next image, Start next Substrate, or Start next Lot. In an error situation, the MSC 10 can provide for the following options: restart the substrate, skip the substrate or abort the entire lot (SVR-SCR-LOT). Expected error types can be: Acknowledgment timeouts at module or system level, State errors from devices, Calibration errors, Parameter measurement errors, Doubtful results of calculations (DB-OEM-STS). A Crash Recovery Procedure might include:

1. MSC 10 can continuously poll status from the MDBox 334
2. MSC 10 can manage a "state full" crash recovery log
3. On server crash MDBox 334 can be missing in this Polling
4. MDBox 334 can send signal to Laser and Stage to Stop
5. Once Rebooted MSC 10 can go through its log(s) to determine if it was a Crash or Normal shutdown
6. In case of a crash, it can take fingerprints and start the process of initialize and status check and can resume from the point, where the system crashed.

In a crash recovery state, the MSC 10 can recognize the crashed state (from its own log(s) as well as the log(s) from the devices). It can capture fingerprints to determine at what state all modules can be currently placed. The queue can be stopped. The User can be notified about the crash and can be presented with a screen containing fingerprint information. Manual intervention from the operator can be required to adjust the recipe for a restart (SVR-SCR-TSK). For a missing pulse, the MSC 10 can recover based on a user's choice. This can be part of normal error handling (SVR-SCR-ERH). Recovery may be not possible at higher energy levels and therefore the MSC 10 may ask the user to continue with the next substrate or next lot (SVR-SCR-ERH). Occasionally the glass/substrate can be broken. This detection may be not automatic. The operator may visually detect it based on device status information. A Manual abort may result (GUI-JOB-QUE). The MSC 10 can collect data and store it in the database for troubleshooting (SVR-STS-STM, DB-MSC-LOG). The MSC 10 can handle hard shutdown (i.e. lost power or accidental power off to a device) (SVR-STS-ERH). A visual indication may be provided if a parameter exceeds a threshold. A status loop may generate an alert and/or provide visual cues (GUI-JOB-STS).

Performance Requirements listed here can be the performance requirements related to the serviceability, maintainability, responsiveness and throughput of the workpiece product. To maximize throughput, parallel tasks might required to be run during the Exposure. For example, while exposing the substrate, Laser diagnostics can be collected simultaneously (SVR-SCR-LOT). To maximize throughput, the system may eliminate or minimize waiting time, e.g., by running tasks in parallel (SVR-SCR-LOT). Substrate exposure time can be less than 90 seconds (SVR-SCR-LOT). Substrate exchange time can be less than 45 seconds (SVR-DEV-ROB). The MSC 10 software may allow a throughput of approximately 30 substrates per hour (SVR-SCR-LOT). Mean time between interrupts should be less than a week. Downtime should be designed to not be more than 30 minutes in a 24-hour period (i.e., about 98% availability).

Usability Requirements listed here can be the usability requirements related to the convenient use of the product. Keyboard and mouse support may be required in addition to touch-screen functionality or as an alternative to touch-screen functionality. During recipe creation, a touch-screen may not be that valuable. For day-to-day running by Process Engineer and Field Service Engineers, touch screen, if available, may be valuable. Stylus based touch screen operation of the GUI 40 may be provided (GUI). Touch-screen may be a lesser priority if screen real estate is crowded. The more information shown on the screen, the better (GUI).

The MSC 10 has a number of external interface requirements, in addition to the user interfaces noted in the above Requirements list. In terms of hardware interfaces, the MSC 10 software interfaces with the following devices: master distribution module ("MDbox"), Laser, beam stabilization controller ("BSC"), Stage, Attenuator 338, Process Shutter, Beam Metrology, Handler, Cassette, and Robot. A software interface between MSC 10 based machines allows an export/import of information such as recipes and images. The MSC 10 can also use, e.g., a Stage device's software interface to, e.g., retrieve diagnostic information. The following interfaces can be utilized for communication by the MSC with other devices: TCP, HTTP, CORBA and USB. The MSC Software communicates with the associated hardware in real-time, mostly for purposes of collecting monitoring information and for submitting low-level commands to the devices, with reasonable speed and accuracy to allow the above functions. Quality attributes for the MSC 10 software include Flexibility, Robustness, Dynamicness, User Friendliness, Ease of Use and a User Interface, that is, intuitive and user friendly.

The following related to use cases ("UCSs") for the MSC 10 regarding particular actors, i.e.; Process Engineer, Field Service Engineer, and Administrator.

Figure 22:
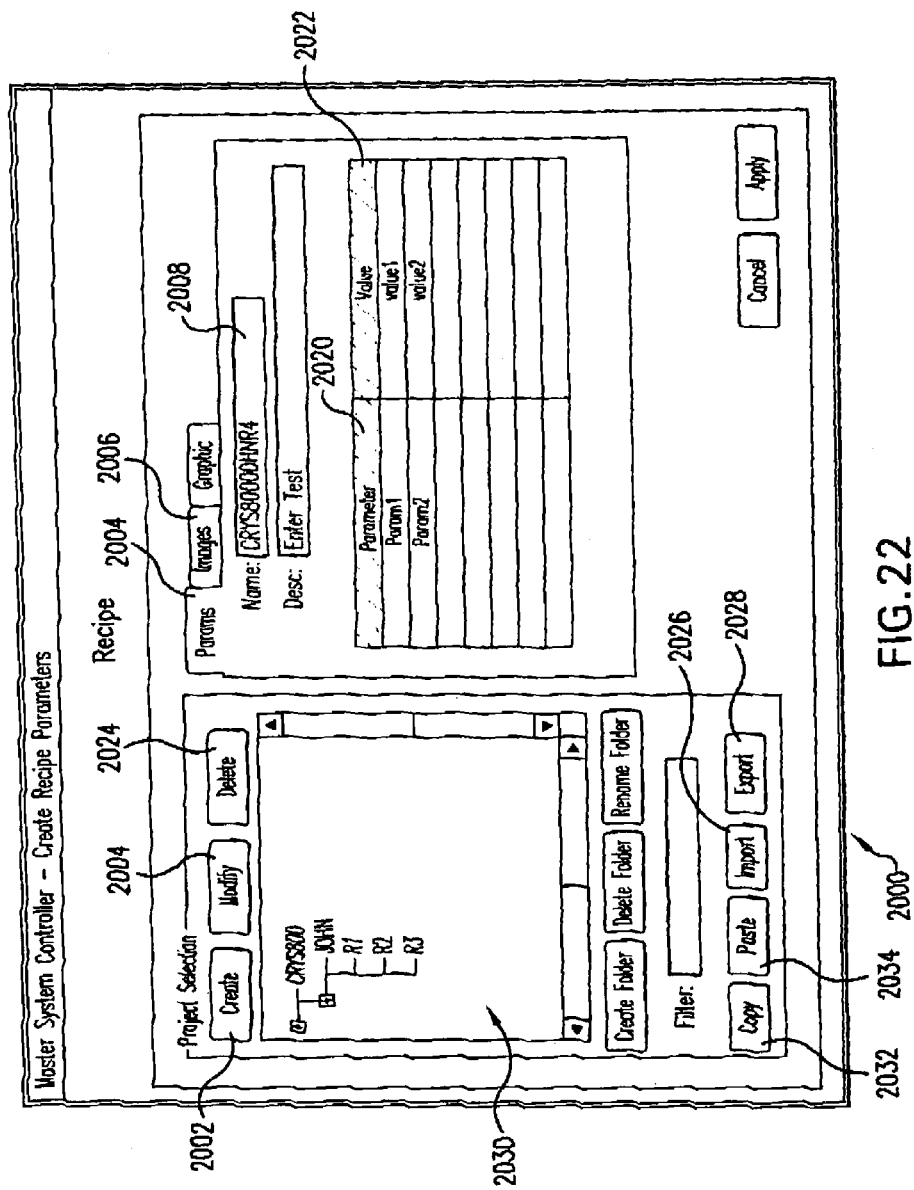
FIG. 22 shows by way of example an illustrative graphical user interface screen which may be utilized according to aspects of an embodiment of the disclosed subject matter.

Regarding Manage Recipe, e.g., using the GUI 40 "Recipe" interface screen 2000 illustrated by way of example in FIG. 22 the following Sub Use Cases apply. First there may be a Create Recipe sub-use, available to all users, whereby, the user, once logged in, creates a new recipe with its associated image data, in the database. The user asks the system to create a recipe named by the user. The user, if logged in and authorized, may use the "Create" button 2002 which will be activated for authorized user. The user can enter recipe name in the "Name" box 2008, e.g., CRY5800/JOHN/R4 as illustrated in FIG. 22 to be added to the user "JOHN" recipe list 2030 as shown. The system puts the recipe in edit mode. The user supplies recipe parameters. The user adds the images to the recipe. The user optionally imports recipe data using the Import Recipe use case discussed below or, e.g., in "Parameter" display 2020. The user optionally pastes recipe data using Paste Recipe use case discussed below. The user optionally imports images into the recipe using Import Image use case discussed below. The user optionally pastes an image into the recipe using Paste Image use case, discussed below. The user supplies image parameters. The user optionally exports an image using Export Image use case discussed below. The user optionally copies an image using Copy Image use case discussed below. The user indicates to the system that he is done with the changes. The system performs recipe and image data consistency checks. The system creates and stores the recipe in the datastore, e.g., the MSC schema.

There may be a Modify Recipe sub-use case available to all users, whereby, the user, once logged in, modifies an existing recipe in the datastore. The user utilizing the "Modify" button 2004 selects a recipe from a pick list and the system retrieves the requested recipe from the datastore and puts it in edit mode. The user edits the recipe image and/or parameters, e.g., selecting the "Params" display 2004 or "Images" display 2006, and in the case of "Params" as illustrated in FIG. 22, modifies the Parameter list 2020 and/or the "Value" list 2022 adding or deleting images from the recipe, changing the name of the recipe, e.g., in "Name" box 2008 and optionally uses the import, copy, paste and like functions noted for the Create Recipe use case.

There may be a Delete Recipe sub-use case whereby the authorized user, once logged in, deletes an existing recipe from the datastore, e.g., using the "Delete" button 2024. The user selects a recipe from a pick list and deletes it.

There may be an Import Recipe sub-use case, whereby the user imports a recipe data from an external file while creating or editing recipes, e.g., using the "Import" button 2026. The user supplies the name of a file, residing on the network drives, and the system populates the recipe create or edit mode with the recipe data read from the file for the subsequent use by the user as noted above. The user continues with the recipe create or edit mode as described in the Create Recipe and Modify Recipe use cases.

There may be an Export Recipe sub-use case, whereby the user, once logged in, exports a recipe into an external file, e.g., using the "Export" button 2028 shown in the screen of 2000 FIG. 22. The system provides a pick list of recipes and the user selects a recipe and the name of the file into which to save the exported recipe data, including names of files residing on the network drives.

There may be an Import Image sub-use case, whereby, once logged in, the user imports an image from an external file while creating or editing recipes, e.g., using the "Import" button 2026 and selecting the "Image" display 2006. The system asks the user to supply the name of a file, including names of files residing on the network drives, and the system populates the recipe create or edit mode with the image data read from the file.

There may be an Export Image sub-use class, whereby, once logged in, the user exports an image into an external file while creating or editing recipes, e.g., selecting the "Export" button 2028 and the "Image" display 2006. The user supplies the number of the image and the name of a file into which to save the exported image data, including names of files residing on the network drives.

There may be a Copy Recipe sub-use case, whereby, the user copies a recipe into system clipboard to paste it later in recipe edit mode, e.g., using the "Copy" button 2032. The user supplies the name of a recipe in the datastore and the system populates the clipboard with the recipe data from the datastore, e.g., making parameter and/or images available in the respective displays 2020 and 2022.

There may be a Paste Recipe sub-use case whereby, the user pastes recipe data from system clipboard while creating or editing recipes, e.g., using the "Paste" button 2034. The user asks the system to paste a recipe from system clipboard. The system populates the recipe create or edit mode with the recipe data read from the system clipboard. The user continues with the recipe create or edit mode as described in the Create Recipe and Modify Recipe cases.

There may be a Copy Image sub-use case, whereby the user copies an image into system clipboard while creating or editing recipes, e.g., using the "Copy" button 2032 and selecting the "Image" display 2006. The system asks the user to supply the number of the image in the recipe to copy and populates the clipboard with image data from the recipe, using the supplied image number. The user continues with the recipe create or edit mode as described in the Create Recipe and Modify Recipe use cases.

Figure 23:
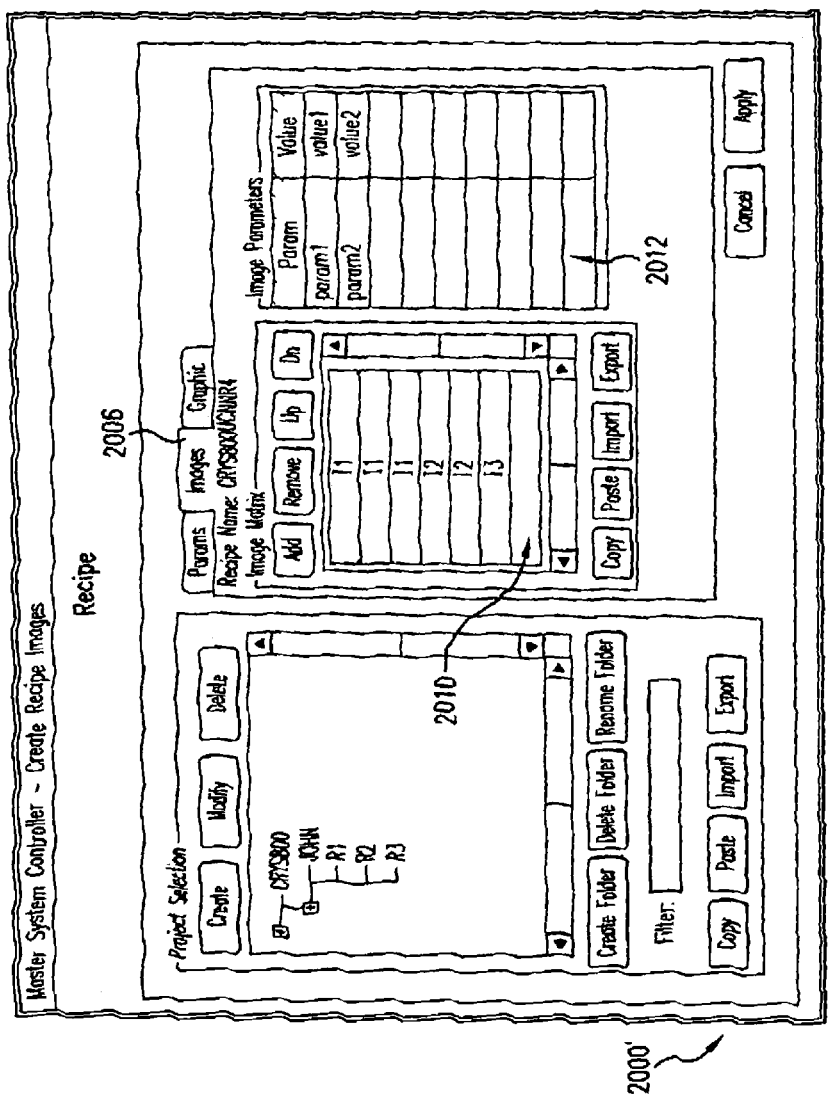
FIG. 23 shows by way of example an illustrative graphical user interface screen which may be utilized according to aspects of an embodiment of the disclosed subject matter.

There may be a Paste Image sub-use case, whereby, the user pastes an image from a system clipboard into a recipe while creating or editing recipes, e.g., using the "Paste" button 2034 and selecting the "Image" display 2006, e.g., bringing up the display shown by way of illustrations in FIG. 23. The system populates the recipe create or edit mode with the selected image data read from system clipboard, e.g., as illustrated in window 2010 where images for a Recipe may be listed when the "Images" tab 2006 is selected and in window 2012 where values for parameters for a given Image may be viewed.

There may be a List Recipes sub-use case, whereby, once logged in, the user lists all recipes in the database. The system displays the names of all the recipes in the datastore in a hierarchical folder structure.

There may be a View Recipe sub-use case, whereby the user views and prints the data of a recipe in the datastore. The system displays the data of the recipe, including the image data, to the user, and the user optionally asks the system to print the recipe data.

There can be Manage Project Sub Use Cases as follows which may bring up in the GUI 40 interface the screen 2050, which may include a Project Name box 2052, where the user may add or edit a Project Name and a Project Description box 2054 of FIG. 24 containing a brief description of the Project. There may be a Create Project sub-use case, whereby, the user, once logged in creates a new project for maintenance or monitoring. The user asks the system to create a project using one of the two views: standard view or custom view. The system puts the project in edit mode. The system displays the standard view, e.g., as shown on the screen 2050' in FIG. 25 at 2060 and 2062. The user adds tasks into the project, e.g., using window 2053 of FIG. 24. The user optionally activates/deactivates tasks added to the project, also as shown by way of example in window 2053. The user supplies runtime parameters for the tasks added into the project. The user indicates to the system that he is done with the changes. The system performs project data consistency checks. The system creates and stores the project in the datastore. If the user asks for custom view, the system displays a custom view, e.g., from those listed in window 2064 of FIG. 25, e.g., Laser control, Laser diagnosis, Laser download, stage control, Stage Diagnosis and Stage Download, and the user can select a project template, e.g., from Diagnostics, Download, and Control. The system displays a custom form based on the selected template, such as shown by way of example in FIGS. 26-28, Control Template 2070, Diagnosis Template 2080 and Download Template 2090, respectively. The user supplies, e.g., project data (e.g. tasks to be included in the project, e.g., using window 2051 in screen 2050 of FIG. 24, runtime parameters for tasks, e.g., using windows 2010, 2012 of screen 2000' of FIG. 23, etc.). The user optionally runs the project for an immediate on-demand execution. The system can add the project to the top of the job queue, start the job queue in step mode if the job queue is not already started and displays the results of the job execution.

Figure 26:
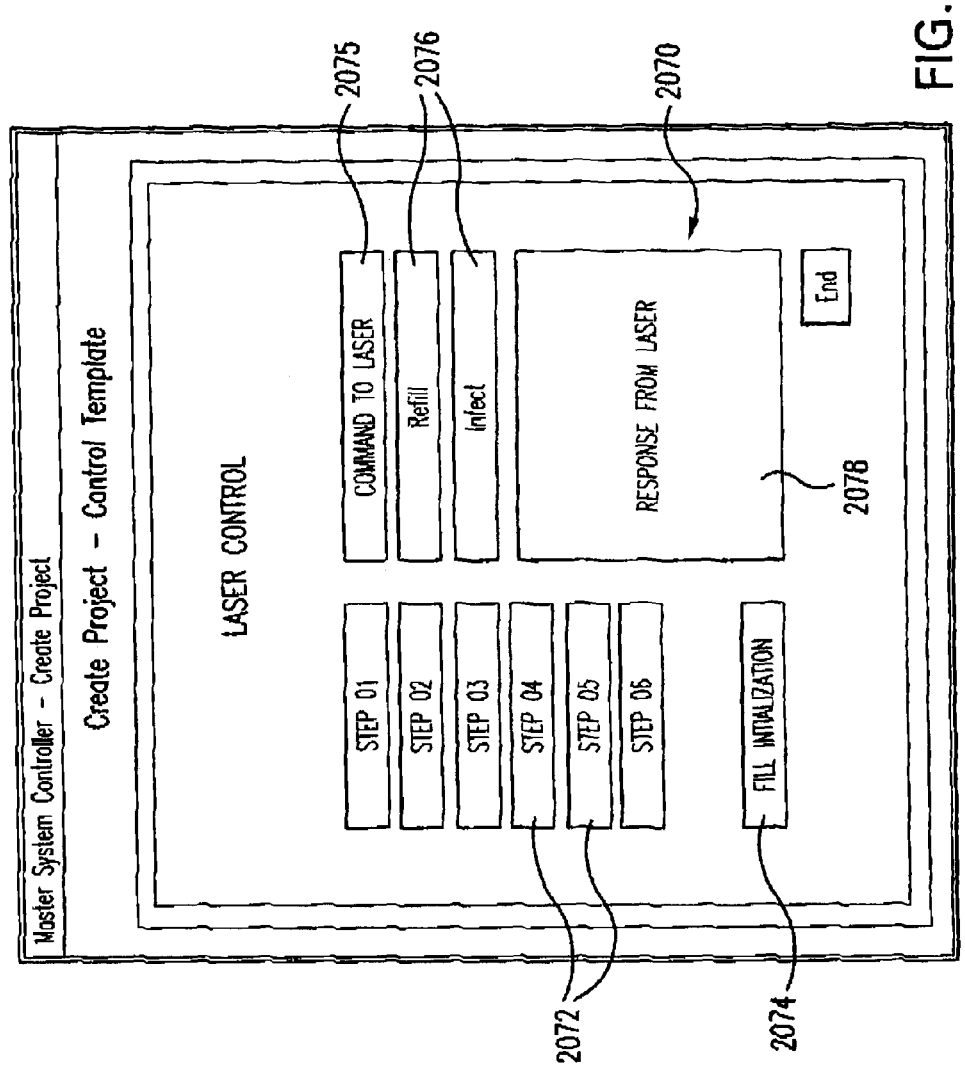
FIG. 26 shows by way of example an illustrative graphical user interface screen which may be utilized according to aspects of an embodiment of the disclosed subject matter.
Figure 27:
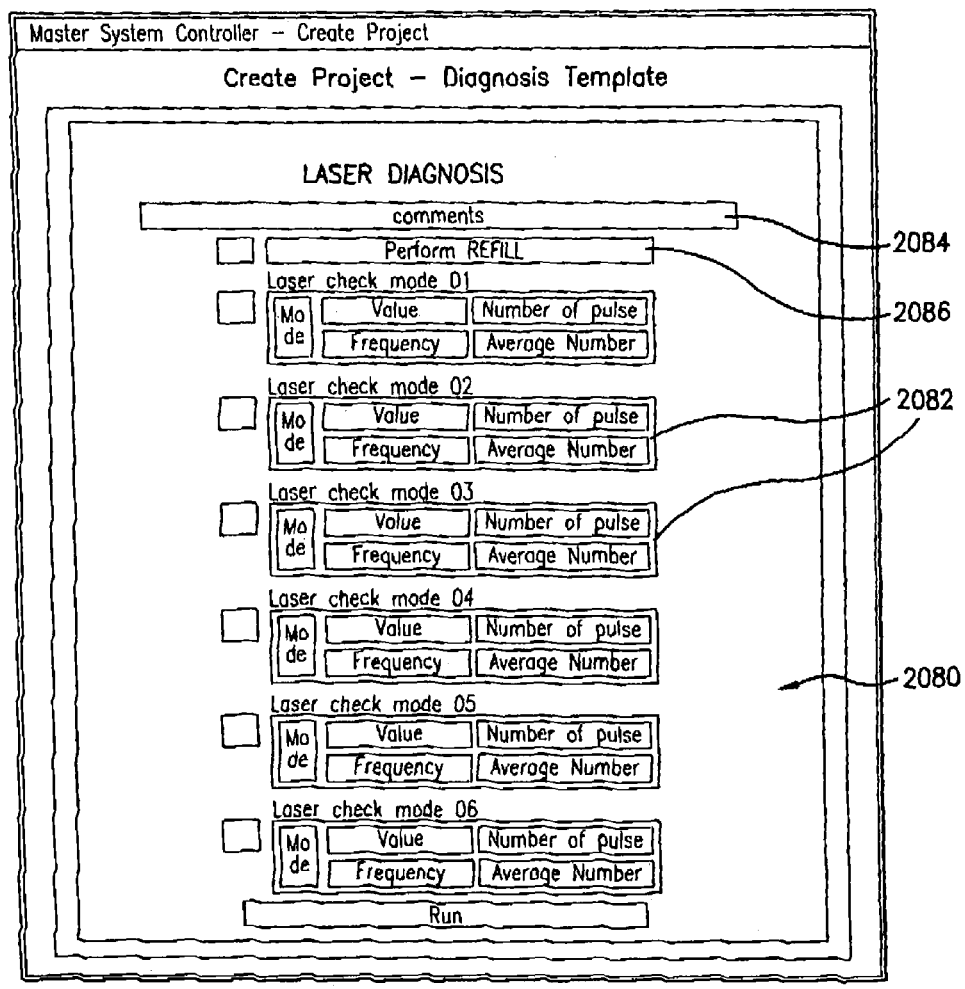
FIG. 27 shows by way of example an illustrative graphical user interface screen which may be utilized according to aspects of an embodiment of the disclosed subject matter.
Figure 28:
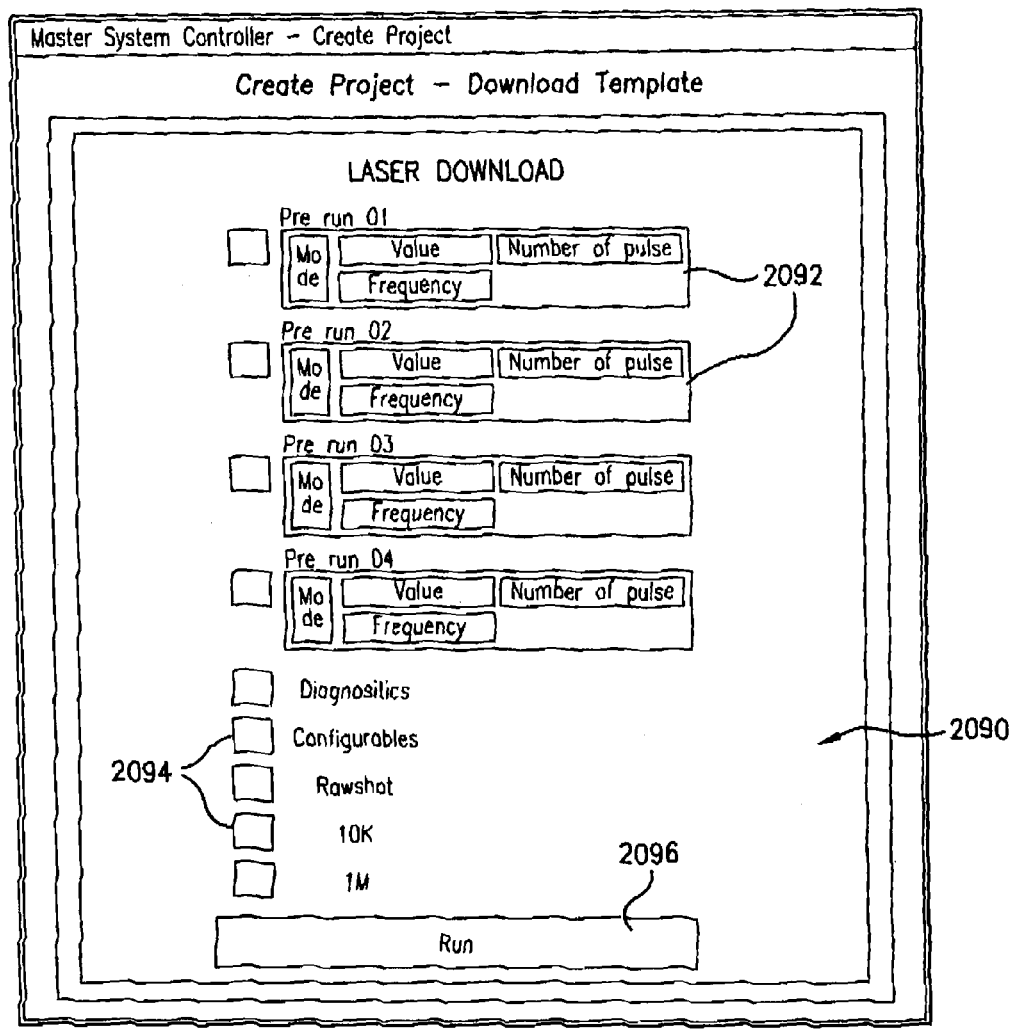
FIG. 28 shows by way of example an illustrative graphical user interface screen which may be utilized according to aspects of an embodiment of the disclosed subject matter.

There may be a Modify Project sub-use case, whereby, the user modifies an existing project. The user selects a project from a pick list. The system retrieves the requested project from datastore and puts it in edit mode, e.g., as illustrated on the screen of FIG. 24. The system can display the standard view. The user adds or deletes tasks from the project. The user optionally activates/deactivates tasks in the project, e.g., in window 2053. The user edits tasks present in the project using Edit Task use case, e.g., by selecting tasks shown in window 5051. The user can also change the sequence of tasks in the project. The user can change the name of the project. The user indicates to the system that he is done with the changes, e.g., with the "Apply" button in FIG. 24. The system can then store the project in the datastore. If the project is created using a template, the system can display a custom view, such as are illustrated in FIGS. 26-28 for Laser system custom templates, Control, Diagnosis and Download, respectively. The system can display a custom form based on the template of the project from Diagnostics, Download, and Control. The user can modify project data (e.g. tasks to be included in the project, runtime parameters for tasks etc.). The user optionally can run the project for an immediate on-demand execution whereby the system adds the project to the top of the job queue, starts the job queue in step mode if the job queue is not already started and displays the results of the job execution.

There may be a Delete Project sub-use, whereby, the user deletes an existing project from the datastore. The user selects a project from a pick list and it is deleted.

Figure 24:
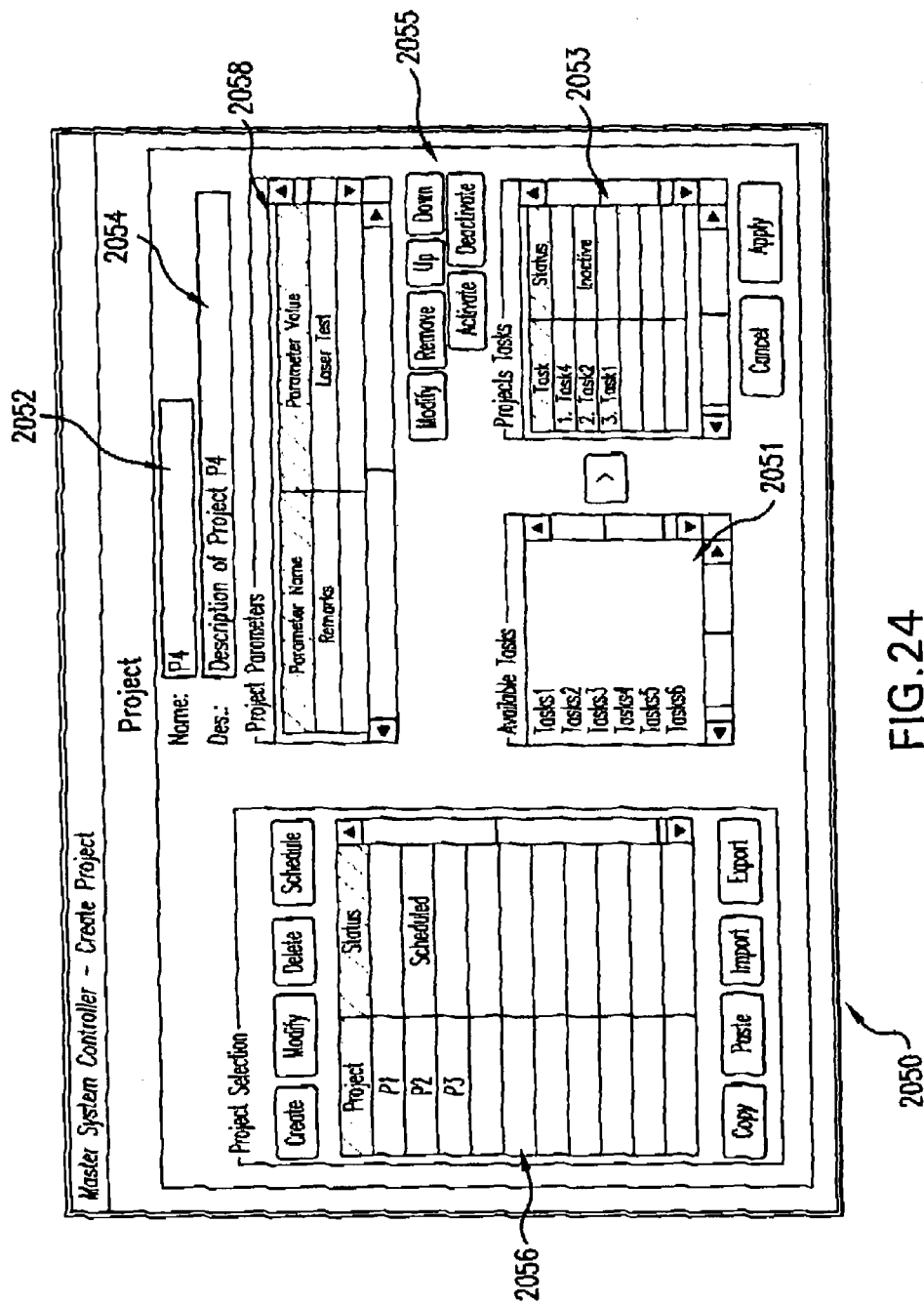
FIG. 24 shows by way of example an illustrative graphical user interface screen which may be utilized according to aspects of an embodiment of the disclosed subject matter.
Figure 25:
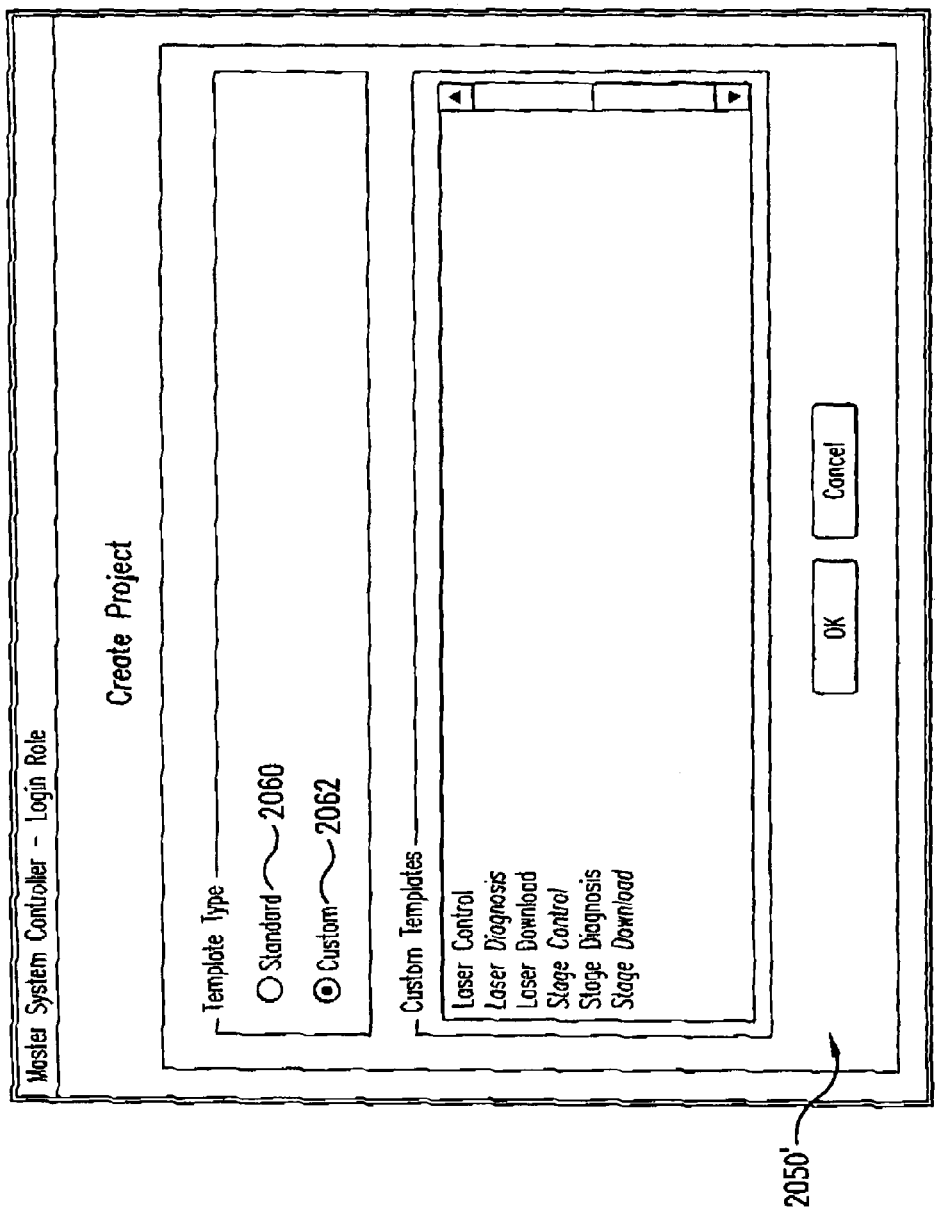
FIG. 25 shows by way of example an illustrative graphical user interface screen which may be utilized according to aspects of an embodiment of the disclosed subject matter.

There may be a List Projects sub-use case, whereby, the user lists all projects in the datastore, e.g., in the window 2056 of FIG. 24. There may be a View Project sub-use case, available to all users, whereby, once logged in, the user views a project in the datastore selected from the list of window 2056, such as in windows 2053 and 2058. There may be a List Tasks sub-use case, available to all users, whereby, once logged in, the user lists all tasks in the datastore, e.g., in window 2051. There may be a Import Project sub-use case, available to all users, whereby, once logged in, the user imports project data from an external file, e.g., using the "Import" button on the screen 2050 of FIG. 24, while creating or editing projects. The system populates the project create or edit file mode with the project data read from a designated file.

There may be an Export Project sub-use case, whereby, once logged in, the user exports a project into an external file, e.g., using the "Export" button on the screen 2050 of FIG. 24. The user asks the system to export a project into a selected external file. The system creates a new file or updates the existing file with project data from the datastore, using the supplied project name. There may be a Copy Project sub-use case, available to all users, once logged in, whereby, the user copies a project into the system clipboard to paste it later in project edit mode, e.g., using the "copy" button on the screen 2050 of FIG. 24. The user supplies the name of the project. The system populates the clipboard with the project data from the datastore, using the supplied project name.

The Laser Control control template 2070 of FIG. 26 may include a list of steps in blocks 2072 under "STEPWISE". It may also have a box 2074 for full initialization, a box 2075 to select a Command to the laser, boxes 2076 for refill and inject gas management commands and a box 2078 for responses from the laser. The Laser Diagnosis diagnosis template 2080 of FIG. 27 may include, e.g., a plurality of selectable laser check mode information boxes 2082, which when selected may display a mode indicator, a value indicator, a frequency indicator, a number of pulses indicator and an average number indicator. There may also be a box 2084 for comments and a box 2086 that can be selected to perform a gas refill. The Laser download download template 2090 of FIG. 28 may include a plurality of Pre-run information boxes 2092 that may show, e.g., mode, value, pulse number and frequency, along with a plurality of boxes 2094 to select, e.g., Diagnostics, configurables, RawShots, 10K and 1 M. Also it may include a "RUN" box.

There may be a Paste Project sub-use case, whereby, the user pastes project data, e.g., from a system clipboard while creating or editing projects, e.g., using the "Paste" button on the screen 2050 of FIG. 24. The system populates the project create or edit mode with the project data read from the system clipboard. The user continues with the project create or edit mode as described in the Create Project and Modify Project use cases.

Under the Manage Job Queue Use Case there can be the following sub-use cases. There may be a Add Job to Job Queue sub-use case, whereby, the user adds a lot or project into the job queue to process the lot or execute the job using the job queue. The system provides a pick list of lots/projects, from which the user selects a lot or project and supplies runtime parameters to the lot or project. (Runtime parameters for the lot may be substrate IDs, operator ID, cassette station number etc. Runtime parameters for the project can be operator ID, remarks etc.) The system adds the lot or project into the job queue.

There may be a Remove Job From Job Queue sub-use case, whereby, the user removes a lot/project from the job queue. The user selects a lot/project from the job queue and asks the system to remove it from the job queue. The system removes the lot/project from the job queue.

There may be a Change Job Sequence in Job Queue, sub-use case, whereby, the user changes the job sequence in the job queue. The user selects a job from the job queue and asks the system to move it up or down in the queue. The system moves the job to the new position in the job queue.

There may be a Start Job Queue sub-use case, whereby, once logged in, the user starts the job queue 2106 to start processing the jobs in the job queue from the front of the queue. The user asks the system to start the job queue, e.g., using the "Start" button 2102 of "Job" screen 2110 of FIG. 33. The system updates the status window 2100 to indicate that the job queue may be running. If the job queue 2106 was paused before, the system continues with the next task in the project. Otherwise, the system takes the unprocessed jobs from the front of the queue 2106, e.g., "Lot 1" in the status window 2100, makes a copy of the job and uses that copy to start executing one after another. If a lot is getting processed, the system displays the progress of the crystallization process and the substrate location of the currently executing lot graphically in a window, e.g., 2107 in FIG. 33. The system also displays a graphical representation 2104 of the cassette, e.g., which substrate is currently being processed, how many more substrates to go etc. The system updates the status of the currently processing job 2108 in the job queue 2106 to "Processing", e.g., in window 2100. When the processing for a job is complete and successful, the system changes the job's status in the job queue 2106 to "Processed", e.g., as shown in window 2100 for Job P2. If the system fails to successfully execute the job, it changes the job's status in the job queue to "Failed to Process".

There may be a Stop Job Queue, sub-use case, whereby, the user stops the job queue, e.g., with "Stop" button 2114 on screen 2110, to prevent it from processing the remaining jobs 2108 in the job queue 2106. The user asks the system to stop the job queue 2106. The system checks if a job 2108 is currently running. If a job, e.g., "Lot 1" in the job queue 2106 is currently running, the system prompts the user to select one of: abort the currently running job, pause currently running job, stop after finishing the currently running job. If the user selects abort, the system terminates the currently running job. If the user selects pause, the system stops after finishing currently running task of the job. If the user selects stop, the system stops the job queue 2106 after the currently running job finishes. The system updates the status window 2100 to indicate that the job queue may be stopped.

There may be a View Job Queue, sub-use case, whereby, the user views the list of jobs in the job queue 2108, e.g., with the screen 2110 of FIG. 33.

There may be a Put the Job Queue in Step Mode sub-use case, whereby, the user, e.g., with the "Stop" mode selector 2120 of FIG. 33, puts the job queue 2106 in step mode so that the job queue stops after executing each job 2108. The system updates the status window 2100 to indicate that the job queue 2106 may be in step mode.

There may be a Remove the Job Queue 2106 out of Step Mode sub-use case, whereby, the user takes the job queue 2106 out of step mode so that the job queue 2106 starts executing one job after another. The system puts the job queue in continuous mode, e.g., using the "Continuous" mode selector 2122, so that it starts executing all jobs in it one after another. The system updates the status window 2100 to indicate that the job queue 2106 is in continuous mode.

Figure 35:
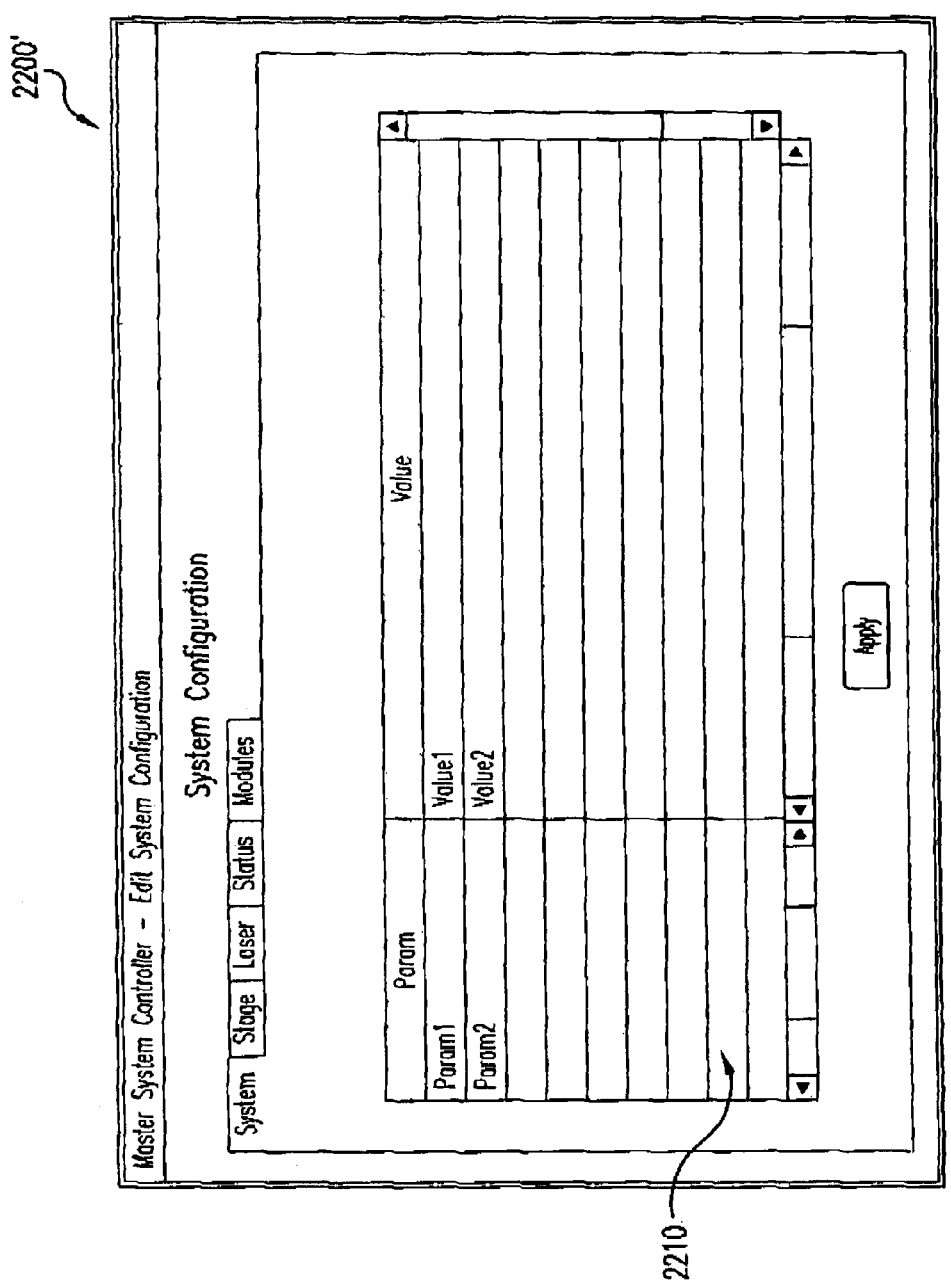
FIG. 35 shows by way of example an illustrative graphical user interface screen which may be utilized according to aspects of an embodiment of the disclosed subject matter.
Figure 36:
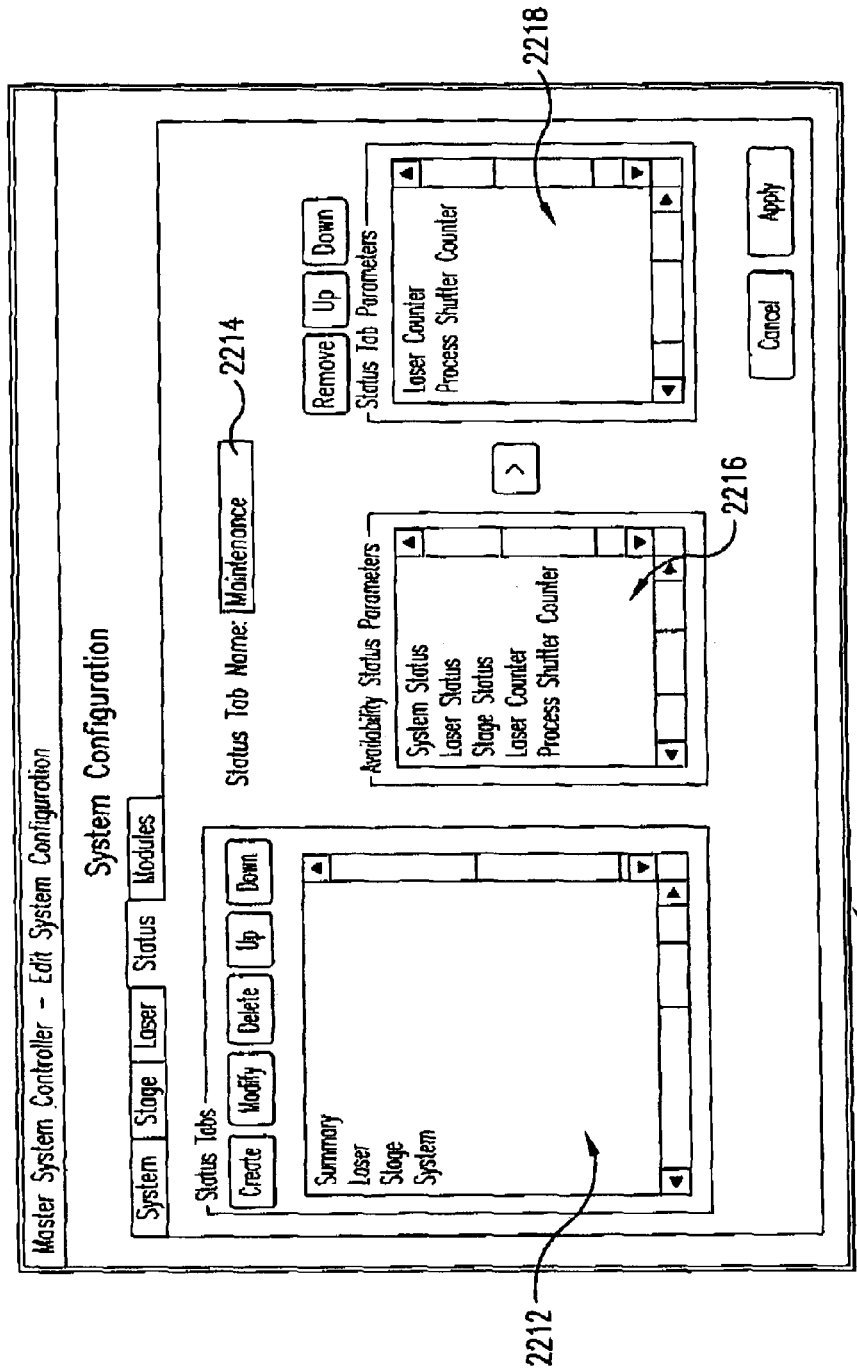
FIG. 36 shows by way of example an illustrative graphical user interface screen which may be utilized according to aspects of an embodiment of the disclosed subject matter.

There may be a View System Status sub-use case, whereby, the user sees the current status of the system and devices, e.g., in window 2130 of FIG. 33, or the screens of FIGS. 35,36. The system displays the current status of the system and devices on multiple status tabs, with each status tab showing current values of status parameters. The system provides visual indicators such as colors for the tabs and for the status parameters on the tabs, based on their severity: Fatal, Error, Warning or Message. The system also provides visual or textual indicators if maintenance is required for devices, components and modules.

Under the Manage Project Schedule Use Case there can be a number of sub-use cases as follows. There may be an Add a Project into Maintenance Schedule sub-use case, whereby, e.g., using the screen of FIG. 24, the user adds a project into a schedule, e.g., the maintenance schedule for scheduling monitoring. The user selects a project from the pick list 2140.

The system adds the project into the maintenance schedule and puts it in enabled state. The user provides the project schedule using the Edit Schedule of a Project in Maintenance Schedule use case, e.g., 2142 as shown on FIG. 29. As per the schedule of the project, the system adds the project to the top of the job queue, e.g., 2144 on FIG. 29. For example, if the supplied schedule is weekly, the system executes the project on the first day of the week, when the job queue 2144 may be started on that day.

There may be an Remove Project From Maintenance Schedule sub-use case, once logged in, whereby, the user removes a project from the maintenance schedule used for scheduled monitoring, e.g., using the "Delete" key 2146. The system removes the project from the maintenance schedule.

Figure 29:
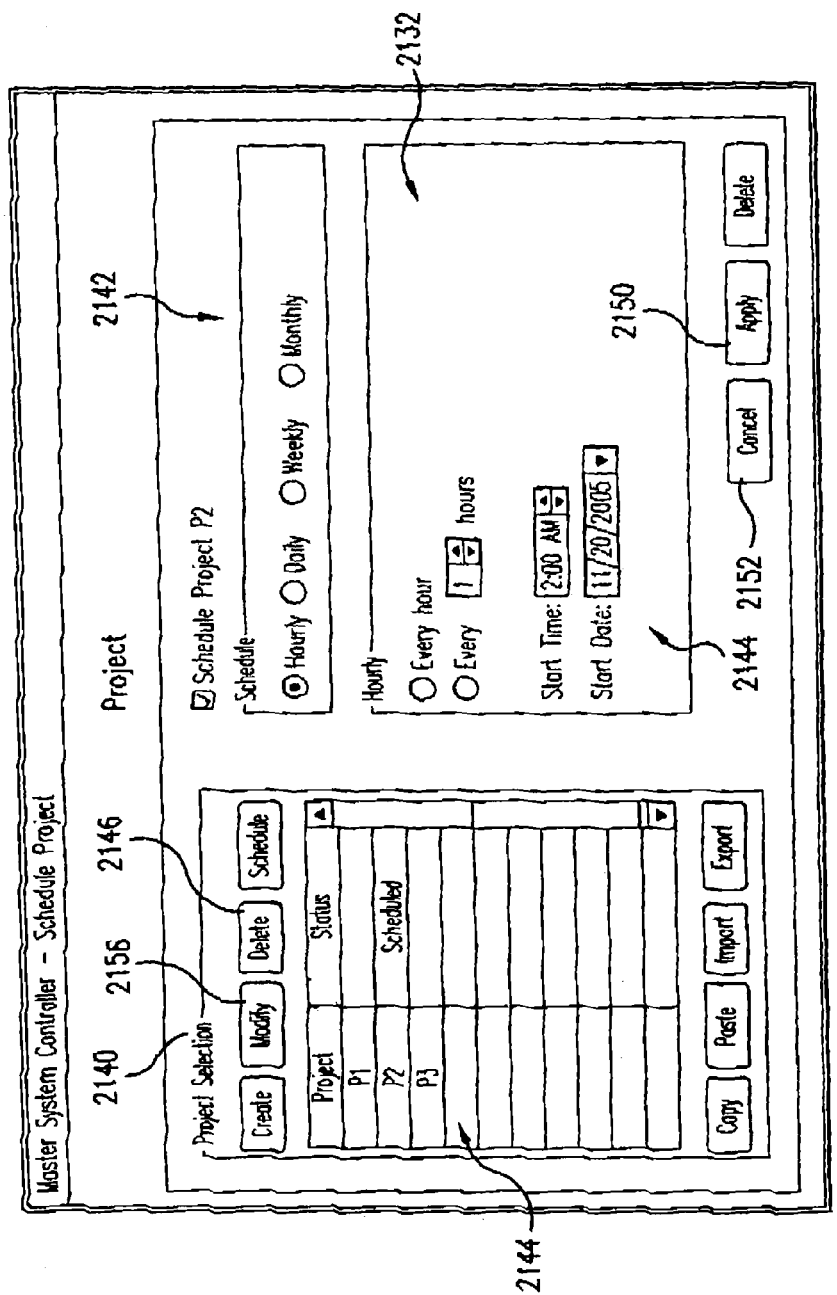
FIG. 29 shows by way of example an illustrative graphical user interface screen which may be utilized according to aspects of an embodiment of the disclosed subject matter.
Figure 30:
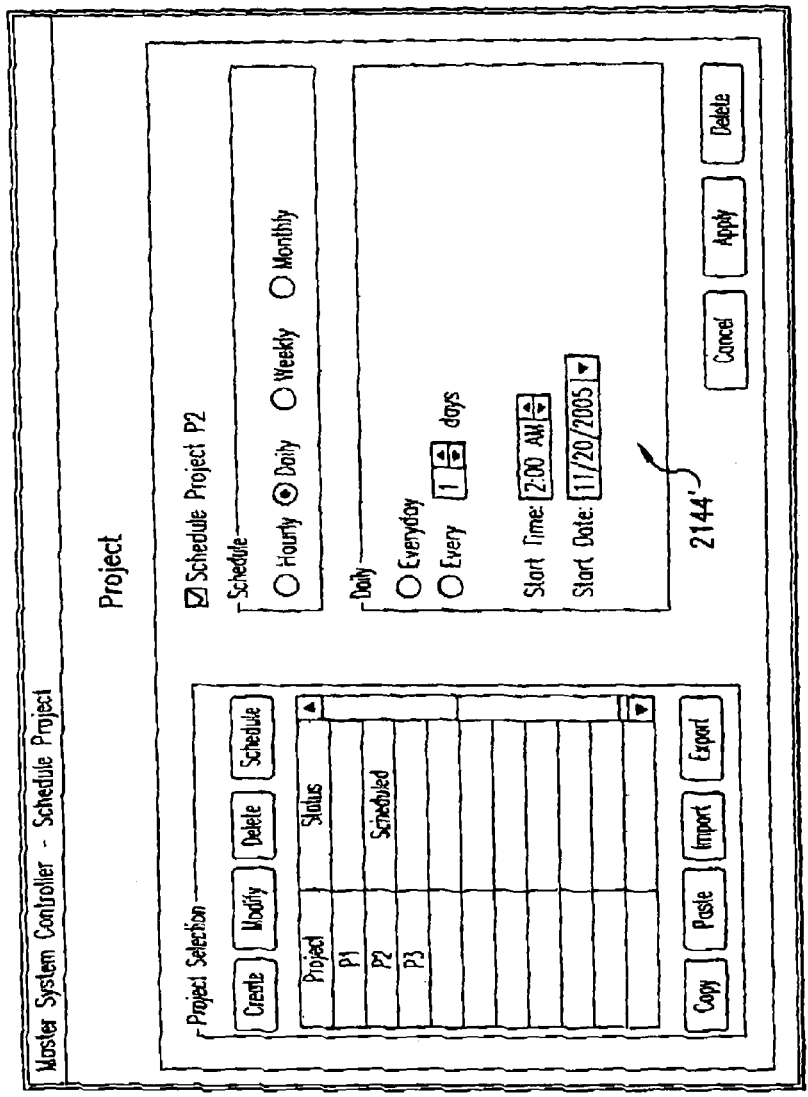
FIG. 30 shows by way of example an illustrative graphical user interface screen which may be utilized according to aspects of an embodiment of the disclosed subject matter.

There may be an Enable A Project In Maintenance Schedule sub-use case, whereby, the user activates a project in the maintenance schedule for scheduling, e.g., using the "Apply" button 2150 on the screen of FIG. 29. The system enables the project for scheduled maintenance. As per the schedule of the project, the system executes the project when the first recipe of the day is processed.

There may be a Disable A Project In Maintenance Schedule sub-use case, whereby, the user deactivates a project in the maintenance schedule so that it won't be scheduled, e.g., using the "Cancel" button 2152 in FIG. 29.

There may be an Edit Schedule of a Project in Maintenance Schedule sub-use case, whereby, the user modifies the schedule of a project in the maintenance schedule, e.g., using the "Modify" button 2156. The user selects a project from the Maintenance Schedule, the system asks the user to supply the schedule for the project. The user supplies the schedule as Daily, Weekly or Monthly, e.g., in the window 2142 of FIG. 29. The system updates the maintenance schedule of the project.

There may be a View Maintenance Schedule sub-use case whereby, the user views the maintenance schedule 2144.

Under the Login Sub Use Cases the following sub-use case may apply. There may be a Login User sub-use case under which a user can be logged in, e.g., using the screen 2160 of FIG. 18.

There may be a Switch User sub-use case under which the user changes the logged in user to the user.

There may be a Logout User sub-use under which the user logs out of the system.

There may be a Register User sub-use case under which the user registers a new user into the system. The system asks the user to supply the user ID, password and the role of the new user (one of Operator/Process Engineer, Field Service Engineer or Administrator). The system adds the user to the user list in the datastore with the supplied data.

There may be an Unregister User sub-use case under which the administrator can remove an existing user from the system.

There may be a Change User Login Password sub-use case under which the user can change his login password.

There may be a Login Role sub-use case whereby the user logs into the system under the authorized role.

There may be a Switch Role sub-use case, whereby, the user changes the logged in role to another role. The system asks the user to select one of the roles from the list: Operator/Process Engineer, Field Service Engineer, or Administrator. The System asks the user to supply user ID and password. The system logs out the currently logged in role and logs in the actor into the system with selected role.

There may be a Switch Role User sub-use case, whereby, the user changes the logged in user to himself/herself. The system asks the user to supply user ID, and the system logs out the currently logged in user and logs in the actor into the system.

There may be a Logout Role sub-use case, whereby, the user logs out of the system. The system logs out the role from the system. The system closes its main display window.

There may be a Change Role Login Password sub-use case, whereby, the Administrator changes the password of any role. The system changes the password of the selected role in the datastore. The system informs the user that the password is successfully changed.

Under the Manage Module Use Case, there can be a number of sub-use cases as follows. There may be a List Modules sub-use case, once logged in, whereby, the user lists all modules in the datastore.

Figure 37:
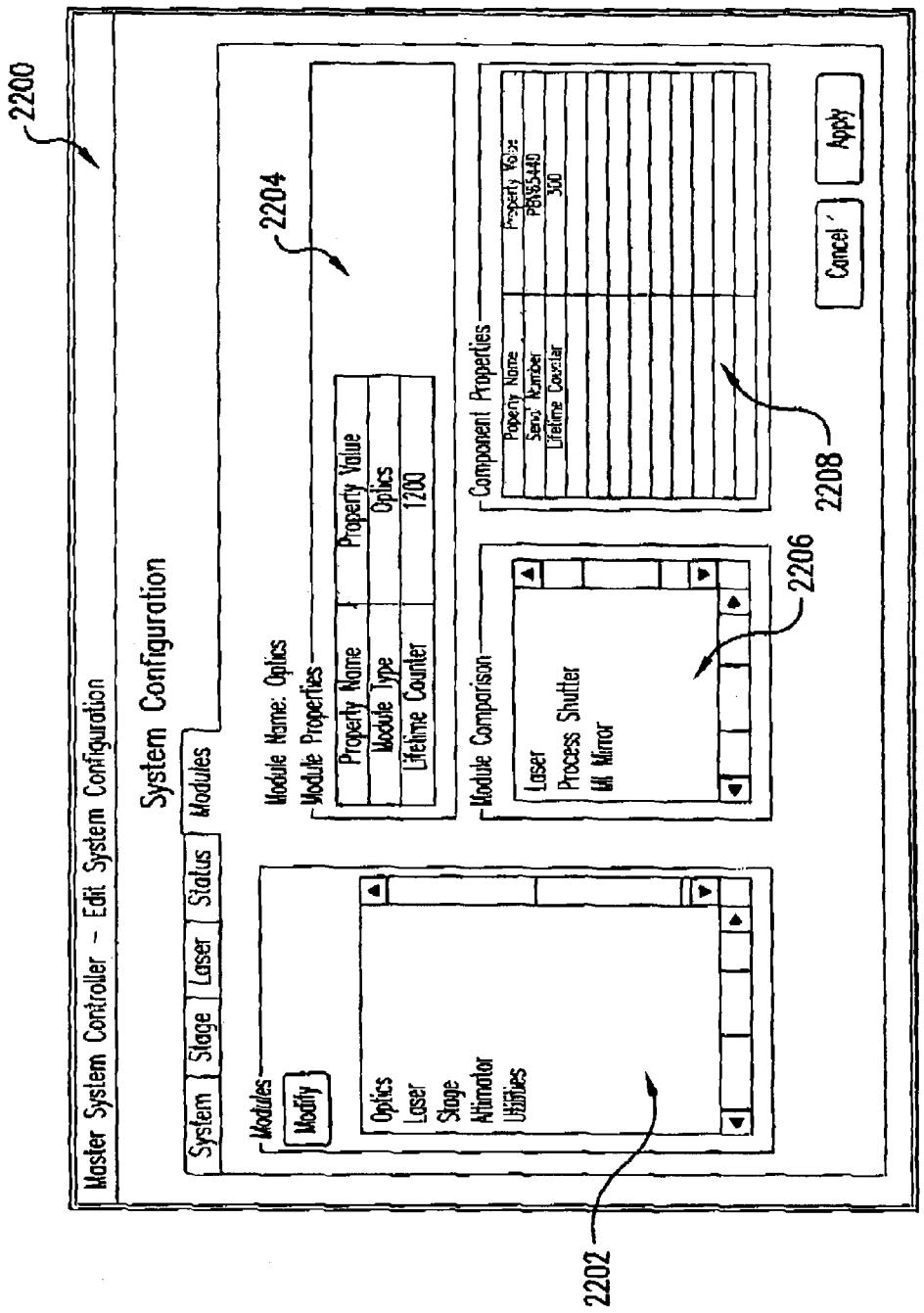
FIG. 37 shows by way of example an illustrative graphical user interface screen which may be utilized according to aspects of an embodiment of the disclosed subject matter.

There may be a View Module sub-use case, available to all users, once logged in, whereby, the user views a module in the datastore, e.g., on screen 2200 of FIG. 37. The system provides a pick list of modules. The system retrieves the requested module from the datastore and puts it in view mode 2202, e.g., in the window 2204. The system displays the list of all components and devices comprising the module; with names, serial numbers, maintenance counters etc.

There may be a Modify Module sub-use case, whereby, the user modifies certain component parameters (e.g., maintenance counters) of a module in the datastore. The system provides a pick list of modules. The system retrieves the requested module from datastore and puts it in edit mode. The system displays the list of all components and devices comprising the module under "Module Components" 2206 on screen 2200; with names, serial numbers, maintenance counters, etc. under "Component Properties" 2208 on screen 2200. The user edits parameter data such as the maintenance counters. The system stores the module in the datastore.

Under the Configure System Sub Use Cases, there can be a number of sub-use cases as follows. There may be a Edit System Configuration sub-use case, whereby, once logged in, the user modifies the machine or system configuration information. The user asks the system to edit the system configuration info. The system puts the system configuration in edit mode. The user modifies system configuration info, e.g., on the screens 2200, 2200' and 2200" of FIGS. 37, 38 and 39. The system saves the system configuration info in datastore. Screen 2200 of FIG. 37 shows by way of illustration the display when the Modules tab is selected, having, e.g., window 2202 showing the list of modules, which can, as is seen, be selected to be modified by the user. also shown is a window 2204 that indicates module properties for a selected module, e.g., "Optics." The screen 2200 may also include a window 2206 that displays the components of a selected module and window 2208 that displays component properties for the selected component. The screen 2200' of FIG. 35 illustrates, by way of example, what is displayed when the System tab is selected. In this case, a window 2210 shows parameters and values for the respective parameter. The screen 2200" of FIG. 36, illustrates by way of example what is displayed when the "Status" tab is selected. There is shown a status tab name box, e.g., Maintenance, as illustrated, and a window identifying the status tabs, e.g., Summary, Laser, Stage and System. a window 2216 displays the available status parameters and a window 2218 displays the status tab parameters.

Figure 38:
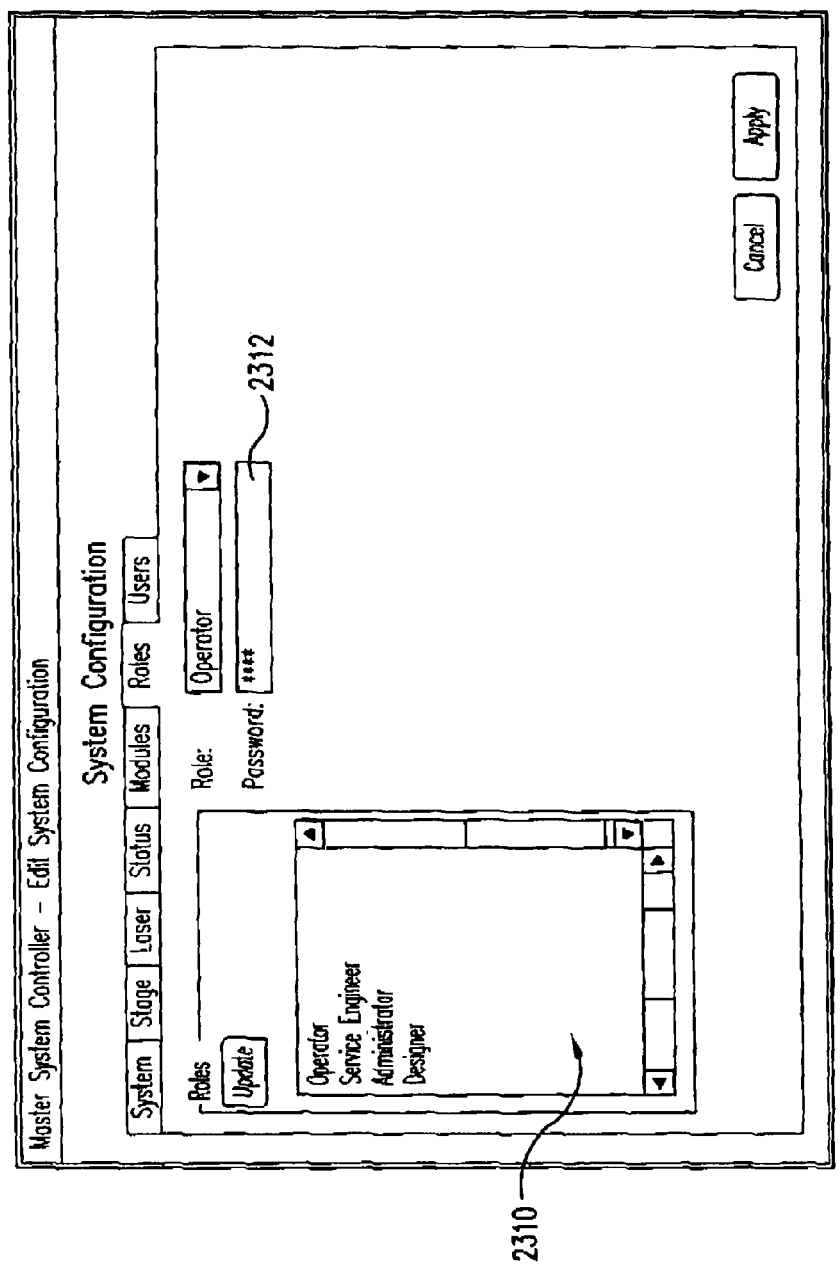
FIG. 38 shows by way of example an illustrative graphical user interface screen which may be utilized according to aspects of an embodiment of the disclosed subject matter.
Figure 39:
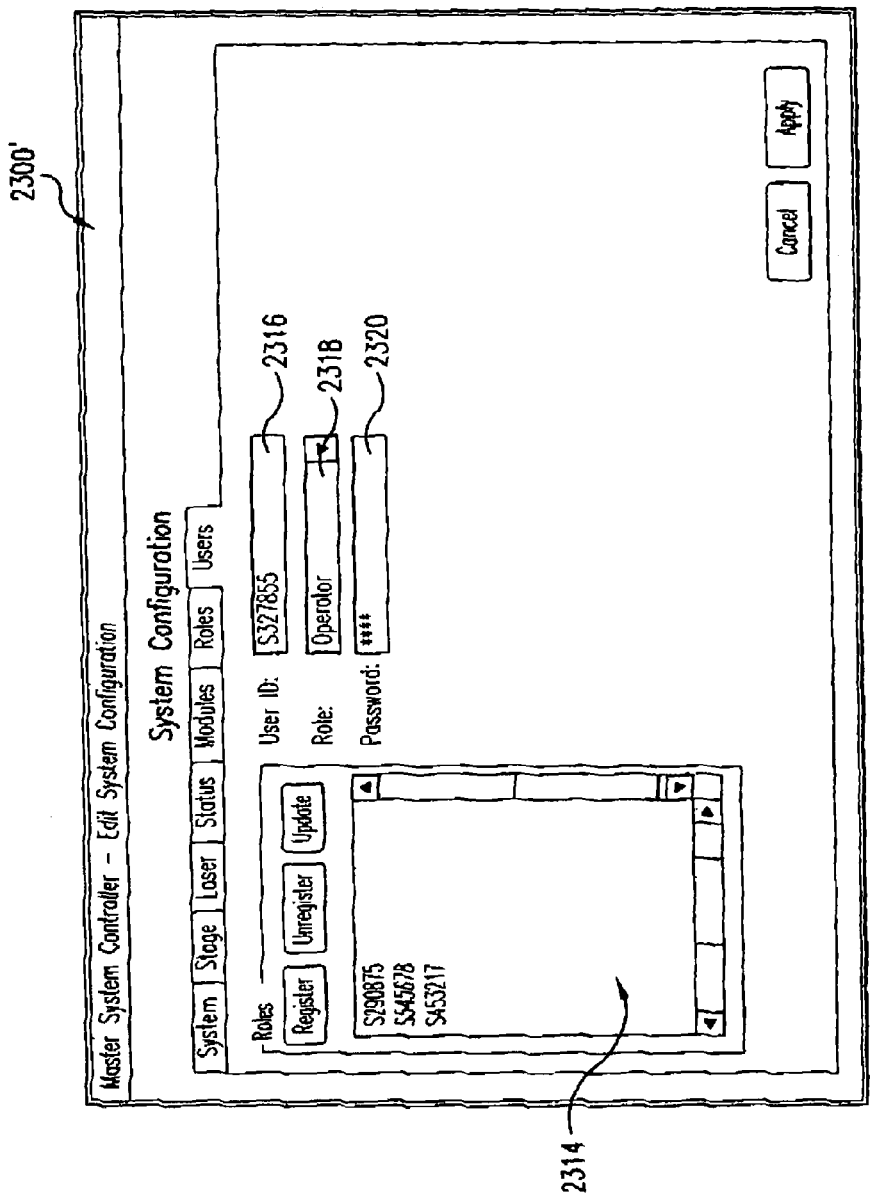
FIG. 39 shows by way of example an illustrative graphical user interface screen which may be utilized according to aspects of an embodiment of the disclosed subject matter.

Role and User screens 2300 and 2300' respectively of FIGS. 38 and 39 illustrate by way of example displays selected by Role and User tabs on which a user may log in for a role selected from window 2310 by inserting a password in box 2312 and users may be assigned roles by user ID, if that ID appears in the window 2314, and is entered in box 2316, the role is selected in box 2318, and a password is entered in box 2320.

Figure 40:
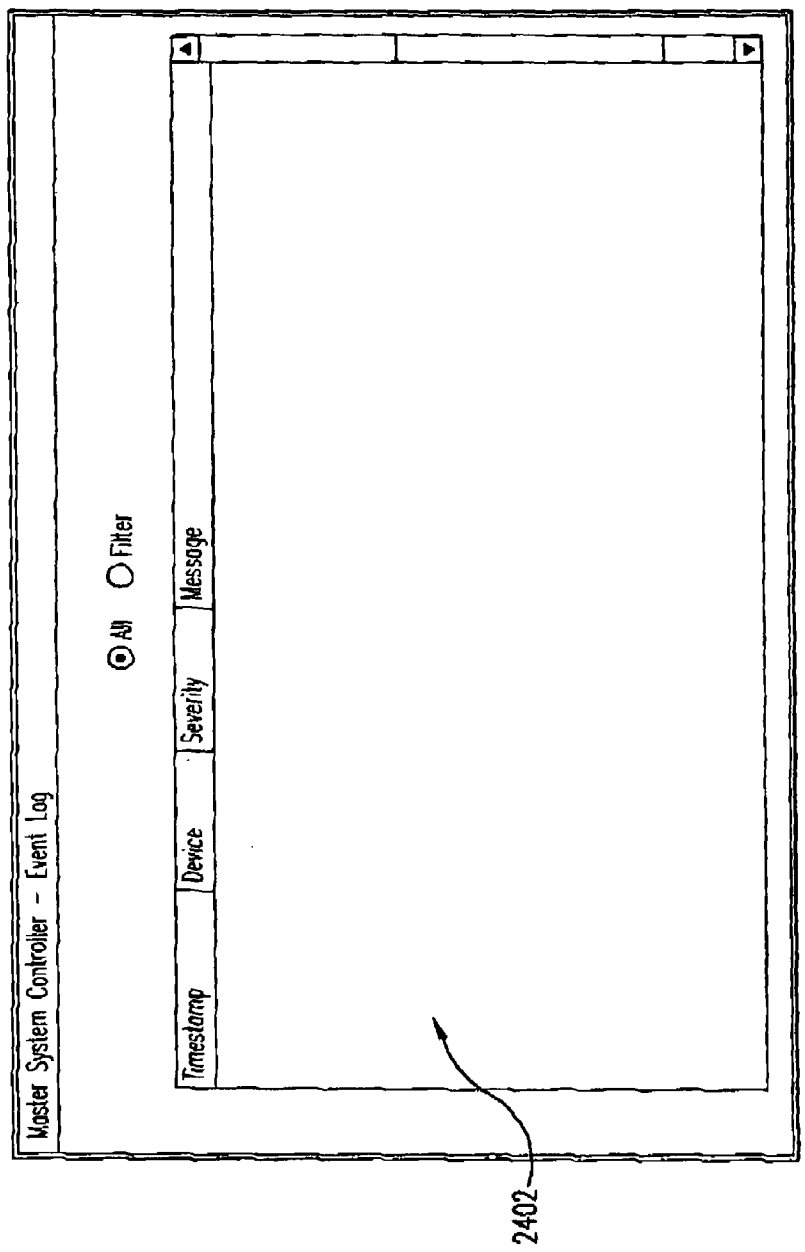
FIG. 40 shows by way of example an illustrative graphical user interface screen which may be utilized according to aspects of an embodiment of the disclosed subject matter.
Figure 41:
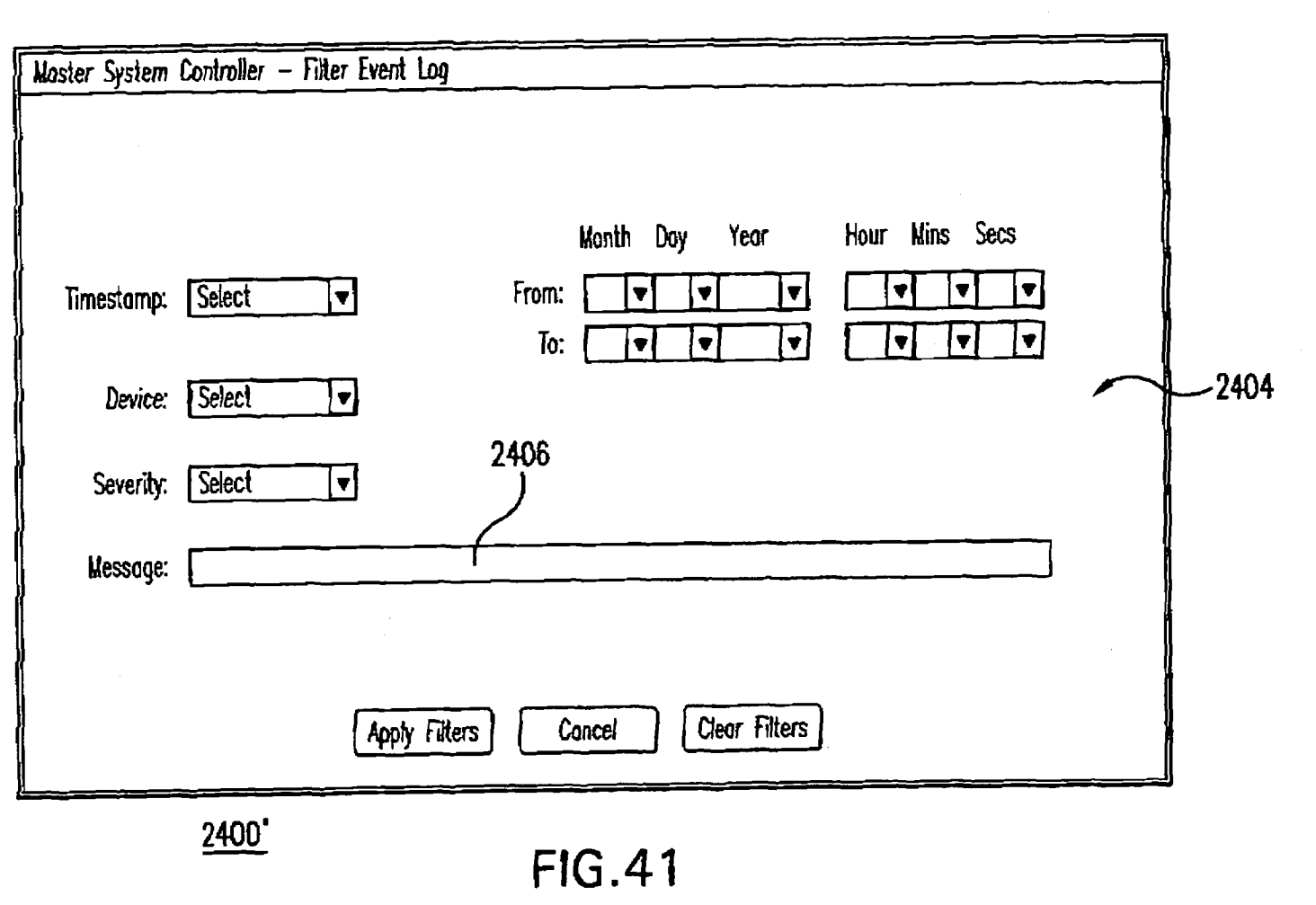

Screens 2400 and 2400' of FIGS. 40 and 41 may show, respectively, all messages, e.g., error and alarm messages in a window 2402 or select certain types of messages/alarms with a filter in window 2404 of FIG. 41, by which, e.g., can be selected a certain time, device, message severity level, and time period for filtering along with the filtered message(s) in a display window 2406.

There may be a View System Configuration sub-use case, whereby, the user views the machine or system configuration information. The system displays the system configuration with multiple tabs one for each device.

There may be a Configure System Status sub-use case, whereby, the user adds new status tabs and changes the content of the existing status tabs. The system displays a list of existing status tabs in the datastore. The system also displays a list of all status parameters in the datastore. The user optionally adds new status tabs to the status tab list and adds one or more status parameters to the newly created status tab. The user optionally modifies the contents of an existing status tab by adding, reordering or removing status parameters from it. The user optionally reorders the status tabs. The user optionally deletes an existing status tab.

It will be understood by those skilled in the art that a pulsed DUV workpiece treatment apparatus and method for delivering light to irradiate the workpiece, for crystallization of a material on the workpiece, carried on a work stage, which may comprise a pulsed laser DUV light source and an optical train producing a very narrow width very elongated beam of light pulses with a set of parameters required to be maintained within a respective selected narrow range of values on a pulse to pulse basis is disclosed, which may comprise: a laser controller; a work stage controller; a system controller receiving process recipe control demands from a customer recipe control command generator and providing control signals to the laser controller and the workstage controller, which may comprise: a database driven process controller which may comprise: a database containing generic process command steps selectable by a user through an external process user interface. The apparatus and method may comprise process control customization from user to user, and may also comprise an interpreter converting process command steps selected through the external process user interface to a respective generic script or scripts. The apparatus and method may comprise a work flow engine identifying to the user process command steps that are selectable by the user from the OEM database, which may be based on tasks stored in the OEM database. The apparatus and method may comprise a process server executing a command to a controller of a device from a group comprising the laser controller and the work stage controller; a GUI client inputting recipe definitions from the user and sending user commands to the process server. The GUI client may comprise a display displaying the status of at least one device from a group comprising the laser and work stage and/or the status of the crystallization process on the workpiece and may communicate with a manufacturing execution system interface via an interface. The apparatus and method may further comprise an OEM read only database which may contain read-only task definitions supplied by the OEM; a master system controller read-write database containing user provided recipe definitions. The OEM database may contain generic task definitions in the form of macros or scripts useable by the process server during process control; a command interpreter combining a user input parameter stored in the MSC database with a generic command from the OEM database. The input parameter may have been previously stored in the MSC database and the generic command may be contained in a script in the OEM database. The apparatus and method may further comprise a plurality of process control subsystems in communication with the process server, each subsystem comprising a message queue and message loop; a message pump associated with each message queue and message loop serializing access to the respective subsystem, and may further comprise a device interface in communication with at least one device from a group comprising the laser and the work stage, utilizing a language converter converting the communication from a neutral language format utilized within the command interpreter to a device specific device language format. A pulsed DUV workpiece treatment apparatus which may deliver light to irradiate the workpiece, for crystallization of a material on the workpiece, carried on a work stage, which may comprise a pulsed laser DUV light source and an optical train producing a very narrow width very elongated beam of light pulses with a set of parameters required to be maintained within a respective selected narrow range of values on a pulse to pulse basis is disclosed which may comprise: a laser controller; a work stage controller; a system controller running a respective task in a separate respective process in order to code a task as a single thread or as multiple non-reentrant threads. The respective task may comprise core tasks each run in a respective thread inside a single process as a single thread. Each thread may have a respective message pump making access to a respective task sequential and non-blocking. The message pump may comprise a message queue and a message loop, and may further comprise the system processor processing errors. The system processor message may be processed using the message pump. A pulsed DUV workpiece treatment apparatus which may deliver light to irradiate the workpiece, for crystallization of a material on the workpiece, carried on a work stage, which may comprise a pulsed laser DUV light source and an optical train producing a very narrow width very elongated beam of light pulses with a set of parameters required to be maintained within a respective selected narrow range of values on a pulse to pulse basis is disclosed, which may comprise: a laser controller; a work stage controller; a plurality of process devices controlled by a system device manager utilizing at least two separately functioning threads one of which comprises a device interface to each of the plurality of process devices. The two separately functioning threads may comprise a control thread associated with all of the respective devices and a diagnostic thread associated with all of the respective devices. Each separately functioning thread may comprise a separate communication channel. The system controller may utilize generic device commands independently of the device types. The device commands may correspond to high level actions. The apparatus and method may comprise the GUI client storing recipe definitions as parameters in the MSC database prior to sending user commands to the process server and may further comprise a message queue and a message loop. The apparatus and method may comprise the at least two separately functioning threads comprising one or more separately functioning threads each as a separate device interface to a respective one of the plurality of process devices. The at least two separately functioning threads may comprise a respective control thread associated with the respective device and a respective diagnostic thread associated with the respective device. Each separately functioning thread may comprising a separate communication channel. The system controller may utilize generic device commands independently of the device types. The device commands may correspond to high level actions.

It will further be understood by those skilled in the art that according to aspects of an embodiment of the disclosed subject matter utilization of thin beam laser annealing systems may be useful to, e.g., in the processing of substrates to, e.g., anneal an amorphous silicon layer to form a poly-crystalline silicon layer, in which to form, e.g., thin film transistors in the layer, and with better crystals, e.g., longer grain boundaries it is possible to, e.g., make smaller thin film transistors with the same of higher levels of performance. this may allow, e.g., brighter displays formed with the thin film transistors in the substrate, so. called system on glass displays, ("SOG"), e.g., with the control electronics embedded in the display panel as opposed to being outside the panel itself. The panels can also be made with higher resolution and other performance enhancements, such as faster response times, to reduce, e.g., blurring. Clearly enhanced process control in making the laser annealed thin film transistor poly-crystalline silicon panels can help to achieve these improved panels. Such TFT panels and organic light emitting diodes ("OLEDs") also advantageously formed using thin beam laser annealing of the sort controlled according to aspects of the disclosed subject matter, can be made more cheaply and with such enhanced performance characteristics along with others, e.g., enhanced OLED lifetimes. In addition, enhanced poly-silicon display panels, made with increased yields and thus at lower cost, offer many advantages over currently utilized amorphous silicon based display panels, such as those mentioned above and also, e.g., better small and medium sized display panels, greater stability under high current loads needed for OLEDs. Furthermore better process control according to aspects of the disclosed subject matter add to these benefits.

High power, e.g., greater than 1000 W excimer laser annealing, with the laser output optically formed into a very long, e.g., over 500 mm and very thin, e.g., under 10 µm beam width, excimer, e.g., XeCl or XeF laser annealing systems are currently believed to be an excellent apparatus for performing the amorphous the annealing on large substrates, generation 3 and beyond, to attain the above noted thin film advantageous transistor and OLED results. The laser elongated thin beam can, e.g., melt a local region of amorphous silicon which then crystallizes from an adjoining cooled region forming a seed and large (long) crystals can be achieved by moving the beam and substrate relative to the other or each other to extend the crystals in the direction of relative movement, thus, e.g., creating crystals of relatively uniform and elongated length and with higher electron mobility than smaller grained poly-silicon crystals available through annealing with other processes. The thin beam enables sut continuous creating of a small liquified region adjacent a solid seed region drawn across the surface of the panel workpiece in the crystallizing machine controlled according to aspects of the disclosed subject matter. The beam width can enable annealing a panel in a single pas, also increasing panel throughput, in addition to making better crystals.

According to aspects of an embodiment of the disclosed subject matter, the system may be housed in a master controller cabinet, which may contain, the master system controller ("MSC") server, the master distribution module ("MDM") the data acquisition service ("DAS") server and field service engineer ("FSE") server. These may be implemented using a dual Opteron server with, e.g., 8 GB of RAM and running CentOS for control (MSC), and the same for data acquisition (DAS), along with a dual P4 server running Windows 2003 OS for diagnostics, a storage array, e.g., with 3 TB of storage space, a Cisco switch and PIX firewall and a 16 port Lantronix TCP/IP converter for LAN connections.

The MSC and DAS mayu communicate with a variety of hardware elements of the processing equipment (Devices), e.g., a 1220 W, 6 kHz XeF DUV laser, a beam delivery unit with, e.g., active beam steering and stabilization modules, and active illuminator auto focus control, a stage precision motor controller, a projection optics module ("POM"), including, e.g., motor control, metrology sensors, e.g., for temperature, beam energy and beam profile, other equipment, e.g., electrical and fluid utilities and a material handler and a factory automation host, which are of the selection of the wend user customer and unknow, in advance, to the annealing system/controller manufacturer and which the, e.g., MSC and DAS and Devices must interface with and/or be run by.

The controller according to aspect of an embodiment of the disclosed subject matter provides a number of design advantages. the system is one of high availability—24-7—7. The controller is distributed, e.g. with hard real-time requirements handled by the controlled devices, overall coordination, control, operator feedback and data collection handled by the MSC and multiple paths of information flow, e.g., local operator control and factory host control available. The system is also highly adaptable, being, e.g., capable of control and monitoring of an arbitrary set of intelligent devices and allowing for the modification of the device set and/or substitution of different devices for the same functionality within the device set without the need of essentially any rewrite/recompilation of the controller code for any or all modules and certainly without the need for an entire rewrite or recompilation.

The device commands are not hard wired into the controller code. They can be stored and loaded dynamically and cached for performance reasons. The GUI design does not limit the number of parameters, e.g., for any task or system level device or other configuration(s). For example, additional parameters tasks may be added to a task without coding modifications to, e.g., the user interface screens. Along with TCP/IP communications to the devices, where needed Lantronix can be used to convert, e.g., serial communications protocols. System commands may be executed asynchronously, e.g., so as not to block the system, e.g., when waiting for a response from a device or devices, e.g., when timing critical commands.

Much of the software may be implement in easy to use software, such as C++. the GUI can be implement in the well understood and easy to use JAVA. Control and data collection, e.g., Tasks, can be stored in, e.g., a parameterized script form, such as PostgreSQL or the like procedural language functionalities. Tasks may access devices via a command library cell or the like. work may be done on the processing system being controller according to aspects of an embodiment of the disclosed subject matter, e.g., by running Projects or Recipes. projects may be created by the system operator, e.g., using Tasks, with a Recipe forming a specialized version of a Task. At runtime, the command interpreter may be used to parse Tasks, e.g., thereby executing Device commands. Control logic, therefore, can be moved from compiled code to dynamic data, e.g., stored in memory. During, e.g., Task execution, the Task may come from the OEM schema and the parameters may come from the MSC schema and the command interpreter may use these to provide a device command(s) to a Device.

The, e.g., PostgreSQL, with its parameterized script formats may be configured to be user controlled, e.g., with global level variables that can allow user control of system behaviors, e.g., connection timeouts, calibration factors, and device enable/disable. Users may be defined and enabled. Projects and Recipes may include project level parameters, included Tasks and associated parameters and permissions. there may also be chart templates used. OEM controlled aspect may include a boostrap user configuration, GUI look and feel, e.g., colors, tabs, labels, etc. Job execution may be controlled by OEM confidential (and encrypted) task and class scripts. An internal setup may include routing tables for DMP and message mapping. Device setup and availability may include configurations, e.g., so-called "Bold" lists, NFL-2-DF translation, and a device list, e.g., a table of devices with, e.g., driver shared objects that may be loaded dynamically.

Status loop data may be in a continuously polling loop which may be throttled to a specific, e.g., relatively slow data rate. Separate threads, e.g., one per Device, may be synchronized, e.g., by a time "sync thread." Many attributes, e.g., hundreds of attributes, which may be required for flexibility of operation may be stored in, e.g., PostgreSQL, e.g., using an Attribute-Value form, e.g., using Normalized values. The status loop may be buffered and bulk copied and partitioned by time/Device. Built in charting and reporting features may be used to monitor the operation of the controlled laser annealing or other type of system being controlled. For example in the laser annealing type of system, laser energy and related properties at various points in the system, beam profiles and other properties, stage and metrology positions and temperatures throughout the laser annealing system may be charted/reported. The data may be streamed, e.g., at a relatively high data rate, e.g., at or above 6 kHz and with attributes such as around 24 fields in the laser attributes stream and around 70 fields in the metrology stream.

System logging may allow for, e.g., MSC components to log to a central logger Daemon which may also receive information from many of the system Devices. the logger Daemon may buffer, store, e.g., by writing to a PostregSQL database and send messages in parallel t the GUI, e.g., via the DMP. The Gui can allow for filtering love logs, e.g., by device, time/date, severity etc. and report generation, e.g., by device, time/date, severity, etc.

One database schema, e.g., the OEM may be used for bootstrapping and another database schema may be used to overlay user setting, e.g., application defaults may be added to the OEM schema setting may be made in absence of MSC schema settings. Partitioning, e.g., by timestamp of device may be used for status and streaming data, which can allow, e.g., simplified and quick enforcement of data retention. There may be a database link between the OEM schema and MSC schema, which may be separated in order to, e.g., insure that data collection and control functionalities do not interfere with each other, but the MSC schema and OEM schema may have to communicate with each other in some circumstances, e.g., through the database link, dblink, such as when on some occasions data captured by the DAS is needed also in the MSC. the controller may also make beneficial use of functions, e.g., custom C extension functions, e.g., for XML and HMAC, e.g., XML messages may be utilized in DMP and in the GUI and HMAC may be used for Project/Recipe locking.

Neutral Language format to Device format conversions may utilize an entit-attribute-value format, which can be used to provide mapping from generic commands, e.g., used by the Task script to Device specific commands. This also allows for easy substitution of one device which may have one set of commands for another device, performing the same or a similar function, but having its own unique set of commands or at least some such commands. For example, various different materials handling robots from different manufacturers with non-standard sets of commands or at least some non-standard commands between each of them can be made fungible to the controller and material processing system. As another example, a newer model laser may be substituted in, which may have added or different modules and thus commands. In addition, as between Devices, some attributes may be common, but many may also be unique to a given Device, and the database organization allows for replacement of a Device with another having the same function, but, e.g., different default behaviors, simplifying the addition or replacement of Devices.

Device variables may be contained in a table, e.g., in PostgreSQL, e.g., as part of a list of tables, as follows:

```
create table oem_device_variable
(
    device_id              int not null,
    variable_name          text not null,
    variable_label         text,
    variable_uom           text,
    variable_data_type     text not null,
    variable_type          text not null,
    variable_default       text,
    variable_required      char(1) not null,
    variable_validator     text,
    variable_order         int,
    variable_list          text,
    variable_internal      int,
    variable_public        int not null
);
``` and may comprise a table such as the following:

| variable_label | variable_data_type | variable_type | variable_default | variable_validator | variable_list |
|---|---|---|---|---|---|
| Device Enabled | TEXT | SELECTION | FALSE | IS_ALPHA | TRUE; FALSE |
| Send Full Status to GUI | TEXT | SELECTION | TRUE | IS_ALPHA | TRUE; FALSE |
| Device Connection Attempts | INT | INPUT | 3 | INSTANTCHECK: [. . .] | |
| Device Connection Timeout | TEXT | INPUT | 5 | IS_ALPHANUM | |
| Command Placeholder | TEXT | INPUT | % | IS_ALPHANUM | |
| Read Terminator | TEXT | INPUT |  | IS_ALPHANUM | |
| Device Library | TEXT | INPUT | libmscomegabus.so | IS_ALPHANUM | |
| Log Level | TEXT | INPUT | 0 | IS_ALPHANUM | |
| IP Address | TEXT | INPUT | ice9lantronix | IS_ALPHANUM | |
| Port Number | TEXT | INPUT | 3004 | IS_ALPHANUM | |
| Service Mode Supported | TEXT | SELECTION | No | IS_ALPHA | No; Yes |

Variables may also be joined across devices, e.g., using a synchronizing thread. Each device may have its own data collection thread but using a synchronizing thread can allow for, e.g., cross-correlation of data.

Data may be selected by selecting a particular table forming, e.g., a status log, e.g., das_status_log, which may include a listing of a device id, a timestamp, a status name, a status value and a status uom. A table containing a status log between selected start time timestamp and stop timestamp may be created, utilizing a particular device id and selected start and stop timestamps. Finally a table may be printed out or displayed on the GUI that shows the recorded status values for selected variables, such as stage_CX, stage_CY and stage_CZ with time stamp between the selected values. Data may be displayed on the GUI, e.g., in the form of charts, e.g., laser output energy versus time. Utilizing data in a normalized format can provide for a relatively fixed set of attributes and a high data rate, which may be partitioned by device and timestamp. Data may be streamed at a rate of, e.g., one record per laser shot and, e.g., tagged with a unique shot count number such that data across devices by synchronizing shot count numbers.

It can be understood by those skilled in the art that the aspects of embodiments of the disclosed subject matter disclosed above are intended to be preferred embodiments only and not to limit the disclosure of the disclosed subject matter(s) in any way and particularly not to a specific preferred embodiment alone. Many changes and modification can be made to the disclosed aspects of embodiments of the disclosed invention(s) that can be understood and appreciated by those skilled in the art. The appended claims are intended in scope and meaning to cover not only the disclosed aspects of embodiments of the disclosed subject matter(s) but also such equivalents and other modifications and changes that could be apparent to those skilled in the art. In additions to changes and modifications to the disclosed and claimed aspects of embodiments of the disclosed subject matter(s) noted above others could be implemented.

While the particular aspects of embodiment(s) of the HIGH POWER LSER FLAT PANEL WORKPIECE TREATMENT SYSTEM CONTROLLER described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the disclosed subject matter are merely exemplary, illustrative and representative of the subject matter which is broadly contemplated by the disclosed subject matter. The scope of the presently described and claimed aspects of embodiments fully encompasses other embodiments which may now be or may become obvious to those skilled in the art based on the teachings of the Specification. The scope of the present HIGH POWER LSER FLAT PANEL WORKPIECE TREATMENT SYSTEM CONTROLLER is solely and completely limited by only the appended claims and nothing beyond the recitations of the appended claims. Reference to an element in such claims in the singular is not intended to mean nor can it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application can have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It can be understood also be those skilled in the art that, in fulfillment of the patent statutes of the United States, applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, applicants have used from time to time or throughout the present application definitive verbs (e.g., "is", "are", "does", "has", "includes" or the like) and/or other definitive verbs (e.g., "produces," "causes" "samples," "reads," "signals" or the like) or any gerund (e.g., "using," "taking," "keeping," "making" or the like), defining a feature/element of, an action of or functionality of, and/or describing any other aspect of an embodiment of the subject matter being disclosed. Wherever any such definitive word or phrase or the like is used to describe an aspect of any of the one or more embodiments disclosed herein, i.e., any feature, element, system, sub-system, component, sub-component, process or algorithm step, particular material, or the like, it can be read, for purposes of interpreting the scope of the subject matter of what applicant(s) has invented, and claimed, to be preceded by one or more or all of the following limiting phrases, "by way of example," "for example," "as an example," "illustratively only," "by way of illustration only," etc., and/or to include any one or more or all of the phrases "may be," "can be", "might be," "could be" and the like. All such features, elements, steps, materials and the like can be considered to be described only as a possible aspect of the one or more disclosed embodiments and not as the sole possible implementation of any one or more embodiments or any aspect (part or step) of any embodiment, and/or the sole possible embodiment of the invention as claimed, even if, in fulfillment of the requirements of the patent statutes, applicant(s) has disclosed only a single enabling example of any such aspect of an embodiment of or any embodiment of the subject matter of what is claimed. Unless expressly and specifically so stated in the present application or the prosecution of this application, that applicant(s) believes that a particular aspect of any disclosed embodiment or any particular disclosed embodiment of the subject matter of what is claimed amounts to the one an only way to implement the subject matter of what is claimed or any feature or element recited in any such claim, applicant(s) does not intend that any description of any disclosed aspect of any disclosed embodiment of the subject matter of what is claimed in the present patent application can be interpreted to be such one and only way to implement the subject matter of what is claimed or any aspect, feature or element thereof, and to thus limit any claim which is broad enough to cover any such disclosed implementation along with other possible embodiments of the subject matter of what is claimed, to, respectively, such disclosed aspect, feature or element of such disclosed embodiment. Applicant(s) specifically, expressly and unequivocally intends that any claim that has depending from it a dependent claim with any further detail of any feature, element, step, aspect or the like of the subject matter of what is recited in the parent claim or claims from which it directly or indirectly depends, can be interpreted to mean that the recitation in the parent claim(s) was broad enough to cover the further detail along with other implementations and that the further detail was not the only way to implement the aspect, feature or element claimed in any such parent claim(s), and thus also intends that the aspect, feature or element in any such dependent claim not be read into the respective parent claim to limit the broader aspect, feature or element of any such parent claim to include only the further detail recited in the dependent claim.

We claim:

1. A pulsed deep ultraviolet DUV workpiece treatment apparatus delivering light to irradiate the workpiece, for crystallization of a material on the workpiece, carried on a work stage, comprising a pulsed laser DUV light source and an optical train producing a very narrow width very elongated beam of light pulses with a set of parameters required to be maintained within a respective selected narrow range of values on a pulse to pulse basis comprising:
a laser controller;
a work stage controller;
a system controller receiving process recipe control demands from a customer recipe control command generator and providing control signals to the laser controller and the workstage controller, comprising:
a database driven process controller comprising:
a database containing generic process command steps selectable by a user through an external process user interface.

2. The apparatus of claim 1 further comprising:
process control customization from user to user.

3. The apparatus of claim 1 further comprising:
an interpreter converting process command steps selected through the external process user interface to a respective generic script or scripts.

4. The apparatus of claim 2 further comprising:
an interpreter converting process command steps selected through the external process user interface to a respective generic script or scripts.

5. The apparatus of claim 1 further comprising:
a work flow engine identifying to the user process command steps that are selectable by the user from the database based on tasks stored in the database.

6. The apparatus of claim 2 further comprising:
a work flow engine identifying to the user process command steps that are selectable by the user from the database based on tasks stored in the database.

7. The apparatus of claim 3 further comprising:
a work flow engine identifying to the user process command steps that are selectable by the user from the database based on tasks stored in the database.

8. The apparatus of claim 4 further comprising:
a work flow engine identifying to the user process command steps that are selectable by the user from the database based on tasks stored in the database.

9. The apparatus of claim 1 further comprising:
a process server executing a command to a controller of a device from a group comprising the laser controller and the work stage controller;
a GUI client inputting recipe definitions from the user and sending user commands to the process server.

10. The apparatus of claim 2 further comprising:
a process server executing a command to a controller of a device from a group comprising the laser controller and the work stage controller;
a GUI client inputting recipe definitions from the user and sending user commands to the process server.

11. The apparatus of claim 3 further comprising:
a process server executing a command to a controller of a device from a group comprising the laser controller and the work stage controller;
a GUI client inputting recipe definitions from the user and sending user commands to the process server.

12. The apparatus of claim 4 further comprising:
a process server executing a command to a controller of a device from a group comprising the laser controller and the work stage controller;
a GUI client inputting recipe definitions from the user and sending user commands to the process server.

13. The apparatus of claim 5 further comprising:
a process server executing a command to a controller of a device from a group comprising the laser controller and the work stage controller;
a GUI client inputting recipe definitions from the user and sending user commands to the process server.

14. The apparatus of claim 6 further comprising:
a process server executing a command to a controller of a device from a group comprising the laser controller and the work stage controller;
a GUI client inputting recipe definitions from the user and sending user commands to the process server.

15. The apparatus of claim 7 further comprising:
a process server executing a command to a controller of a device from a group comprising the laser controller and the work stage controller;
a GUI client inputting recipe definitions from the user and sending user commands to the process server.

16. The apparatus of claim 8 further comprising:
a process server executing a command to a controller of a device from a group comprising the laser controller and the work stage controller;
a GUI client inputting recipe definitions from the user and sending user commands to the process server.

17. The apparatus of claim 9 further comprising:
the GUI client comprising:
a display displaying the status of at least one device from a group comprising the laser and work stage and/or the status of the crystallization process on the workpiece.

18. The apparatus of claim 10 further comprising:
the GUI client comprising:
a display displaying the status of at least one device from a group comprising the laser and work stage and/or the status of the crystallization process on the workpiece.

19. The apparatus of claim 11 further comprising:
the GUI client comprising:
a display displaying the status of at least one device from a group comprising the laser and work stage and/or the status of the crystallization process on the workpiece.

20. The apparatus of claim 12 further comprising:
the GUI client comprising:
a display displaying the status of at least one device from a group comprising the laser and work stage and/or the status of the crystallization process on the workpiece.

21. The apparatus of claim 13 further comprising:
the GUI client comprising:
a display displaying the status of at least one device from a group comprising the laser and work stage and/or the status of the crystallization process on the workpiece.

22. The apparatus of claim 14 further comprising:
the GUI client comprising:
a display displaying the status of at least one device from a group comprising the laser and work stage and/or the status of the crystallization process on the workpiece.

23. The apparatus of claim 15 further comprising:
the GUI client comprising
a display displaying the status of at least one device from a group comprising the laser and work stage and/or the status of the crystallization process on the workpiece.

24. The apparatus of claim 16 further comprising:
the GUI client comprising:
a display displaying the status of at least one device from a group comprising the laser and work stage and/or the status of the crystallization process on the workpiece.

25. The apparatus of claim 17 further comprising:
the GUI client communicates with a manufacturing execution system interface via an interface.

26. The apparatus of claim 18 further comprising:
the GUI client communicates with a manufacturing execution system interface via an interface.

27. The apparatus of claim 19 further comprising:
the GUI client communicates with a manufacturing execution system interface via an interface.

28. The apparatus of claim 20 further comprising:
the GUI client communicates with a manufacturing execution system interface via an interface.

29. The apparatus of claim 21 further comprising:
the GUI client communicates with a manufacturing execution system interface via an interface.

30. The apparatus of claim 22 further comprising:
the GUI client communicates with a manufacturing execution system interface via an interface.

31. The apparatus of claim 23 further comprising:
the GUI client communicates with a manufacturing execution system interface via an interface.

32. The apparatus of claim 24 further comprising:
the GUI client communicates with a manufacturing execution system interface via an interface.

33. The apparatus or claim 25 further comprising:
an Original Equipment Manufacturer (OEM) read only database containing read-only task definitions supplied by the OEM;
a master system controller read-write database containing user provided recipe definitions.

34. The apparatus of claim 26 further comprising:
an Original Equipment Manufacturer (OEM) read only database containing read-only task definitions supplied by the OEM;
a master system controller read-write database containing user provided recipe definitions.

35. The apparatus of claim 27 further comprising:
an Original Equipment Manufacturer (OEM) read only database containing read-only task definitions supplied by the OEM;
a master system controller read-write database containing user provided recipe definitions.

36. The apparatus of claim 28 further comprising:
an Original Equipment Manufacturer (OEM) read only database containing read-only task definitions supplied by the OEM;
a master system controller read-write database containing user provided recipe definitions.

37. The apparatus of claim 29 further comprising:
an Original Equipment Manufacturer (OEM) read only database containing read-only task definitions supplied by the OEM;
a master system controller read-write database containing user provided recipe definitions.

38. The apparatus of claim 30 further comprising:
an Original Equipment Manufacturer (OEM) read only database containing read-only task definitions supplied by the OEM;
a master system controller read-write database containing user provided recipe definitions.

39. The apparatus of claim 31 further comprising:
an Original Equipment Manufacturer (OEM) read only database containing read-only task definitions supplied by the OEM;
a master system controller read-write database containing user provided recipe definitions.

40. The apparatus of claim 32 further comprising:
an Original Equipment Manufacturer (OEM) read only database containing read-only task definitions supplied by the OEM;
a master system controller read-write database containing user provided recipe definitions.

41. The apparatus of claim 33 further comprising:
the OEM database contains generic task definitions in the form of macros or scripts useable by the process server during process control;
a command interpreter combining a user input parameter stored in the MSC database with a generic command from the OEM database.

42. The apparatus of claim 34 further comprising:
the OEM database contains generic task definitions in the form of macros or scripts useable by the process server during process control;
a command interpreter combining a user input parameter stored in the MSC database with a generic command from the OEM database.

43. The apparatus of claim 35 further comprising:
the OEM database contains generic task definitions in the form of macros or scripts useable by the process server during process control;
a command interpreter combining a user input parameter stored in the MSC database with a generic command from the OEM database.

44. The apparatus of claim 36 further comprising:
the OEM database contains generic task definitions in the form of macros or scripts useable by the process server during process control;
a command interpreter combining a user input parameter stored in the MSC database with a generic command from the OEM database.

45. The apparatus of claim 37 further comprising:
the OEM database contains generic task definitions in the form of macros or scripts useable by the process server during process control;
a command interpreter combining a user input parameter stored in the MSC database with a generic command from the OEM database.

46. The apparatus of claim 38 further comprising:
the OEM database contains generic task definitions in the form of macros or scripts useable by the process server during process control;

a command interpreter combining a user input parameter stored in the MSC database with a generic command from the OEM database.

47. The apparatus of claim 39 further comprising:
the OEM database contains generic task definitions in the form of macros or scripts useable by the driver controller during process control;
a command interpreter combining a user input parameter stored in the MSC database with a generic command from the OEM database.

48. The apparatus of claim 40 further comprising:
the OEM database contains generic task definitions in the form of macros or scripts useable by the driver controller during process control;
a command interpreter combining a user input parameter stored in the MSC database with a generic command from the OEM database.

49. The apparatus of claim 41 further comprising:
the input parameter was previously stored in the MSC database and the generic command is contained in a script in the OEM database.

50. The apparatus of claim 42 further comprising:
the input parameter was previously stored in the MSC database and the generic command is contained in a script in the OEM database.

51. The apparatus of claim 43 further comprising:
the input parameter was previously stored in the MSC database and the generic command is contained in a script in the OEM database.

52. The apparatus of claim 44 further comprising:
the input parameter was previously stored in the MSC database and the generic command is contained in a script in the OEM database.

53. The apparatus of claim 45 further comprising:
the input parameter was previously stored in the MSC database and the generic command is contained in a script in the OEM database.

54. The apparatus of claim 46 further comprising:
the input parameter was previously stored in the MSC database and the generic command is contained in a script in the OEM database.

55. The apparatus of claim 47 further comprising:
the input parameter was previously stored in the MSC database and the generic command is contained in a script in the OEM database.

56. The apparatus of claim 48 further comprising:
the input parameter was previously stored in the MSC database and the generic command is contained in a script in the OEM database.

57. The apparatus of claim 41 further comprising:
a plurality of process control subsystems in communication with the process server, each subsystem comprising a message queue and message loop;
a message pump associated with each message queue and message loop serializing access to the respective subsystem.

58. The apparatus of claim 42 further comprising:
a plurality of process control subsystems in communication with the process server, each subsystem comprising a message queue and message loop;
a message pump associated with each message queue and message loop serializing access to the respective subsystem.

59. The apparatus of claim 43 further comprising:
a plurality of process control subsystems in communication with the process server, each subsystem comprising a message queue and message loop;
a message pump associated with each message queue and message loop serializing access to the respective subsystem.

60. The apparatus of claim 44 further comprising:
a plurality of process control subsystems in communication with the process server, each subsystem comprising a message queue and message loop;
a message pump associated with each message queue and message loop serializing access to the respective subsystem.

61. The apparatus of claim 45 further comprising:
a plurality of process control subsystems in communication with the process server, each subsystem comprising a message queue and message loop;
a message pump associated with each message queue and message loop serializing access to the respective subsystem.

62. The apparatus of claim 46 further comprising:
a plurality of process control subsystems in communication with the driver controller, each subsystem comprising a message queue and message loop;
a message pump associated with each message queue and message loop serializing access to the respective subsystem.

63. The apparatus of claim 47 further comprising:
a plurality of process control subsystems in communication with the driver controller, each subsystem comprising a message queue and message loop;
a message pump associated with each message queue and message loop serializing access to the respective subsystem.

64. The apparatus of claim 48 further comprising:
a plurality of process control subsystems in communication with the driver controller, each subsystem comprising a message queue and message loop;
a message pump associated with each message queue and message loop serializing access to the respective subsystem.

65. The apparatus of claim 49 further comprising:
a device interface in communication with at least one device from a group comprising the laser and the work stage, utilizing a language converter converting the communication from a neutral language format utilized within the command interpreter to a device specific device language format.

66. The apparatus of claim 50 further comprising:
a device interface in communication with at least one device from a group comprising the laser and the work stage, utilizing a language converter converting the communication from a neutral language format utilized within the command interpreter to a device specific device language format.

67. The apparatus of claim 51 further comprising:
a device interface in communication with at least one device from a group comprising the laser and the work stage, utilizing a language converter converting the communication from a neutral language format utilized within the command interpreter to a device specific device language format.

68. The apparatus of claim 52 further comprising:
a device interface in communication with at least one device from a group comprising the laser and the work stage, utilizing a language converter converting the communication from a neutral language format utilized within the command interpreter to a device specific device language format.

69. The apparatus of claim 53 further comprising:
a device interface in communication with at least one device from a group comprising the laser and the work stage, utilizing a language converter converting the communication from a neutral language format utilized within the command interpreter to a device specific device language format.

70. The apparatus of claim 54 further comprising:
a device interface in communication with at least one device from a group comprising the laser and the work stage, utilizing a language converter converting the communication from a neutral language format utilized within the command interpreter to a device specific device language format.

71. The apparatus of claim 55 further comprising:
a device interface in communication with at least one device from a group comprising the laser and the work stage, utilizing a language converter converting the communication from a neutral language format utilized within the command interpreter to a device specific device language format.

72. The apparatus of claim 56 further comprising:
a device interface in communication with at least one device from a group comprising the laser and the work stage, utilizing a language converter converting the communication from a neutral language format utilized within the command interpreter to a device specific device language format.

73. A pulsed deep ultraviolet (DUV) workpiece treatment apparatus delivering light to irradiate the workpiece, for crystallization of a material on the workpiece, carried on a work stage, comprising a pulsed laser DUV light source and an optical train producing a very narrow width very elongated beam of light pulses with a set of parameters required to be maintained within a respective selected narrow range of values on a pulse to pulse basis comprising:
a laser controller;
a work stage controller;
a system controller running a respective task in a separate respective process in order to code a task as a single thread or as multiple non-reentrant threads.

74. The apparatus of claim 73 further comprising:
the respective task comprising core tasks each run in a respective thread inside a single process as a single thread.

75. The apparatus of claim 73 further comprising:
each thread having a respective message pump making access to a respective task sequential and non-blocking.

76. The apparatus of claim 74 further comprising:
each thread having a respective message pump making access to a respective task sequential and non-blocking.

77. The apparatus of claim 75 further comprising:
the message pump comprising:
a message queue and a message loop.

78. The apparatus of claim 73 further comprising:
the system processor processing errors.

79. The apparatus of claim 74 further comprising:
the system processor processing errors.

80. The apparatus of claim 75 further comprising:
the system processor processing errors.

81. The apparatus of claim 76 further comprising:
the system controller processing errors.

82. The apparatus of claim 77 further comprising:
the system controller processing errors.

83. The apparatus of claim 78 further comprising:
the system processor message is processed using the message pump.

84. The apparatus of claim 79 further comprising:
the system processor message is processed using the message pump.

85. The apparatus of claim 80 further comprising:
the system processor message is processed using the message pump.

86. The apparatus of claim 81 further comprising:
the system processor message is processed using the message pump.

87. The apparatus of claim 82 further comprising:
the system processor message is processed using the message pump.

88. A pulsed deep ultraviolet (DUV) workpiece treatment apparatus delivering light to irradiate the workpiece, for crystallization of a material on the workpiece, carried on a work stage, comprising a pulsed laser DUV light source and an optical train producing a very narrow width very elongated beam of light pulses with a set of parameters required to be maintained within a respective selected narrow range of values on a pulse to pulse basis comprising:
a laser controller;
a work stage controller;
a plurality of process devices controlled by a system device manager utilizing at least two separately functioning threads one of which comprises a device interface to each of the plurality of process devices.

89. The apparatus of claim 88 further comprising:
the two separately functioning threads comprising a control thread associated with all of the respective devices and a diagnostic thread associated with all of the respective devices.

90. The apparatus of claim 88 further comprising:
each separately functioning thread comprising a separate communication channel.

91. The apparatus of claim 89 further comprising:
each separately functioning thread comprising a separate communication channel.

92. The apparatus of claim 88 further comprising:
the system controller utilizing generic device commands independently of the device types.

93. The apparatus of claim 89 further comprising:
the system controller utilizing generic device commands independently of the device types.

94. The apparatus of claim 90 further comprising:
the system controller utilizing generic device commands independently of the device types.

95. The apparatus of claim 91 further comprising:
the system controller utilizing generic device commands independently of the device types.

96. The apparatus of claim 92 further comprising:
the device commands corresponding to high level actions.

97. The apparatus of claim 93 further comprising:
the device commands corresponding to high level actions.

98. The apparatus of claim 94 further comprising:
the device commands corresponding to high level actions.

99. The apparatus of claim 95 further comprising:
the device commands corresponding to high level actions.

100. The apparatus of claim 9 further comprising:
the GUI client storing recipe definitions as parameters in the MSC database prior to sending user commands to the process server.

101. The apparatus of claim 10 further comprising:
the GUI client storing recipe definitions as parameters in the MSC database prior to sending user commands to the process server.

102. The apparatus of claim 11 further comprising:
the GUI client storing recipe definitions as parameters in the MSC database prior to sending user commands to the process server.
103. The apparatus of claim 12 further comprising:
the GUI client storing recipe definitions as parameters in the MSC database prior to sending user commands to the process server.
104. The apparatus of claim 13 further comprising:
the GUI client storing recipe definitions as parameters in the MSC database prior to sending user commands to the process server.
105. The apparatus of claim 14 further comprising:
the GUI client storing recipe definitions as parameters in the MSC database prior to sending user commands to the process server.
106. The apparatus of claim 15 further comprising:
the GUI client storing recipe definitions as parameters in the MSC database prior to sending user commands to the process server.
107. The apparatus of claim 16 further comprising:
the GUI client storing recipe definitions as parameters in the MSC database prior to sending user commands to the process server.
108. The apparatus of claim 57 further comprising:
a message queue and a message loop.
109. The apparatus of claim 58 further comprising:
a message queue and a message loop.
110. The apparatus of claim 59 further comprising:
a message queue and a message loop.
111. The apparatus of claim 60 further comprising:
a message queue and a message loop.
112. The apparatus of claim 61 further comprising:
a message queue and a message loop.
113. The apparatus of claim 62 further comprising:
a message queue and a message loop.
114. The apparatus of claim 63 further comprising:
a message queue and a message loop.
115. The apparatus of claim 64 further comprising:
a message queue and a message loop.
116. The apparatus of claim 88 further comprising:
the at least two separately functioning threads comprising one or more separately functioning threads each as a separate device interface to a respective one of the plurality of process devices.
117. The apparatus of claim 116 further comprising:
the at least two separately functioning threads comprising a respective control thread associated with the respective device and a respective diagnostic thread associated with the respective device.
118. The apparatus of claim 116 further comprising:
each separately functioning thread comprising a separate communication channel.
119. The apparatus of claim 117 further comprising:
each separately functioning thread comprising a separate communication channel.
120. The apparatus of claim 116 further comprising:
the system controller utilizing generic device commands independently of the device types.
121. The apparatus of claim 117 further comprising:
the system controller utilizing generic device commands independently of the device types.
122. The apparatus of claim 118 further comprising:
the system controller utilizing generic device commands independently of the device types.
123. The apparatus of claim 119 further comprising:
the system controller utilizing generic device commands independently of the device types.
124. The apparatus of claim 120 further comprising:
the device commands corresponding to high level actions.
125. The apparatus of claim 121 further comprising:
the device commands corresponding to high level actions.
126. The apparatus of claim 122 further comprising:
the device commands corresponding to high level actions.
127. The apparatus of claim 123 further comprising:
the device commands corresponding to high level actions.

* * * * *